(12) United States Patent
Takaki et al.

(10) Patent No.: US 9,017,924 B2
(45) Date of Patent: Apr. 28, 2015

(54) RESIST COMPOSITION, METHOD OF FORMING RESIST PATTERN, POLYMERIC COMPOUND AND COMPOUND

(71) Applicant: Tokyo Ohka Kogyo Co., Ltd., Kawasaki-shi (JP)

(72) Inventors: Daichi Takaki, Kawasaki (JP); Yoshiyuki Utsumi, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 0 days.

(21) Appl. No.: 14/196,680

(22) Filed: Mar. 4, 2014

(65) Prior Publication Data
US 2014/0255853 A1 Sep. 11, 2014

(30) Foreign Application Priority Data

Mar. 6, 2013 (JP) .................. 2013-044264
Jan. 30, 2014 (JP) .................. 2014-015860

(51) Int. Cl.
| | | |
|---|---|---|
| G03F 7/004 | (2006.01) | |
| C08F 12/30 | (2006.01) | |
| G03F 7/038 | (2006.01) | |
| C08F 220/24 | (2006.01) | |
| H01L 21/027 | (2006.01) | |
| C08F 220/38 | (2006.01) | |

(52) U.S. Cl.
CPC .............. *G03F 7/0388* (2013.01); *G03F 7/038* (2013.01); *C08F 220/24* (2013.01); *C08F 2220/382* (2013.01); *H01L 21/0275* (2013.01); *Y10S 430/114* (2013.01); *Y10S 430/115* (2013.01); *Y10S 430/143* (2013.01)

(58) Field of Classification Search
CPC ....... G03F 7/004; G03F 7/038; G03F 7/0388; C08F 220/24; C08F 220/38; C08F 28/00; C08F 2220/382; H01L 21/0275
USPC .............. 430/270.1, 913, 914, 322, 325, 942; 526/243, 245; 562/30, 100, 109
See application file for complete search history.

(56) References Cited

U.S. PATENT DOCUMENTS

| | | | |
|---|---|---|---|
| 7,160,669 B2 * | 1/2007 | Yamada et al. ............. | 430/285.1 |
| 8,048,610 B2 * | 11/2011 | Ohsawa et al. ............. | 430/270.1 |
| 8,105,748 B2 * | 1/2012 | Ohashi et al. .............. | 430/270.1 |
| 8,298,748 B2 * | 10/2012 | Seshimo et al. ........... | 430/270.1 |
| 8,663,897 B2 * | 3/2014 | Masubuchi et al. ........ | 430/270.1 |
| 2004/0110085 A1 | 6/2004 | Iwai et al. | |
| 2009/0197204 A1 | 8/2009 | Shiono et al. | |
| 2009/0317743 A1 | 12/2009 | Shiono et al. | |
| 2010/0310985 A1 | 12/2010 | Mori et al. | |
| 2011/0117499 A1 | 5/2011 | Matsumiya et al. | |
| 2011/0244392 A1 | 10/2011 | Hirano et al. | |
| 2012/0309820 A1 * | 12/2012 | Zurier et al. .................. | 514/454 |

FOREIGN PATENT DOCUMENTS

| | | |
|---|---|---|
| JP | A-2003-241385 | 8/2003 |
| JP | A-2009-025723 | 2/2009 |
| JP | A-2010-002870 | 1/2010 |
| JP | A-2010-032994 | 2/2010 |
| JP | A-2010-277043 | 12/2010 |
| JP | A-2011-013569 | 1/2011 |
| JP | 2011039266 A * | 2/2011 |
| JP | 2011076084 A * | 4/2011 |
| JP | A-2011-128226 | 6/2011 |
| JP | A-2011-158879 | 8/2011 |

OTHER PUBLICATIONS

Machine translation of JP 2011-076084 (no date).*
Machine Translation of JP2011-039266 (no date).*

* cited by examiner

*Primary Examiner* — Amanda C Walke
(74) *Attorney, Agent, or Firm* — Knobbe Martens Olson & Bear LLP

(57) ABSTRACT

A resist composition which generates acid upon exposure and exhibits changed solubility in a developing solution under action of acid, including a base component (A) which exhibits changed solubility in a developing solution under action of acid, the base component (A) including a polymeric compound (A1) containing a structural unit (a0) represented by general formula (a0-1) shown below. In the formula, $W^1$ represents a group which is formed by polymerization reaction of a group containing a polymerizable group; $Y^1$ and $Y^2$ each independently represents a divalent linking group; $Y^3$ represents a carbonyl group or an alkylene group; $R^2$ and $R^3$ each independently represents a fluorine atom or a fluorinated alkyl group; $M^{m+}$ represents an organic cation having a valency of m; and m represents an integer of 1 or more.

[Chemical Formula 1]

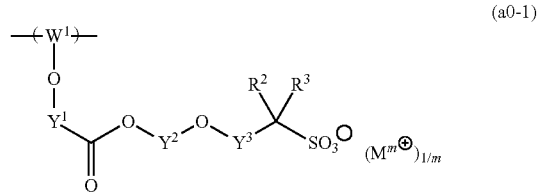

(a0-1)

19 Claims, No Drawings

RESIST COMPOSITION, METHOD OF FORMING RESIST PATTERN, POLYMERIC COMPOUND AND COMPOUND

TECHNICAL FIELD

The present invention relates toeva a resist composition, a method of forming a resist pattern, a polymeric compound and a compound.

Priority is claimed on Japanese Patent Application No. 2013-044264, filed Mar. 6, 2013, and Japanese Patent Application No. 2014-15860, filed Jan. 30, 2014, the contents of which are incorporated herein by reference.

BACKGROUND ART

In lithography techniques, for example, a resist film composed of a resist material is formed on a substrate, and the resist film is subjected to selective exposure of radial rays such as light or electron beam through a mask having a predetermined pattern, followed by development, thereby forming a resist pattern having a predetermined shape on the resist film.

A resist material in which the exposed portions become soluble in a developing solution is called a positive-type, and a resist material in which the exposed portions become insoluble in a developing solution is called a negative-type.

In recent years, in the production of semiconductor elements and liquid crystal display elements, advances in lithography techniques have led to rapid progress in the field of pattern miniaturization.

Typically, these miniaturization techniques involve shortening the wavelength (increasing the energy) of the exposure light source. Conventionally, ultraviolet radiation typified by g-line and i-line radiation has been used, but nowadays KrF excimer lasers and ArF excimer lasers are starting to be introduced in mass production of the semiconductor elements. Furthermore, research is also being conducted into lithography techniques that use an exposure light source having a wavelength shorter (energy higher) than these excimer lasers, such as electron beam, extreme ultraviolet radiation (EUV), and X ray.

Resist materials for use with these types of exposure light sources require lithography properties such as a high resolution capable of reproducing patterns of minute dimensions, and a high level of sensitivity to these types of exposure light sources.

As a resist material that satisfies these conditions, a chemically amplified resist composition is used, which includes a base material component that exhibits a changed solubility in a developing solution under the action of acid and an acid generator component that generates acid upon exposure. For example, in the case where the developing solution is an alkali developing solution (alkali developing process), a chemically amplified positive resist which contains, as a base component (base resin), a resin which exhibits increased solubility in an alkali developing solution under action of acid, and an acid generator is typically used. If the resist film formed using the resist composition is selectively exposed during formation of a resist pattern, then within the exposed portions, acid is generated from the acid generator component, and the action of this acid causes an increase in the polarity of the base resin, making the exposed portions soluble in the alkali developing solution. Thus, by conducting alkali developing, the unexposed portions remain to form a positive resist pattern. On the other hand, in the case where such a resist composition is applied to a solvent developing process using a developing solution containing an organic solvent (organic developing solution), the polarity of the base resin at exposed portions is increased, whereas the solubility at exposed portions in an organic developing solution is relatively decreased. As a result, the unexposed portions of the resist film are dissolved and removed by the organic developing solution, and a negative resist pattern in which the exposed portions are remaining is formed. Such a solvent developing process for forming a negative-tone resist composition is sometimes referred to as "negative-tone developing process" (for example, see Patent Document 1).

In general, the base resin for a chemically amplified resist composition contains a plurality of structural units for improving lithography properties and the like. For example, in the case of a resin composition which exhibits increased solubility in an alkali developing solution by the action of acid, a structural unit containing an acid decomposable group which is decomposed by the action of acid generated from an acid generator component or the like and then exhibits increased polarity. Further, a structural unit containing a lactone-containing cyclic group or a structural unit containing a polar group such as a hydroxy group is used (for example, see Patent Document 2).

Recently, a base resin which has a structural unit containing a cyclic group containing an —$SO_2$— structure has been proposed. It is presumed that such as base resin contributes to improvement in various lithography properties such as mask reproducibility and improvement in shape of resist pattern such as reduction of roughness. The roughness means surface roughness of a resist pattern and causes defects in the shape of a resist pattern. For example, roughness on the line width of a pattern (line width roughness (LWR)) causes various defects such as non-uniformity of the line width of line and space patterns. Such defects of a resist pattern adversely affect the formation of very fine semiconductor elements, and improvement of this characteristic becomes more important as the pattern becomes smaller.

In recently, as the miniaturization of patterns proceeds, a polymeric compound useful as a base resin for a resist composition is demanded.

In Patent Document 3, a resin having an acid generator group which is decomposed upon exposure and then generates acid has been proposed. In the invention of Patent Document 3, as a base resin, a resin obtained by copolymerizing a monomer which derives a structural unit having an acid generator group which generates acid upon exposure, a monomer which derives a structural unit having a cyclic group containing an —$SO_2$— structure, and a monomer which derives a structural unit having an acid decomposable group which is decomposed by the action of acid and then exhibits increased polarity is used.

Such a resin has both the function as an acid generator and the function as a base component, and hence, it can compose a chemically amplified resist composition by itself.

DOCUMENTS OF RELATED ART

Patent Document

[Patent Document 1] Japanese Unexamined Patent Application, First Publication No. 2009-025723

[Patent Document 2] Japanese Unexamined Patent Application, First Publication No. 2003-241385

[Patent Document 3] Japanese Unexamined Patent Application, First Publication No. 2011-158879

SUMMARY OF THE INVENTION

As further progress is made in lithography techniques and the application field for lithography techniques expands, further improvement in various lithography properties is demanded in the formation of a resist pattern.

For example, as miniaturization of resist patterns progress, further improvement will be demanded for conventional resist materials (such as the resist material containing the base resin of Patent Document 3) with respect to exhibit various lithography properties such as resolution, roughness (LER (line edge roughness: unevenness of the side walls of a line pattern) and the like in the case of a line pattern, and in-plane uniformity and circularity in the case of a hole pattern), resolution and sensitivity.

The present invention takes the above circumstances into consideration, with an object of providing a resist composition capable of forming a resist pattern with excellent lithography properties, a method of forming a resist pattern using the resist composition, a polymeric compound useful for the resist composition, and a compound useful for the resist composition.

A first aspect of the present invention is a resist composition which generates acid upon exposure and exhibits changed solubility in a developing solution under action of acid, including a base component (A) which exhibits changed solubility in a developing solution under action of acid, the base component (A) including a polymeric compound (A1) containing a structural unit (a0) represented by general formula (a0-1) shown below.

[Chemical Formula 1]

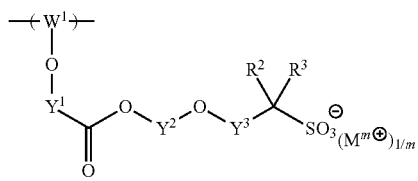

(a0-1)

In the formula, $W^1$ represents a group which is formed by polymerization reaction of a group containing a polymerizable group; $Y^1$ and $Y^2$ each independently represents a divalent linking group; $Y^3$ represents a carbonyl group or an alkylene group; $R^2$ and $R^3$ each independently represents a fluorine atom or a fluorinated alkyl group; $M^{m+}$ represents an organic cation having a valency of m; and m represents an integer of 1 or more.

In the first aspect of the present invention, the structural unit (a0) is preferably a structural unit represented by general formula (a0-2) shown below.

[Chemical Formula 2]

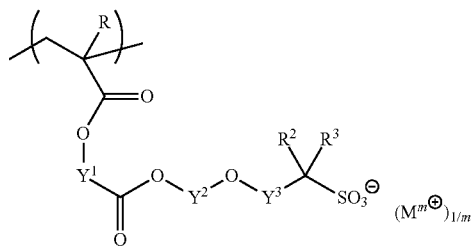

(a0-2)

In the formula, R represents a hydrogen atom, an alkyl group of 1 to 5 carbon atoms or a halogenated alkyl group of 1 to 5 carbon atoms; $Y^1$ and $Y^2$ each independently represents a divalent linking group; $Y^3$ represents a carbonyl group or an alkylene group; $R^2$ and $R^3$ each independently represents a fluorine atom or a fluorinated alkylene group; $M^{m+}$ represents an organic cation having a valency of m; and m represents an integer of 1 or more.

In the first aspect of the present invention, the polymeric compound (A1) preferably has a structural unit (a1) containing an acid decomposable group that exhibits increased polarity by the action of acid.

A second aspect of the present invention is a method of forming a resist pattern, including: using a resist composition of the first aspect of the present invention to form a resist film on a substrate; conducting exposure of the resist film; and developing the resist film to form a resist pattern.

A third aspect of the present invention is a polymeric compound having a structural unit (a0) represented by general formula (a0-1) shown below.

[Chemical Formula 3]

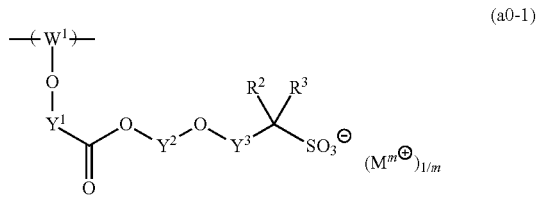

(a0-1)

In the formula, $W^1$ represents a group which is formed by polymerization reaction of a group containing a polymerizable group; $Y^1$ and $Y^2$ each independently represents a divalent linking group; $Y^3$ represents a carbonyl group or an alkylene group; $R^2$ and $R^3$ each independently represents a fluorine atom or a fluorinated alkyl group; $M^{m+}$ represents an organic cation having a valency of m; and m represents an integer of 1 or more.

In the polymeric compound of the third aspect of the present invention, the structural unit (a0) is preferably a structural unit represented by general formula (a0-2) shown below.

[Chemical Formula 4]

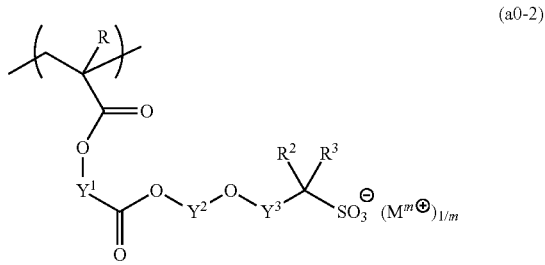

(a0-2)

In the formula, R represents a hydrogen atom, an alkyl group of 1 to 5 carbon atoms or a halogenated alkyl group of 1 to 5 carbon atoms; $Y^1$ and $Y^2$ each independently represents a divalent linking group; $Y^3$ represents a carbonyl group or an alkylene group; $R^2$ and $R^3$ each independently represents a fluorine atom or a fluorinated alkylene group; $M^{m+}$ represents an organic cation having a valency of m; and m represents an integer of 1 or more.

A fourth aspect of the present invention is a compound represented by general formula (a0-m1) shown below.

[Chemical Formula 5]

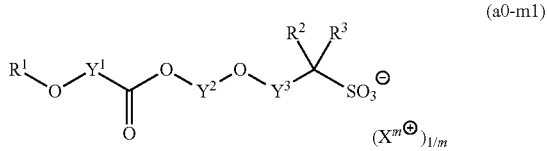

(a0-m1)

In the formula, $R^1$ represents a group containing a polymerizable group; $Y^1$ and $Y^2$ each independently represents a divalent linking group; $Y^3$ represents a carbonyl group or an alkylene group; $R^2$ and $R^3$ each independently represents a fluorine atom or a fluorinated alkyl group; $X^{m+}$ represents a metal cation or an organic cation having a valency of m; and m represents an integer of 1 or more.

In the fourth aspect of the present invention, $R^1$ in the general formula (a0-m1) is preferably a group represented by general formula (a0-m2) shown below.

[Chemical Formula 6]

(a0-m2)

In the formula, R represents a hydrogen atom, an alkyl group of 1 to 5 carbon atoms or a halogenated alkyl group of 1 to 5 carbon atoms; and * represents a valence bond.

According to the present invention, there are provided a resist composition capable of forming a resist pattern with excellent lithography properties, a polymeric compound useful for the resist composition, a compound useful for the resist composition, and a method of forming a resist pattern using the resist composition.

MODE FOR CARRYING OUT THE INVENTION

In the present description and claims, the term "aliphatic" is a relative concept used in relation to the term "aromatic", and defines a group or compound that has no aromaticity.

The term "alkyl group" includes linear, branched or cyclic, monovalent saturated hydrocarbon, unless otherwise specified.

The term "alkylene group" includes linear, branched or cyclic, divalent saturated hydrocarbon, unless otherwise specified. The same applies for the alkyl group within an alkoxy group.

A "halogenated alkyl group" is a group in which part or all of the hydrogen atoms of an alkyl group is substituted with a halogen atom. Examples of the halogen atom include a fluorine atom, a chlorine atom, a bromine atom and an iodine atom.

A "fluorinated alkyl group" or a "fluorinated alkylene group" is a group in which part or all of the hydrogen atoms of an alkyl group or an alkylene group have been substituted with fluorine atom(s).

The term "structural unit" refers to a monomer unit that contributes to the formation of a polymeric compound (resin, polymer, copolymer).

A "structural unit derived from an acrylate ester" refers to a structural unit that is formed by the cleavage of the ethylenic double bond of an acrylate ester.

An "acrylate ester" refers to a compound in which the terminal hydrogen atom of the carboxy group of acrylic acid ($CH_2=CH—COOH$) has been substituted with an organic group.

The acrylate ester may have the hydrogen atom bonded to the carbon atom on the α-position substituted with a substituent. The substituent ($R^α$) that substitutes the hydrogen atom bonded to the carbon atom on the α-position is an atom other than hydrogen or a group, and examples thereof include an alkyl group of 1 to 5 carbon atoms, a halogenated alkyl group of 1 to 5 carbon atoms and a hydroxyalkyl group. A carbon atom on the α-position of an acrylate ester refers to the carbon atom bonded to the carbonyl group, unless specified otherwise.

Hereafter, an acrylate ester having the hydrogen atom bonded to the carbon atom on the α-position substituted with a substituent is sometimes referred to as "α-substituted acrylate ester". Further, acrylate esters and α-substituted acrylate esters are collectively referred to as "(α-substituted) acrylate ester".

A "structural unit derived from hydroxystyrene or a hydroxystyrene derivative" refers to a structural unit that is formed by the cleavage of the ethylenic double bond of hydroxystyrene or a hydroxystyrene derivative.

The term "hydroxystyrene derivative" includes compounds in which the hydrogen atom at the α-position of hydroxystyrene has been substituted with another substituent such as an alkyl group or a halogenated alkyl group; and derivatives thereof. Examples of the derivatives thereof include hydroxystyrene in which the hydrogen atom of the hydroxy group has been substituted with an organic group and may have the hydrogen atom on the α-position substituted with a substituent; and hydroxystyrene which has a substituent other than a hydroxy group bonded to the benzene ring and may have the hydrogen atom on the α-position substituted with a substituent. Here, the α-position (carbon atom on the α-position) refers to the carbon atom having the benzene ring bonded thereto, unless specified otherwise.

As the substituent which substitutes the hydrogen atom on the α-position of hydroxystyrene, the same substituents as those described above for the substituent on the α-position of the aforementioned α-substituted acrylate ester can be mentioned.

A "structural unit derived from vinylbenzoic acid or a vinylbenzoic acid derivative" refers to a structural unit that is formed by the cleavage of the ethylenic double bond of vinylbenzoic acid or a vinylbenzoic acid derivative.

The term "vinylbenzoic acid derivative" includes compounds in which the hydrogen atom at the α-position of vinylbenzoic acid has been substituted with another substituent such as an alkyl group or a halogenated alkyl group; and derivatives thereof. Examples of the derivatives thereof include benzoic acid in which the hydrogen atom of the carboxy group has been substituted with an organic group and may have the hydrogen atom on the α-position substituted with a substituent; and benzoic acid which has a substituent other than a hydroxy group and a carboxy group bonded to the benzene ring and may have the hydrogen atom on the α-position substituted with a substituent. Here, the α-position (carbon atom on the α-position) refers to the carbon atom having the benzene ring bonded thereto, unless specified otherwise.

The term "styrene" includes styrene itself and compounds in which the hydrogen atom at the α-position of styrene has been substituted with another substituent such as an alkyl group or a halogenated alkyl group.

A "structural unit derived from styrene or a styrene derivative" refers to a structural unit that is formed by the cleavage of the ethylenic double bond of styrene or a styrene derivative.

As the alkyl group as a substituent on the α-position, a linear or branched alkyl group is preferable, and specific examples include alkyl groups of 1 to 5 carbon atoms, such as a methyl group, an ethyl group, a propyl group, an isopropyl group, an n-butyl group, an isobutyl group, a tert-butyl group, a pentyl group, an isopentyl group and a neopentyl group.

Specific examples of the halogenated alkyl group as the substituent on the α-position include groups in which part or all of the hydrogen atoms of the aforementioned "alkyl group as the substituent on the α-position" are substituted with halogen atoms. Examples of the halogen atom include a fluorine atom, a chlorine atom, a bromine atom and an iodine atom, and a fluorine atom is particularly desirable.

Specific examples of the hydroxyalkyl group as the substituent on the α-position include groups in which part or all of the hydrogen atoms of the aforementioned "alkyl group as the substituent on the α-position" are substituted with a hydroxy group. The number of hydroxy groups within the hydroxyalkyl group is preferably 1 to 5, and most preferably 1.

The expression "may have a substituent" means that a case where a hydrogen atom (—H) is substituted with a monovalent group, or a case where a methylene (—$CH_2$—) group is substituted with a divalent group.

The term "exposure" is used as a general concept that includes irradiation with any form of radiation.

An "organic group" refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

<<Resist Composition>>

The resist composition of the present invention is a resist composition which generates acid upon exposure and exhibits changed solubility in a developing solution under action of acid, including a base component (A) which exhibits changed solubility in a developing solution under action of acid, the base component (A) including a polymeric compound (A1) containing a structural unit (a0) represented by general formula (a0-1).

The resist composition according to a first aspect of the present invention is a resist composition including a base component (A) which generates acid upon exposure and exhibits changed solubility in a developing solution under action of acid (hereafter, frequently referred to as "component (A)").

Since the resist composition of the present invention includes a component (A), the resist composition exhibits changed solubility in a developing solution upon exposure. When a resist film formed using the resist composition is subjected to a selective exposure, acid is generated from the component (A) at exposed portions, and the generated acid acts on the component (A) to change the solubility of the component (A) in a developing solution. As a result, the solubility of the exposed portions in a developing solution is changed, whereas the solubility of the unexposed portions in a developing solution remains unchanged. Therefore, by subjecting the resist film to development, the exposed portions are dissolved and removed to form a positive-tone resist pattern in the case of a positive resist, whereas the unexposed portions are dissolved and removed to form a negative-tone resist pattern in the case of a negative resist.

In the present specification, a resist composition which forms a positive resist pattern by dissolving and removing the exposed portions is called a positive resist composition, and a resist composition which forms a negative resist pattern by dissolving and removing the unexposed portions is called a negative resist composition.

The resist composition of the present invention may be either a positive resist composition or a negative resist composition. Further, in the formation of a resist pattern, the resist composition of the present embodiment can be applied to an alkali developing process using an alkali developing solution in the developing treatment, or a solvent developing process using a developing solution containing an organic solvent (organic developing solution) in the developing treatment. The resist composition of the present invention is preferably used in the formation of a positive-tone resist pattern by an alkali developing process. In such a case, as the component (A), a base component that exhibits increased solubility in an alkali developing solution under the action of acid is used.

<Component (A)>

The component (A) used in the resist composition of the present invention is a base component which generates acid upon exposure and exhibits changed solubility in a developing solution under action of acid and contains a polymeric compound (A1) (hereafter, frequently referred to as "component (A1)") having a structural unit (a0) described later.

Here, the term "base component" refers to an organic compound capable of forming a film, and is preferably an organic compound having a molecular weight of 500 or more. When the organic compound has a molecular weight of 500 or more, the film-forming ability is improved, and a resist pattern of nano level can be easily formed. The "organic compound having a molecular weight of 500 or more" which can be used as a base component is broadly classified into non-polymers and polymers.

In general, as a non-polymer, any of those which have a molecular weight in the range of 500 to less than 4,000 is used. Hereafter, a non-polymer having a molecular weight in the range of 500 to less than 4,000 is referred to as a low molecular weight compound.

As a polymer, any of those which have a molecular weight of 1,000 or more is generally used. Hereafter, a polymer having a molecular weight of 1,000 or more is referred to as a polymeric compound. With respect to a polymeric compound, the "molecular weight" is the weight average molecular weight in terms of the polystyrene equivalent value determined by gel permeation chromatography (GPC). Hereafter, a polymeric compound is frequently referred to simply as a "resin".

As the component (A), a low molecular weight compound and the component (A1) may be used in combination.

The component (A) containing the component (A1) may be a component that exhibits increased solubility in a developing solution under action of acid or a component that exhibits decreased solubility in a developing solution under action of acid.

[Component (A1)]

The component (A1) is a polymeric compound including the structural unit (a0) represented by general formula (a0-1).

When the resist film formed using the resist composition of the present invention is subjected to exposure, the structural unit (a0) acts as an acid generating portion which generates acid upon exposure. Since the polarity of the component (A1) is changed prior to and after exposure, by using the component (A1), an excellent development contrast can be achieved not only in an alkali developing process, but also in a solvent developing process.

More specifically, in the case of applying an alkali developing process, the component (A1) is substantially insoluble in an alkali developing solution prior to exposure, but when acid is generated from the structural unit (a0) upon exposure, the action of this acid causes an increase in the polarity of the base component, thereby increasing the solubility of the component (A1) in an alkali developing solution. Therefore, in the formation of a resist pattern, by conducting selective exposure of a resist film formed by applying the resist composition to a substrate, the exposed portions change from an insoluble state to a soluble state in an alkali developing solution, whereas the unexposed portions remain insoluble in an alkali developing solution, and hence, a positive resist pattern can be formed by alkali developing.

On the other hand, in the case of a solvent developing process, the component (A1) exhibits high solubility in an organic developing solution prior to exposure, and when acid is generated from the structural unit (a0) upon exposure, the polarity of the component (A1) is increased by the action of the generated acid, thereby decreasing the solubility of the component (A1) in an organic developing solution. Therefore, in the formation of a resist pattern, by conducting selective exposure of a resist film formed by applying the resist composition to a substrate, the exposed portions changes from an soluble state to an insoluble state in an organic developing solution, whereas the unexposed portions remain soluble in an organic developing solution. As a result, by conducting development using an organic developing solution, a contrast can be made between the exposed portions and unexposed portions, thereby enabling the formation of a negative resist pattern.

(Structural Unit (a0))

The structural unit (a0) is represented by general formula (a0-1) shown below.

[Chemical Formula 7]

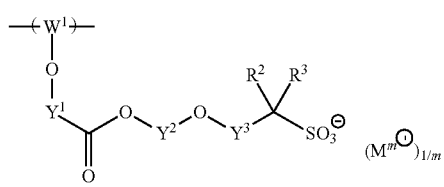

(a0-1)

In the formula, $W^1$ represents a group which is formed by polymerization reaction of a group containing a polymerizable group; $Y^1$ and $Y^2$ each independently represents a divalent linking group; $Y^3$ represents a carbonyl group or an alkylene group; $R^2$ and $R^3$ each independently represents a fluorine atom or a fluorinated alkyl group; $M^{m+}$ represents an organic cation having a valency of m; and m represents an integer of 1 or more.

In the formula, (a0-1), $Y^1$ and $Y^2$ each independently represents a divalent linking group. The divalent linking group for $Y^1$ and $Y^2$ is not particularly limited, and preferable examples thereof include a divalent hydrocarbon group which may have a substituent and a divalent linking group containing a hetero atom.

(Divalent Hydrocarbon Group which May have a Substituent)

The hydrocarbon group as a divalent linking group may be either an aliphatic hydrocarbon group or an aromatic hydrocarbon group.

An "aliphatic hydrocarbon group" refers to a hydrocarbon group that has no aromaticity. The aliphatic hydrocarbon group may be saturated or unsaturated. In general, the aliphatic hydrocarbon group is preferably saturated.

Examples of the aliphatic hydrocarbon group include a linear or branched aliphatic hydrocarbon group, and an aliphatic hydrocarbon group containing a ring in the structure thereof can be given. Specific examples thereof include the same group as exemplified above for $Va^1$ in formula (a1-1) described later.

The linear or branched aliphatic hydrocarbon group may or may not have a substituent. Examples of the substituent include a fluorine atom, a fluorinated alkyl group of 1 to 5 carbon atoms, and a carbonyl group.

As examples of the aliphatic hydrocarbon group containing a ring in the structure thereof, a cyclic aliphatic hydrocarbon group which may have a substituent containing a hetero atom in the ring structure thereof (a group in which two hydrogen atoms have been removed from an aliphatic hydrocarbon ring), a group in which the cyclic aliphatic hydrocarbon group is bonded to the terminal of a linear or branched aliphatic hydrocarbon group, and a group in which the cyclic aliphatic hydrocarbon group is interposed within a linear or branched aliphatic hydrocarbon group, can be given. As the linear or branched aliphatic hydrocarbon group, the same groups as those described above can be used.

The cyclic aliphatic hydrocarbon group preferably has 3 to 20 carbon atoms, and more preferably 3 to 12 carbon atoms.

Specific examples of the cyclic aliphatic hydrocarbon group include the same group as exemplified above for $Va^1$ in formula (a1-1) described later.

The cyclic aliphatic hydrocarbon group may or may not have a substituent. Examples of the substituent include an alkyl group, an alkoxy group, a halogen atom, a halogenated alkyl group, a hydroxyl group and a carbonyl group.

The alkyl group as the substituent is preferably an alkyl group of 1 to 5 carbon atoms, and a methyl group, an ethyl group, a propyl group, an n-butyl group or a tert-butyl group is most desirable.

The alkoxy group as the substituent is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the halogen atom for the substituent include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups has been substituted with the aforementioned halogen atoms.

In the cyclic aliphatic hydrocarbon group, part of the carbon atoms constituting the ring structure thereof may be substituted with a substituent containing a hetero atom. The substituent containing a hetero atom is preferably —O—, —C(=O)—O—, —S—, —S(=O)$_2$—, or —S(=O)$_2$—O—

Specific examples of the aromatic hydrocarbon group as a divalent hydrocarbon group include the same group as exemplified above for $Va^1$ in formula (a1-1) described later.

With respect to the aromatic hydrocarbon group, the hydrogen atom within the aromatic hydrocarbon group may be substituted with a substituent. For example, the hydrogen atom bonded to the aromatic ring within the aromatic hydrocarbon group may be substituted with a substituent. Examples of substituents include an alkyl group, an alkoxy group, a halogen atom, a halogenated alkyl group, and a hydroxyl group.

The alkyl group as the substituent is preferably an alkyl group of 1 to 5 carbon atoms, and a methyl group, an ethyl group, a propyl group, an n-butyl group or a tert-butyl group is most desirable.

As the alkoxy group, the halogen atom and the halogenated alkyl group for the substituent, the same groups as the aforementioned substituent groups for substituting a hydrogen atom within the cyclic aliphatic hydrocarbon group can be used.

(Divalent Linking Group Containing a Hetero Atom)

With respect to a divalent linking group containing a hetero atom, a hetero atom is an atom other than carbon and hydrogen, and examples thereof include an oxygen atom, a nitrogen atom, a sulfur atom and a halogen atom.

In the case where $Y^1$ and $Y^2$ represents a divalent linking group containing a hetero atom, preferable examples of the linking group include —O—, —C(=O)—O—, —C(=O)—, —O—C(=O)—O—, —C(=O)—NH—, —NH— and —NH—C(=NH)— (wherein H may be substituted with a substituent such as an alkyl group or an acyl group), —Sα, —S(=O)$_2$—, —S(=O)$_2$—O—, and a group represented by general formula —$Y^{21}$—O—$Y^{22}$—, —$Y^{21}$—O—, —$Y^{21}$—C(=O)—O—, —C(=O)—O—$Y^{21}$, —[$Y^{21}$—C(=O)—O]$_{m'}$—$Y^{22}$— or —$Y^{21}$—O—C(=O)—$Y^{22}$—[in the formulas, each of $Y^{21}$ and $Y^{22}$ independently represents a divalent hydrocarbon group which may have a substituent, O represents an oxygen atom, and m' represents an integer of 0 to 3].

When the divalent linking group containing a hetero atom represents —C(=O)—NH—, —NH—, or —NH—C(=NH)—, H may be substituted with a substituent such as an alkyl group, an acyl group or the like. The substituent (an alkyl group, an acyl group or the like) preferably has 1 to 10 carbon atoms, more preferably 1 to 8, and most preferably 1 to 5.

In formula $Y^{21}$—O—$Y^{22}$—, —$Y^{21}$—O—, —$Y^{21}$—C(=O)—O—, —C(=O)—O—$Y^{21}$, —[$Y^{21}$—C(=O)—O]$_{m'}$—$Y^{22}$— or —$Y^{21}$—O—C(=O)—$Y^{22}$—, $Y^{21}$ and $Y^{22}$ each independently represents a divalent hydrocarbon group which may have a substituent. Examples of the divalent hydrocarbon group include the same groups as those described above as the "divalent hydrocarbon group which may have a substituent" in the explanation of the aforementioned divalent linking group.

As $Y^{21}$, a linear aliphatic hydrocarbon group is preferable, more preferably a linear alkylene group, still more preferably a linear alkylene group of 1 to 5 carbon atoms, and a methylene group or an ethylene group is particularly desirable.

As $Y^{22}$, a linear or branched aliphatic hydrocarbon group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

In the group represented by the formula —[$Y^{21}$—C(=O)—O]$_{m'}$—$Y^{22}$—, m' represents an integer of 0 to 3, preferably an integer of 0 to 2, more preferably 0 or 1, and particularly preferably 1. Namely, it is particularly desirable that the group represented by the formula —[$Y^{21}$—C(=O)—O]$_{m'}$—$Y^{22}$— is a group represented by the formula —$Y^{21}$—C(=O)—O—$Y^{22}$—. Among these, a group represented by the formula —(CH$_2$)$_{a'}$—C(=O)—O—(CH$_2$)$_{b'}$— is preferable. In the formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

In the present invention, when $Y^1$ and $Y^2$ each independently represents a divalent linking group containing a hetero atom, a linking group having a hetero atom within the ring skeleton thereof is preferable. Examples of the linking group having a hetero atom within the ring skeleton thereof include a linking group including a ring containing a —O—C(=O)— structure (i.e., lactone ring) in the ring skeleton thereof. Examples of the linking group containing a lactone ring for $Y^1$ and $Y^2$ include a linking group represented by general formula (a0-r1) shown below.

[Chemical Formula 8]

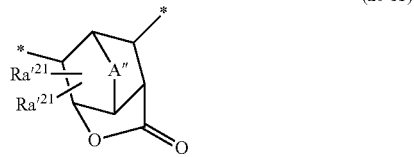

(a0-r1)

In the formula, each Ra'$^{21}$ independently represents a hydrogen atom, an alkyl group, an alkoxy group, a halogen atom, a halogenated alkyl group, a hydroxy group, —COOR", —OC(=O)R", a hydroxyalkyl group or a cyano group; R" represents a hydrogen atom or an alkyl group; A" represents an oxygen atom, a sulfur atom or an alkylene group of 1 to 5 carbon atoms which may contain an oxygen atom or a sulfur atom; and * represents a valence bond.

In the formula (a0-r1), each Ra'$^{21}$ independently represents a hydrogen atom, an alkyl group, an alkoxy group, a halogen atom, a halogenated alkyl group, a hydroxy group, —COOR", —OC(=O)R", a hydroxyalkyl group or a cyano group; R" represents a hydrogen atom or an alkyl group; and A" represents an oxygen atom, a sulfur atom or an alkylene group of 1 to 5 carbon atoms which may contain an oxygen atom or a sulfur atom.

The explanations of Ra'$^{21}$ and A" in the formula (a0-r1) and are the same as the explanations of Ra'$^{21}$ and A" in the formula (a2-r-2) described later.

in the present invention, $Y^1$ preferably represents a linear or branched alkylene group which may have an ester bond [—C(=O)—O—], a linear or branched alkylene group which may have an ether bond (—O—), a combination of these, a single bond, a divalent aliphatic hydrocarbon group containing a ring in the structure thereof, a divalent aromatic hydrocarbon group or a linking group represented by the general formula (a0-r1).

In the present invention, as $Y^2$, a single bond, a linear alkylene group of 1 to 7 carbon atoms, a divalent aliphatic hydrocarbon group containing a ring in the structure thereof, or a divalent aromatic hydrocarbon group is preferable.

In the formula (a0-1), $Y^3$ represents a carbonyl group or an alkylene group. The alkylene group for $Y^3$ preferably has 1 to 4 carbon atoms, more preferably 1 to 3 carbon atoms, and most preferably 1 carbon atom. In the present invention, $Y^3$ is preferably a carbonyl group.

In the formula (a0-1), $R^2$ and $R^3$ each independently represents a fluorine atom or a fluorinated alkyl group. Examples of the fluorinated alkyl group include a fluorinated alkyl group of 1 to 5 carbon atoms. In the present invention, $R^2$ and $R^3$ is preferably a fluorine atom.

In the formula (a0-1), $M^{m+}$ represents an organic cation having a valency of m, wherein m represents an integer of 1 or more. Further, as examples of the organic cation in the formula (a0-1), organic cations in onium salt acid generators represented by general formulae (b-1) to (b-3) described later can also be given.

In the formula (a0-1), $W^1$ represents a group which is formed by polymerization reaction of a group containing a polymerizable group.

A "polymerizable group" refers to a group that renders a compound containing the group polymerizable by a radical polymerization or the like, for example, a group having a carbon-carbon multiple bond such as an ethylenic double bond.

Examples of the polymerizable group include a vinyl group, an allyl group, an acryloyl group, a methacryloyl group, a fluorovinyl group, a difluorovinyl group, a trifluorovinyl group, a difluorotrifluoromethylvinyl group, a trifluoroallyl group, a perfluoroallyl group, a trifluoromethylacryloyl group, a nonylfluorobutylacryloyl group, a vinyl ether group, a fluorine-containing vinyl ether group, an allyl ether group, an fluorine-containing allyl ether group, a styryl group, a vinylnaphthyl group, a fluorine-containing styryl group, a fluorine-containing vinylnaphthyl group, a norbornyl group, a fluorine-containing norbornyl group, and a silyl group.

With respect to $W^1$, the group containing a polymerizable group may be a group constituted of only a polymerizable group, or constituted of a polymerizable group and a group other than a polymerizable group.

As the group containing a polymerizable group, a group represented by $R^{w2}$-$L^{w1}$-[in the formula, $R^{w2}$ represents a hydrocarbon group which contains an ethylenic double bond and which may have a substituent, and $L^{w1}$ represents a divalent linking group containing a hetero atom or a single bond] is preferably used.

The hydrocarbon group for $R^{w2}$ is not particularly limited, as long as it contains an ethylenic double bond, and may be a chain-like hydrocarbon group, or a hydrocarbon group containing a ring in the structure thereof.

As the chain-like hydrocarbon group for $R^{w2}$, a chain-like alkenyl group is preferable. The chain-like alkenyl group may be linear or branched, and preferably has 2 to 10 carbon atoms, more preferably 2 to 5 carbon atoms, still more preferably 2 to 4 carbon atoms, and particularly preferably 2 or 3 carbon atoms.

Examples of linear alkenyl groups include a vinyl group, a propenyl group (an allyl group) and a butynyl group. Examples of branched alkenyl groups include a 1-methylpropenyl group, a 2-methylpropenyl group, and an isopropenyl group. Of these, a vinyl group or a propenyl group is preferable.

As examples of the hydrocarbon group for $R^{w2}$ containing a ring in the structure thereof, an unsaturated aliphatic hydrocarbon cyclic group which contains an ethylenic double bond in the ring structure thereof, a group in which the unsaturated aliphatic hydrocarbon cyclic group is bonded to the terminal of a linear or branched aliphatic hydrocarbon group, and a group in which a chain-like alkenyl group is bonded to the terminal of a cyclic hydrocarbon group, can be given.

As the unsaturated aliphatic hydrocarbon cyclic group which contains an ethylenic double bond in the ring structure thereof, for example, a group in which one hydrogen atom has been removed from a monocyclic or polycyclic cycloolefine can be mentioned. The cycloolefine preferably has 3 to 20 carbon atoms, and more preferably 3 to 12 carbon atoms. Examples of the cycloolefine include cyclopropene, cyclobutene, cyclopentene, cyclohexene, cycloheptene, cyclooctene, norbornene, 7-oxanorbornene, and tetracyclododecene. Among these examples, norbornene is preferable.

With respect to the group in which the unsaturated aliphatic hydrocarbon cyclic group is bonded to the terminal of the aforementioned linear or branched aliphatic hydrocarbon group, the linear or branched aliphatic hydrocarbon group to which the unsaturated aliphatic hydrocarbon cyclic group is to be bonded may be saturated or unsaturated. In general, the linear or branched aliphatic hydrocarbon group is preferably saturated.

The linear or branched aliphatic hydrocarbon group preferably has 1 to 10 carbon atoms, more preferably 1 to 6, still more preferably 1 to 4, and most preferably 1 to 3.

As the linear aliphatic hydrocarbon group, a linear alkylene group is preferable, and specific examples include a methylene group [—$CH_2$—], an ethylene group [—($CH_2$)$_2$—], a trimethylene group [—($CH_2$)$_3$—], a tetramethylene group [—($CH_2$)$_4$—] and a pentamethylene group [—($CH_2$)$_5$—].

As the branched aliphatic hydrocarbon group, a branched alkylene group is preferable, and specific examples include alkylalkylene groups, e.g., alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)—, and —C($CH_2CH_3$)$_2$—; alkylethylene groups such as —CH($CH_3$)$CH_2$—, —CH($CH_3$)CH($CH_3$)—, —C($CH_3$)$_2CH_2$—, —CH($CH_2CH_3$)$CH_2$—, and —C($CH_2CH_3$)$_2$—$CH_2$—; alkyltrimethylene groups such as —CH($CH_3$)$CH_2CH_2$—, and —$CH_2$CH($CH_3$)$CH_2$—; and alkyltetramethylene groups such as —CH($CH_3$)$CH_2CH_2CH_2$—, and —$CH_2$CH($CH_3$)$CH_2CH_2$—. As the alkyl group within the alkylalkylene group, a linear alkyl group of 1 to 5 carbon atoms is preferable.

With respect to the group in which a chain-like alkenyl group is bonded to the terminal of a cyclic hydrocarbon group, as the chain-like alkenyl group, the same groups as those described above can be mentioned.

The cyclic hydrocarbon group to which the chain-like alkenyl group is to be bonded may be a cyclic aliphatic hydrocarbon group (aliphatic cyclic group) or a cyclic aromatic hydrocarbon group (aromatic cyclic group).

The cyclic aliphatic hydrocarbon group may be either saturated or unsaturated. In general, the cyclic aliphatic hydrocarbon group is preferably saturated.

The aliphatic cyclic group preferably has 3 to 20 carbon atoms, and more preferably 3 to 12 carbon atoms.

The aliphatic cyclic group may be either a monocyclic group or a polycyclic group. As the monocyclic aliphatic hydrocarbon group, a group in which one hydrogen atoms have been removed from a monocycloalkane is preferable. The monocycloalkane preferably has 3 to 6 carbon atoms, and specific examples thereof include cyclopentane and cyclohexane. As the polycyclic aliphatic cyclic group, a group in which two hydrogen atoms have been removed from a polycycloalkane is preferable, and the polycyclic group preferably has 7 to 12 carbon atoms. Examples of the polycycloalkane include adamantane, norbornane, isobornane, tricyclodecane and tetracyclododecane.

The aromatic cyclic group is a group in which one hydrogen atom has been removed from an aromatic ring.

The aromatic cyclic group preferably has 3 to 30 carbon atoms, more preferably 5 to 30, still more preferably 5 to 20, still more preferably 6 to 15, and most preferably 6 to 10. Here, the number of carbon atoms within a substituent(s) is not included in the number of carbon atoms of the aromatic cyclic group.

Examples of the aromatic ring include aromatic hydrocarbon rings, such as benzene, biphenyl, fluorene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom.

The hydrocarbon group for $R^{w2}$ may have a hydrogen atom substituted with a substituent. Examples of substituents include a halogen atom, a hydroxy group, a hydroxyalkyl group, an alkoxy group, $-V^{w21}-COOR^{wO''}$ and $-V^{w21}-O[C(=O)]n_{w1}R^{wO''}$.

$V^{w21}$ represents a single bond or an alkylene group, and $R^{wO''}$ represents a hydrogen atom, a hydrocarbon group which may have a substituent, or an anion group. $n_{w1}$ represents 0 or 1.

Examples of the halogen atom for the substituent include a fluorine atom, a chlorine atom, a bromine atom and an iodine atom, and a fluorine atom is preferable.

The hydroxyalkyl group and the alkoxy group as the substituent are the same groups as defined for those described above in the explanation for $Ra'^{21}$.

As the alkylene group for $V^{w21}$ within $-V^{w21}-COOR^{wO''}$ and $-V_{w21}-O[C(=O)]n^{w1}R^{wO''}$ as a substituent, a linear or branched alkylene group is preferable. Examples of the linear alkylene group or branched alkylene group include the same groups as those described above in the explanation of the linear or branched aliphatic hydrocarbon group. The alkylene group preferably has 1 to 5 carbon atoms, more preferably 1 to 3 carbon atoms, and most preferably 1 carbon atom.

Examples of the hydrocarbon group for $R^{wO''}$ which may have a substituent include a cyclic group which may have a substituent, a chain-like alkyl group which may have a substituent, and a chain-like alkenyl group which may have a substituent. These groups are the same groups as those described later for $R^{101}$ in general formula (b-1) in the explanation of the component (B).

Preferable examples of the hydrocarbon group for $R^{wO''}$ which may have a substituent include: an acid dissociable group represented by general formulas (a1-r-1) to (a1-r-2) described later; an alkyl group exemplified later for R" in relation to $R^{a'21}$; and a group represented by general formulas (a2-r-1) to (a2-r-7), (a5-r-1) to (a5-r-4) and (ax3-r-1) to (ax3-r-3) described later.

As an example of the anion group for $R^{wO''}$, a group represented by general formulas (r-an-1) to (r-an-4) shown below can be given.

[Chemical Formula 9]

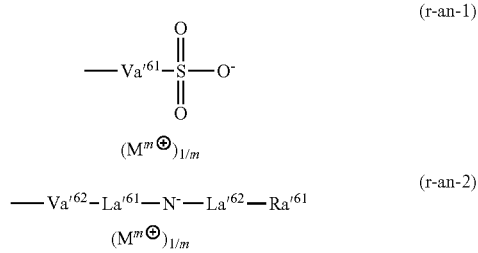

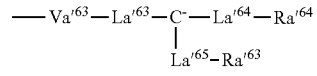
(r-an-3)

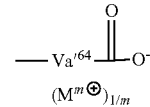
(r•an-4)

In the formulas, $Va'^{61}$ to $Va'^{64}$ represents a single bond or a divalent hydrocarbon group which may have a substituent; $La'^{61}$ and $La'^{62}$ each independently represents $-SO_2-$, $-CO-$ or a single bond; $La'^{63}$ to $La'^{65}$ each independently represents $-SO_2-$, $-CO-$ or a single bond; $Ra'^{61}$ to $Ra'^{63}$ each independently represents a hydrocarbon group which may have a substituent; $M^{m+}$ each independently represents an organic cation having a valency of m; and m represents an integer of 1 or more.

The divalent hydrocarbon group for $Va'^{61}$ to $Va'^{64}$ which may have a substituent is the same groups as those described later for the divalent hydrocarbon group in the explanation of the formula (a2-1). Among these, an alkylene group of 1 to 15 carbon atoms, an arylene group of 1 to 15 carbon atoms, a fluorinated alkylene group of 1 to 15 carbon atoms, or a fluorinated arylene group of 1 to 15 carbon atoms is preferable.

Examples of the hydrocarbon group for $Ra'^{61}$ to $Ra'^{63}$ which may have a substituent include the same groups as those described above for $R^{wO''}$ which may have a substituent.

Examples of the group for $R^{w2}$ include a vinyl group, an allyl group, a fluorovinyl group, a difluorovinyl group, a trifluorovinyl group, a difluorotrifluoromethylvinyl group, a trifluoroallyl group, a perfluoroallyl group, a styryl group, a vinylnaphthyl group, a fluorine-containing styryl group, a fluorine-containing vinylnaphthyl group, a norbornyl group, a fluorine-containing norbornyl group, and a vinyl group or allyl group substituted with a hydroxy group, hydroxyalkyl group, alkoxy group, $-V^{w21}-COOR^{wO''}$ or $-V^{w21}-OC(=O)R^{wO''}$.

With respect to a "divalent linking group containing a hetero atom" for $L^{w1}$, a hetero atom is an atom other than carbon and hydrogen, and examples thereof include an oxygen atom, a nitrogen atom, a sulfur atom and a halogen atom.

When $L^{w1}$ is a divalent linking group containing a hetero atom, the linking group preferably contains at least one atom selected from the group consisting of an oxygen atom, a sulfur atom and a nitrogen atom, and examples thereof include $-C(=O)-$, $-C(=O)-O-V^{w1}-C(=O)-$, $-C(=O)-O-V^{w2}-O-V^{w1}-C(=O)-$, $-C(=O)-O-V^{w3}-C(=O)-O-V^{w1}-C(=O)-$, $-C(=O)-O-Ar-O-R^{w11}-C(=O)-$, $-C(=O)-NH-V^{w1}-C(=O)-$, $-C(=O)-NH-Ar-C(=O)-$, $-C(=O)-O-V^{w4}-NH-C(=O)-$, $-C(=O)-$, $-S(=O)_2-$, $-C(=O)-O-V^{w5}-$, $-O-V^{w5}-$ and $-O-V^{w1}-C(=O)-$.

$V^{w1}$ to $V^{w5}$ each independently represents an alkylene group; and Ar represents an arylene group.

The alkylene group for $V^{w1}$ to $V^{w5}$ may be chain-like or cyclic. The chain-like alkylene group may be linear or branched, and examples thereof include the same linear alkylene groups and branched alkylene groups as those described above for the linear or branched aliphatic hydrocarbon group. As the cyclic alkylene group, a group in which one hydrogen atom has been removed from the aforementioned aliphatic cyclic group can be mentioned.

As the alkylene group for $V^{w1}$, $V^{w3}$ and $V^{w5}$, a linear or branched alkylene group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

As the alkylene group for $V^{w2}$ and $V^{w4}$, a linear or branched alkylene group is preferable, more preferably a linear alkylene group, still more preferably a linear alkylene group of 1 to 5 carbon atoms, and most preferably an ethylene group.

As the arylene group for Ar, a group in which one hydrogen atom has been removed from the aforementioned aromatic cyclic group can be mentioned. As the arylene group, a phenylene group or a naphthylene group is particularly desirable.

Among these examples, as the divalent linking group containing a hetero atom for $L^{w1}$, a group in which the terminal structure at the side of the oxygen atom adjacent to $W^{w1}$ (i.e., oxygen atom (—O—) bonded to $R^{w2}$-$L^{w1}$-) has —C(=O)— or an alkylene group (e.g., $V^{w5}$) is preferable, and a group in which the terminal structure at the side of oxygen atom adjacent to $W^1$ has —C(=O)— is more preferable in terms of ease in synthesis.

As the group for $W^1$ containing a polymerizable group, a group represented by $CH_2=C(R^w)$—$V^{w10}$-$L^{w1}$-[in the formula, $R''$ represents a hydrogen atom, an alkyl group of 1 to 5 carbon atoms, a halogenated alkyl group of 1 to 5 carbon atoms, a hydroxyalkyl, group, an alkoxy group, —$V^{w21}$—$COOR^{w0''}$ or —$V^{w21}$—$OC(=O)R^{w0''}$, wherein $V^{w10}$ represents an arylene group, an alkylene group or a single bond, and $L^{w1}$ represents a divalent linking group containing a hetero atom or a single bond] is particularly preferable.

In the formula, $R^{w0''}$ and $L^{w1}$ are the same as defined above, $R^w$ represents a hydrogen atom, an alkyl group of 1 to 5 carbon atoms, a halogenated alkyl group of 1 to 5 carbon atoms, a hydroxyalkyl group, an alkoxy group, —$V^{w21}$—$COOR^{w0''}$ or —$V^{w21}$—$OC(=O)R^{w0''}$.

As the alkyl group of 1 to 5 carbon atoms for $R^w$, a linear or branched alkyl group is preferable, and specific examples thereof include a methyl group, an ethyl group, a propyl group, an isopropyl group, an n-butyl group, an isobutyl group, a tert-butyl group, a pentyl group, an isopentyl group and a neopentyl group.

Examples of the halogenated alkyl group of 1 to 5 carbon atoms for $R^w$ include groups in which part or all of the hydrogen atoms within the aforementioned alkyl groups of 1 to 5 carbon atoms has been substituted with a halogen atom. Examples of the halogen atom include a fluorine atom, a chlorine atom, a bromine atom and an iodine atom, and a fluorine atom is particularly desirable.

As the hydroxyalkyl group, alkoxy group, —$V^{w21}$—$COOR^{w0''}$ and —$V^{w21}$—$OC(=O)R^{w0''}$ for $R^w$, the same groups as those described above for $R^{w2}$.

As $R^w$, a hydrogen atom or a methyl group is particularly desirable in terms of industrial availability.

As the arylene group for $V^{w10}$, a group in which one hydrogen atom has been removed from the aforementioned aromatic cyclic group can be mentioned. As the arylene group, a phenylene group or a naphthylene group is particularly desirable.

The alkylene group for $V^{w10}$ may be chain-like or cyclic. The chain-like alkylene group may be linear or branched, and examples thereof include the same linear alkylene groups and branched alkylene groups as those described above for the linear or branched aliphatic hydrocarbon group. As the cyclic alkylene group, a group in which one hydrogen atom has been removed from the aforementioned aliphatic cyclic group can be mentioned.

As the group for $Y^{w10}$, an arylene group or a single bond is preferable, and a phenylene group, a naphthylene group or a single bond is particularly preferable.

With respect to $W^1$, in the case where the group containing a polymerizable group is $CH_2=C(R)$—$V^{w10}$-$L^{w1}$-, $W^1$ preferably represents a structure formed by the cleavage of the ethylenic double bond.

That is, in the case where the group containing a polymerizable group is $CH_2=C(R)$—$V^{w10}$-$L^{w1}$-, the structural unit (a0) is preferably a structural unit represented by general formula (a0-2) shown below.

[Chemical Formula 10]

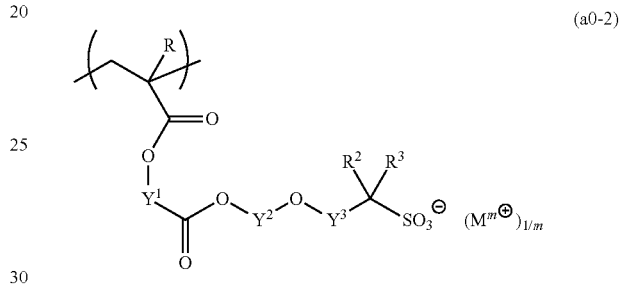

(a0-2)

In the formula, R represents a hydrogen atom, an alkyl group of 1 to 5 carbon atoms or a halogenated alkyl group of 1 to 5 carbon atoms; $Y^1$ and $Y^2$ each independently represents a divalent linking group; $Y^3$ represents a carbonyl group or an alkylene group; $R^2$ and $R^3$ each independently represents a fluorine atom or a fluorinated alkylene group; $M^{m+}$ represents an organic cation having a valency of m; and m represents an integer of 1 or more.

In the formula (a0-2), $Y^1$, $Y^2$, $Y^3$, $R^2$, $R^3$, $M^{m+}$ and m are the same as defined above.

In general formula (a0-2), R represents a hydrogen atom, an alkyl group of 1 to 5 carbon atoms or a halogenated alkyl group of 1 to 5 carbon atoms. The alkyl group of 1 to 5 carbon atoms is preferably a linear or branched alkyl group of 1 to 5 carbon atoms, and specific examples include a methyl group, an ethyl group, a propyl group, an isopropyl group, an n-butyl group, an isobutyl group, a tert-butyl group, a pentyl group, an isopentyl group, and a neopentyl group. The halogenated alkyl group of 1 to 5 carbon atoms is a group in which part or all of the hydrogen atoms of the aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

Specific examples of compounds which derive the structural unit represented by the general formula (a0-1) are shown below. The cation moieties may be the same cations ((ca-1) to (ca-4)) as those described later in relation to the component (B).

[Chemical Formula 11]
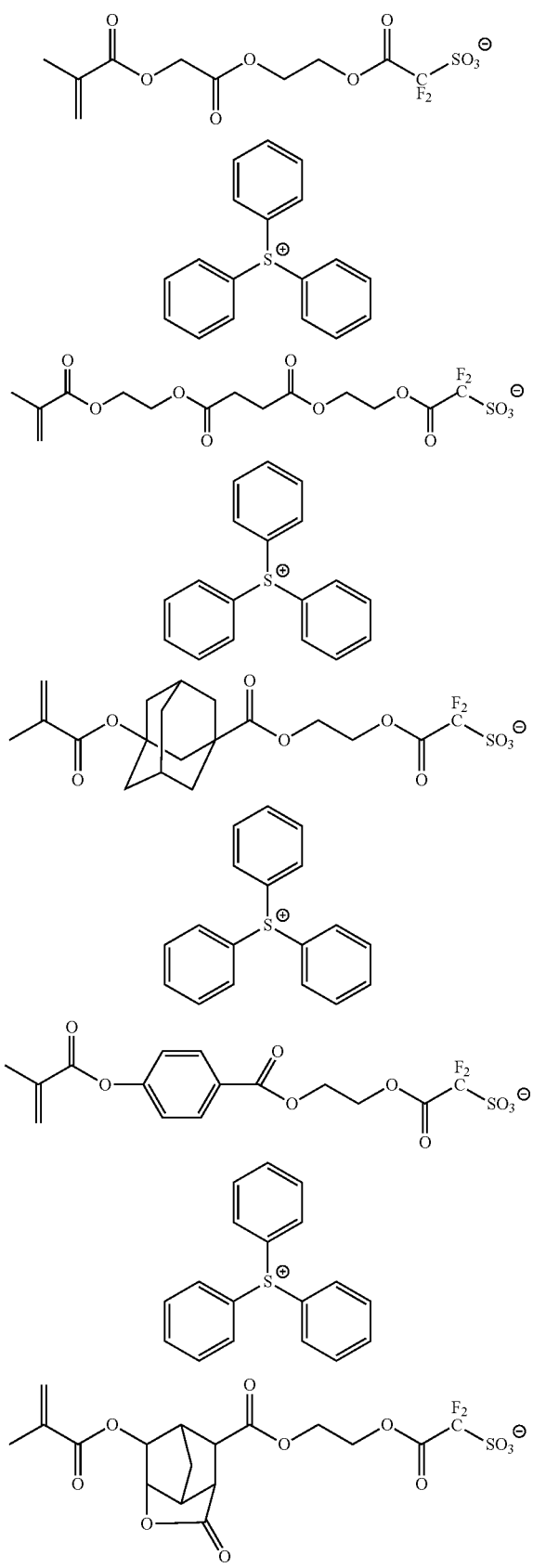
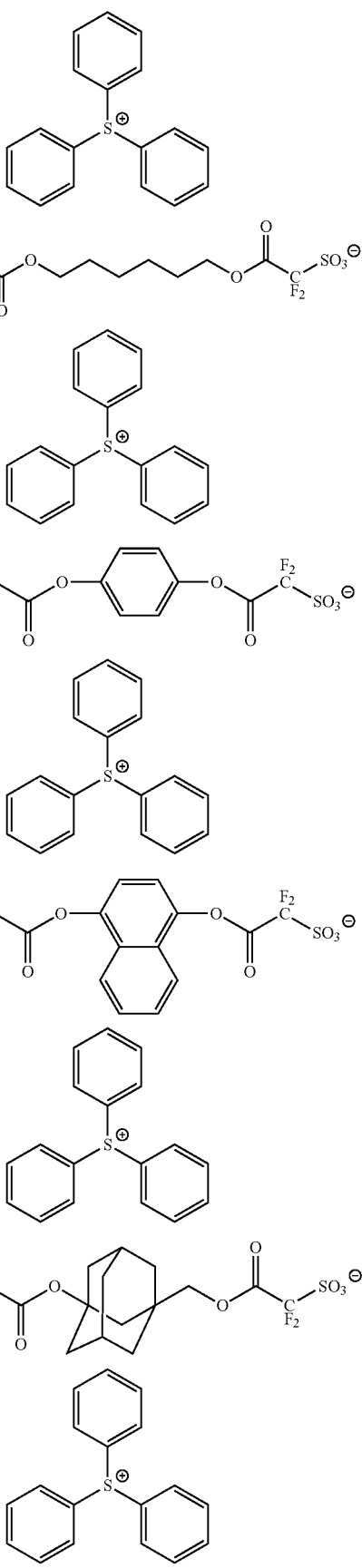

-continued

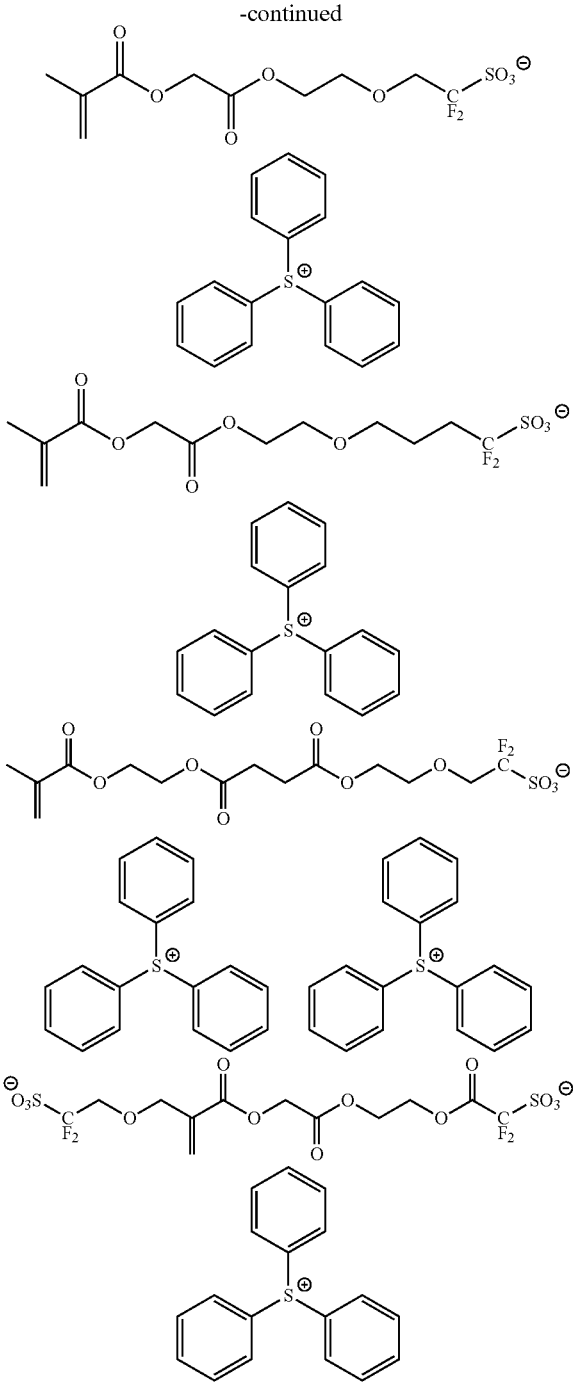

As the structural unit (a0) contained in the component (A1), 1 type of structural unit may be used, or 2 or more types may be used.

The amount of the structural unit (a0) within the component (A1) based on the combined total of all structural units constituting the component (A1) is preferably 1 to 50 mol %, more preferably 2 to 40 mol %, and still more preferably 3 to 30 mol %.

When the amount of the structural unit (a0) is at least as large as the lower limit of the above-mentioned range, various lithography properties (such as resolution, LER, and sensitivity) can be improved. On the other hand, when the amount of the structural unit (a0) is no more than the upper limit of the above-mentioned range, a good balance can be achieved with the other structural units, and a resist pattern having excellent shape can be obtained.

The structural unit (a0) in the polymeric compound (A1) contained in the resist composition of the present invention has a relatively long side chain with an ester bond between a polymerizable group and an anion group.

As a result, it is presumed that the degree of freedom of the anion group is improved, thereby contributing to improvement in sensitivity of the resist composition containing the polymeric compound (A1) having a structural unit (a1).

If the side chain is extended via a long alkylene group, the effect of improvement in sensitivity can be expected.

However, when the side chain is merely extended via a long alkylene group, the heat resistance of the polymeric compound is extremely deteriorated, which adversely affects the lithography properties.

In the structural unit (a0) in the polymeric compound (A1) contained in the resist composition of the present invention, the side chain is extended via an ester bond between a polymerizable group and an anion group. As a result, it is presumed that the heat resistance can be maintained, and improvement in sensitivity and lithography properties can be achieved.

In the resist composition of the present invention, the polymeric compound (A1) preferably has a structural unit (a1) containing an acid decomposable group that exhibits increased polarity by the action of acid.

(Structural Unit (a1))

The structural unit (a1) is a structural unit containing an acid decomposable group that exhibits increased polarity by the action of acid.

The term "acid decomposable group" refers to a group in which at least a part of the bond within the structure thereof is cleaved by the action of an acid.

Examples of acid decomposable groups which exhibit increased polarity by the action of an acid include groups which are decomposed by the action of acid to form a polar group.

Examples of the polar group include a carboxy group, a hydroxy group, an amino group and a sulfo group (—SO$_3$H). Among these, a polar group containing —OH in the structure thereof (hereafter, referred to as "OH-containing polar group") is preferable, a carboxy group or a hydroxy group is more preferable, and a carboxy group is particularly desirable.

More specifically, as an example of an acid decomposable group, a group in which the aforementioned polar group has been protected with an acid dissociable group (such as a group in which the hydrogen atom of the OH-containing polar group has been protected with an acid dissociable group) can be given.

Here, the "acid dissociable group" is (i) a group in which the bond between the acid dissociable group and the adjacent atom is cleaved by the action of acid; and (ii) a group in which one of the bonds is cleaved by the action of acid, or then a decarboxylation reaction occurs, thereby cleaving the bond between the acid dissociable group and the adjacent atom.

It is necessary that the acid dissociable group that constitutes the acid decomposable group is a group which exhibits a lower polarity than the polar group generated by the dissociation of the acid dissociable group. Thus, when the acid dissociable group is dissociated by the action of acid, a polar group exhibiting a higher polarity than that of the acid dissociable group is generated, thereby increasing the polarity. As a result, the polarity of the entire component (A1) is increased. By the increase in the polarity, the solubility in a developing solution changes and, the solubility in an organic developing solution is relatively decreased.

The acid dissociable group is not particularly limited, and any of the groups that have been conventionally proposed as acid dissociable groups for the base resins of chemically amplified resists can be used.

Examples of the acid dissociable group for protecting the carboxy group or hydroxy group as a polar group include the acid dissociable group represented by general formula (a1-r-1) shown below (hereafter, sometimes referred to as "acetal-type acid dissociable group").

[Chemical Formula 12]

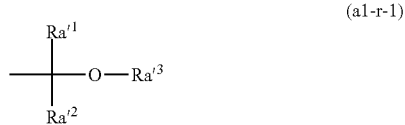

(a1-r-1)

In the formula, $Ra'^1$ and $Ra'^2$ represents a hydrogen atom or an alkyl group; and $Ra'^3$ represents a hydrocarbon group, provided that $Ra'^3$ may be bonded to $Ra'^1$ or $Ra'^2$ to form a ring.

In the formula (a1-r-1), as the alkyl group for $Ra'^1$ and $Ra'^2$, the same alkyl groups as those described above for the alkyl groups as the substituent which may be bonded to the carbon atom on the α-position of the aforementioned α-substituted alkylester can be used, although a methyl group or ethyl group is preferable, and a methyl group is particularly desirable.

As the hydrocarbon group for $Ra'^3$, an alkyl group of 1 to 20 carbon atoms is preferable, an alkyl group of 1 to 10 carbon atoms is more preferable, and a linear or branched alkyl group is still more preferable. Specific examples thereof include a methyl group, an ethyl group, a propyl group, an isopropyl group, an n-butyl group, an isobutyl group, a tert-butyl group, a pentyl group, an isopentyl group, a neopentyl group, 1,1-dimethylethyl group, 1,1-diethylpropyl group, 2,2-dimethypropyl group and 2,2-dimethybutyl group.

When $Ra'^3$ is a cyclic hydrocarbon group, the hydrocarbon group may be either an aliphatic group or an aromatic group, and may be either a polycyclic group or a monocyclic group. As the monocyclic alicyclic hydrocarbon group, a group in which one hydrogen atom has been removed from a monocycloalkane is preferable. The monocycloalkane preferably has 3 to 8 carbon atoms, and specific examples thereof include cyclopentane, cyclohexane and cyclooctane. As the polycyclic alicyclic hydrocarbon group, a group in which one hydrogen atom has been removed from a polycycloalkane is preferable, and the polycycloalkane preferably has 7 to 12 carbon atoms. Examples of the polycycloalkane include adamantane, norbornane, isobornane, tricyclodecane and tetracyclododecane.

Examples of the aromatic ring contained in the aromatic hydrocarbon group include aromatic hydrocarbon rings, such as benzene, biphenyl, fluorene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom.

Specific examples of the aromatic hydrocarbon group include a group in which one hydrogen atom has been removed from the aforementioned aromatic hydrocarbon ring (aryl group); and a group in which one hydrogen atom of the aforementioned aryl group has been substituted with an alkylene group (an arylalkyl group such as a benzyl group, a phenethyl group, a 1-naphthylmethyl group, a 2-naphthylmethyl group, a 1-naphthylethyl group or a 2-naphthylethyl group). The alkylene group (alkyl chain within the arylalkyl group) preferably has 1 to 4 carbon atoms, more preferably 1 or 2, and most preferably 1.

In the case where $Ra'^3$ is bonded to $Ra'^1$ or $Ra'^2$ to form a ring, the cyclic group is preferably a 4 to 7-membered ring, and more preferably a 4 to 6-membered ring. Specific examples of the cyclic group include tetrahydropyranyl group and tetrahydrofuranyl group.

Examples of the acid dissociable group for protecting the carboxy group as a polar group include the acid dissociable group represented by general formula (a1-r-2) shown below (hereafter, with respect to the acid dissociable group represented by the following formula (a1-r-2), the acid dissociable group constituted of alkyl groups is referred to as "tertiary ester-type acid dissociable group").

[Chemical Formula 13]

(a1-r-2)

In the formula, $Ra'^4$ to $Ra'^6$ each independently represents a hydrocarbon group, provided that $Ra'^5$ and $Ra'^6$ may be mutually bonded to form a ring.

As the hydrocarbon group for $Ra'^4$ to $Ra'^6$, the same groups as those described above for $Ra'^3$ can be mentioned. $Ra'^4$ is preferably an alkyl group of 1 to 5 carbon atoms. In the case where $Ra'^5$ and $Ra'^6$ are mutually bonded to form a ring, a group represented by general formula (a1-r2-1) shown below can be mentioned.

On the other hand, in the case where $Ra'^4$ to $Ra'^6$ are not mutually bonded and independently represent a hydrocarbon group, the group represented by general formula (a1-r2-2) shown below can be mentioned.

[Chemical Formula 14]

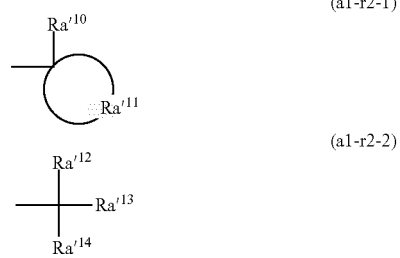

In the formula, $Ra'^{10}$ represents an alkyl group of 1 to 10 carbon atoms; $Ra'^{11}$ is a group which forms an aliphatic cyclic group together with a carbon atom having $Ra'^{10}$ bonded thereto; and $Ra'^{12}$ to $Ra'^{14}$ each independently represents a hydrocarbon group.

In the formula (a1-r2-1), as the alkyl group of 1 to 10 carbon atoms for $Ra'^{10}$, the same groups as described above for the linear or branched alkyl group for $Ra'^3$ in the formula (a1-r-1) are preferable. In the formula (a1-r2-1), as the aliphatic cyclic group which is formed by $Ra'^{11}$, the same groups as those described above for the cyclic alkyl group for Ra'³ in the formula (a1-r-1) are preferable.

In the formula (a1-r2-2), it is preferable that Ra'¹² and Ra'¹⁴ each independently represents an alkyl group or 1 to 10 carbon atoms, and it is more preferable that the alkyl group is the same group as the described above for the linear or branched alkyl group for Ra'³ in the formula (a1-r-1), it is still more preferable that the alkyl group is a linear alkyl group of 1 to 5 carbon atoms, and it is particularly preferable that the alkyl group is a methyl group or an ethyl group.

In the formula (a1-r2-2), it is preferable that Ra'¹³ is the same group as described above for the linear, branched or cyclic alkyl group for Ra'³ in the formula (a1-r-1).

Among these, the same cyclic alkyl group as those describe above for Ra'³ is more preferable.

Specific examples of the formula (a1-r2-1) are shown below. The "*" in the formula represents a valence bond.

[Chemical Formula 15]

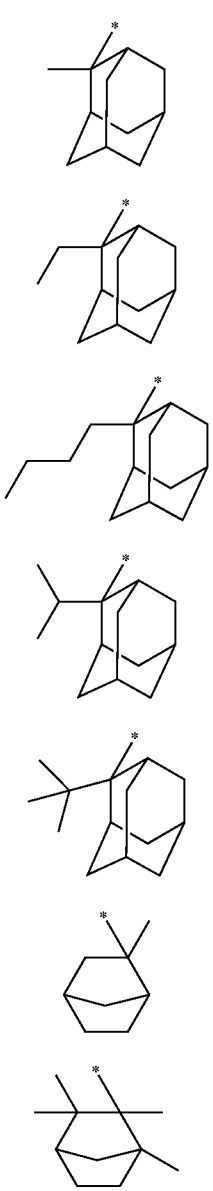

(r-pr-m1)

(r-pr-m2)

(r-pr-m3)

(r-pr-m4)

(r-pr-m5)

(r-pr-m6)

(r-pr-m7)

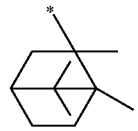

(r-pr-m8)

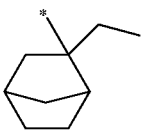

(r-pr-m9)

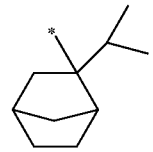

(r-pr-m10)

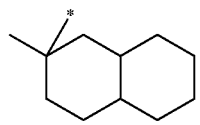

(r-pr-m11)

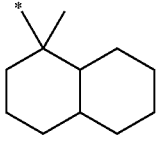

(r-pr-m12)

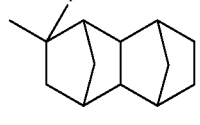

(r-pr-m13)

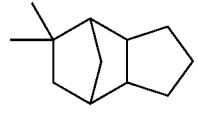

(r-pr-m14)

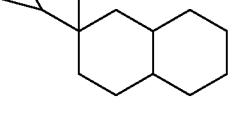

(r-pr-m15)

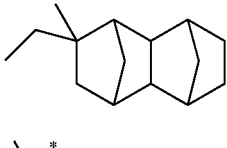

(r-pr-m16)

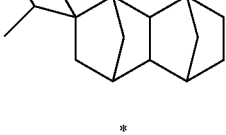

(r-pr-m17)

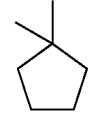

(r-pr-s1)

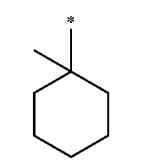 (r-pr-s2)
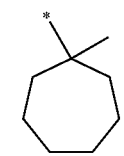 (r-pr-s3)
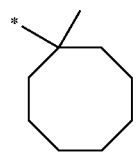 (r-pr-s4)
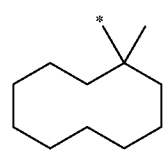 (r-pr-s5)
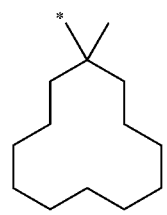 (r-pr-s6)
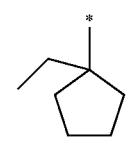 (r-pr-s7)
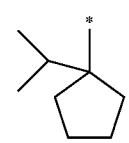 (r-pr-s8)
 (r-pr-s9)
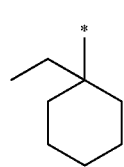 (r-pr-s10)
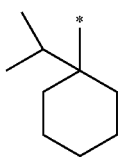 (r-pr-s11)
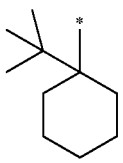 (r-pr-s12)
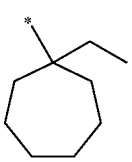 (r-pr-s13)
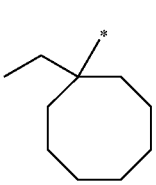 (r-pr-s14)
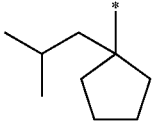 (r-pr-s15)
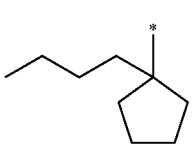 (r-pr-s16)
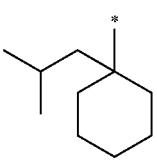 (r-pr-s17)
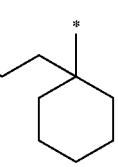 (r-pr-s18)

Specific examples of the formula (a1-r2-2) are shown below.
[Chemical Formula 16]
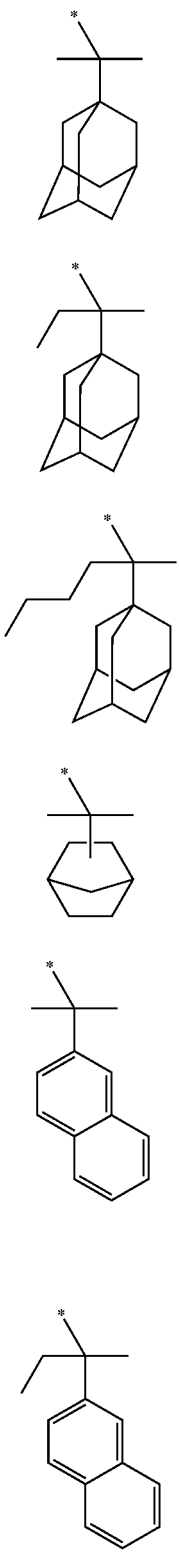
(r-pr-cm1)
(r-pr-cm2)
(r-pr-cm3)
(r-pr-cm4)
(r-pr-cm5)
(r-pr-cm6)
-continued
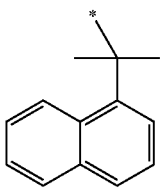
(r-pr-cm7)
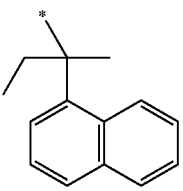
(r-pr-cm8)
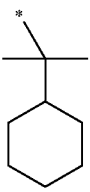
(r-pr-cs1)
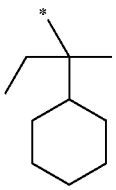
(r-pr-cs2)
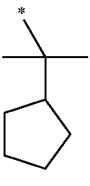
(r-pr-cs3)
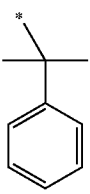
(r-pr-cs4)
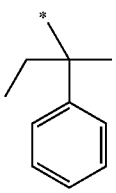
(r-pr-cs5)
(r-pr-c1)
(r-pr-c2)

(r-pr-c3)

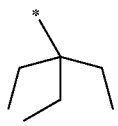

Examples of the acid dissociable group for protecting a hydroxy group as a polar group include the acid dissociable group represented by general formula (a1-r-3) shown below (hereafter, referred to as "tertiary alkyloxycarbonyl-type acid dissociable group").

[Chemical Formula 17]

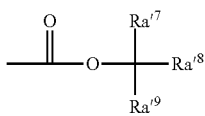

(a1-r-3)

In the formula, $Ra'^7$ to $Ra'^9$ each represents an alkyl group.

In the formula (a1-r-3), $Ra'^7$ to $Ra'^9$ is preferably an alkyl group of 1 to 5 carbon atoms, and more preferably an alkyl group of 1 to 3 carbon atoms.

Further, the total number of carbon atoms within the alkyl group is preferably 3 to 7, more preferably 3 to 5, and most preferably 3 or 4.

Examples of the structural unit (a1) include a structural unit derived from an acrylate ester which may have the hydrogen atom bonded to the carbon atom on the α-position substituted with a substituent and contains an acid decomposable group which exhibits increased polarity by the action of acid; a structural unit derived from hydroxystyrene or a hydroxystyrene derivative in which at least a part of the hydrogen atom of the hydroxy group is protected with a substituent containing an acid decomposable group; and a structural unit derived from vinylbenzoic acid or a vinylbenzoic acid derivative in which at least a part of the hydrogen atom within —C(=O)—OH is protected with a substituent containing an acid decomposable group.

As the structural unit (a1), a structural unit derived from an acrylate ester which may have the hydrogen atom bonded to the carbon atom on the α-position substituted with a substituent is preferable.

As the structural unit (a1), a structural unit represented by general formula (a1-1) or (a1-2) shown below is preferable.

[Chemical Formula 18]

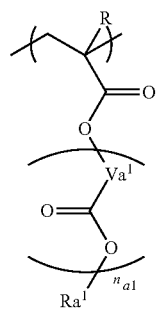

(a1-1)

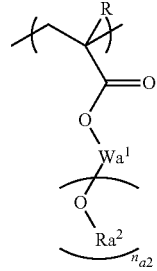

(a1-2)

In the formulae, R represents a hydrogen atom, an alkyl group of 1 to 5 carbon atoms or a halogenated alkyl group of 1 to 5 carbon atoms; $Va^1$ represents a divalent hydrocarbon group which may contain an ether bond, urethane bond or amide bond; $n_{a1}$ each independently represents an integer of 0 to 2; $Ra^1$ represents an acid dissociable group represented by the aforementioned formula (a1-r-1) or (a1-r-2);

$Wa^1$ represents a hydrocarbon group having a valency of $n_{a2}+1$; $n_{a2}$ represents 1 to 3; and $Ra^2$ represents an acid dissociable group represented by the aforementioned formulae (a1-r-1) or (a1-r-3).

In general formula (a1-1), as the alkyl group of 1 to 5 carbon atoms, a linear or branched alkyl group of 1 to 5 carbon atoms is preferable, and specific examples include a methyl group, an ethyl group, a propyl group, an isopropyl group, an n-butyl group, an isobutyl group, a tert-butyl group, a pentyl group, an isopentyl group and a neopentyl group. The halogenated alkyl group of 1 to 5 carbon atoms is a group in which part or all of the hydrogen atoms of the aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

The hydrocarbon group for $Va^1$ may be either an aliphatic hydrocarbon group or an aromatic hydrocarbon group. An "aliphatic hydrocarbon group" refers to a hydrocarbon group that has no aromaticity. The aliphatic hydrocarbon group as the divalent hydrocarbon group for $Va^1$ may be either saturated or unsaturated. In general, the aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

Further, as the group for $Va^1$, a group in which the aforementioned divalent hydrocarbon group has been bonded via an ether bond, urethane bond or amide bond can be mentioned.

The linear or branched aliphatic hydrocarbon group preferably has 1 to 10 carbon atoms, more preferably 1 to 6, still more preferably 1 to 4, and most preferably 1 to 3.

As the linear aliphatic hydrocarbon group, a linear alkylene group is preferable, and specific examples include a methylene group [—CH₂—], an ethylene group [—(CH₂)₂—], a trimethylene group [—(CH₂)₃—], a tetramethylene group [—(CH₂)₄—] and a pentamethylene group [—(CH₂)₅—].

As the branched aliphatic hydrocarbon group, a branched alkylene group is preferable, and specific examples include alkylalkylene groups, e.g., alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)—, and —C(CH$_2$CH$_3$)$_2$—; alkylethylene groups such as —CH(CH$_3$)CH$_2$—, —CH(CH$_3$)CH(CH$_3$)—, —C(CH$_3$)$_2$CH$_2$—, —CH(CH$_2$CH$_3$)CH$_2$—, and —C(CH$_2$CH$_3$)$_2$—CH$_2$—; alkyltrimethylene groups such as —CH(CH$_3$)CH$_2$CH$_2$—, and —CH$_2$CH(CH$_3$)CH$_2$—; and alkyltetramethylene groups such as —CH(CH$_3$)CH$_2$CH$_2$CH$_2$—, and —CH$_2$CH(CH$_3$)CH$_2$CH$_2$—. As the alkyl group within the alkylalkylene group, a linear alkyl group of 1 to 5 carbon atoms is preferable.

As examples of the aliphatic hydrocarbon group containing a ring in the structure thereof, an alicyclic hydrocarbon group (a group in which two hydrogen atoms have been removed from an aliphatic hydrocarbon ring), a group in which the alicyclic hydrocarbon group is bonded to the terminal of a linear or branched aliphatic hydrocarbon group, and a group in which the alicyclic hydrocarbon group is interposed within a linear or branched aliphatic hydrocarbon group, can be given. As the linear or branched aliphatic hydrocarbon group, the same groups as those described above can be used.

The alicyclic hydrocarbon group preferably has 3 to 20 carbon atoms, and more preferably 3 to 12 carbon atoms.

The alicyclic hydrocarbon group may be either a monocyclic group or a polycyclic group. As the monocyclic alicyclic hydrocarbon group, a group in which 2 hydrogen atoms have been removed from a monocycloalkane is preferable. The monocycloalkane preferably has 3 to 6 carbon atoms, and specific examples thereof include cyclopentane and cyclohexane. As the polycyclic alicyclic hydrocarbon group, a group in which two hydrogen atoms have been removed from a polycycloalkane is preferable, and the polycycloalkane preferably has 7 to 12 carbon atoms. Examples of the polycycloalkane include adamantane, norbornane, isobornane, tricyclodecane and tetracyclododecane.

The aromatic hydrocarbon group is a hydrocarbon group having an aromatic ring.

The aromatic hydrocarbon group as the divalent hydrocarbon group for Va$^1$ preferably has 3 to 30 carbon atoms, more preferably 5 to 30, still more preferably 5 to 20, still more preferably 6 to 15, and most preferably 6 to 10. Here, the number of carbon atoms within a substituent(s) is not included in the number of carbon atoms of the aromatic hydrocarbon group.

Examples of the aromatic ring contained in the aromatic hydrocarbon group include aromatic hydrocarbon rings, such as benzene, biphenyl, fluorene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom.

Specific examples of the aromatic hydrocarbon group include a group in which two hydrogen atoms have been removed from the aforementioned aromatic hydrocarbon ring (arylene group); and a group in which one hydrogen atom has been removed from the aforementioned aromatic hydrocarbon ring (aryl group) and one hydrogen atom has been substituted with an alkylene group (such as a benzyl group, a phenethyl group, a 1-naphthylmethyl group, a 2-naphthylmethyl group, a 1-naphthylethyl group, or a 2-naphthylethyl group). The alkylene group (alkyl chain within the arylalkyl group) preferably has 1 to 4 carbon atoms, more preferably 1 or 2, and most preferably 1.

In the aforementioned formula (a1-2), the hydrocarbon group for Wa$^1$ having a valency of $n_{a2}+1$ may be either an aliphatic hydrocarbon group or an aromatic hydrocarbon group. The aliphatic hydrocarbon group refers to a hydrocarbon group that has no aromaticity, and may be either saturated or unsaturated, but is preferably saturated. Examples of the aliphatic hydrocarbon group include a linear or branched aliphatic hydrocarbon group, an aliphatic hydrocarbon group containing a ring in the structure thereof, and a combination of the linear or branched aliphatic hydrocarbon group and the aliphatic hydrocarbon group containing a ring in the structure thereof. As the specific examples thereof, the same groups as those described above for Va$^1$ in the aforementioned formula (a1-1) can be mentioned.

The valency of $n_{a2}+1$ is preferably divalent, trivalent or tetravalent, and divalent or trivalent is more preferable.

As the structural unit represented by the aforementioned formula (a1-2), a structural unit represented by general formula (a1-2-01) shown below is desirable.

[Chemical Formula 19]

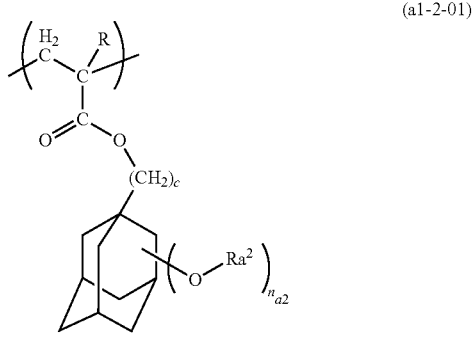

(a1-2-01)

In the formula (a1-2-01), Ra$^2$ represents an acid dissociable group represented by the aforementioned formulae (a1-r-1) or (a1-r-3); $n_{a2}$ is an integer of 1 to 3, preferably 1 or 2, and more preferably 1; c is an integer of 0 to 3, preferably 0 or 1, and more preferably 1; and R is the same as defined above.

Specific examples of the structural units (a1-1) and (a1-2) are shown below. In the formulas shown below, R$^\alpha$ represents a hydrogen atom, a methyl group or a trifluoromethyl group.

[Chemical Formula 20]

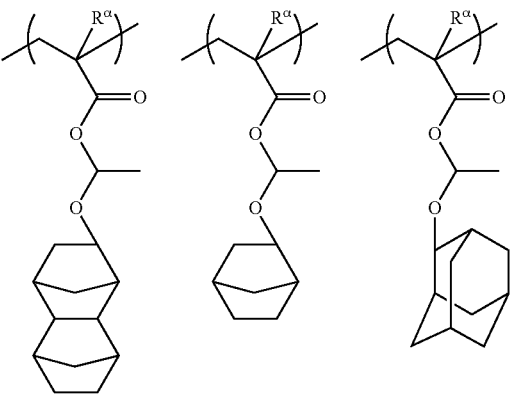

[Chemical Formula 21]
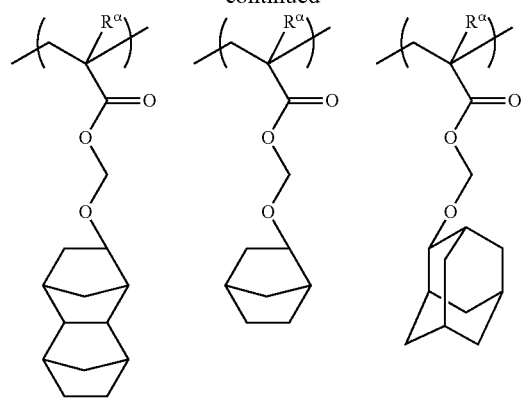
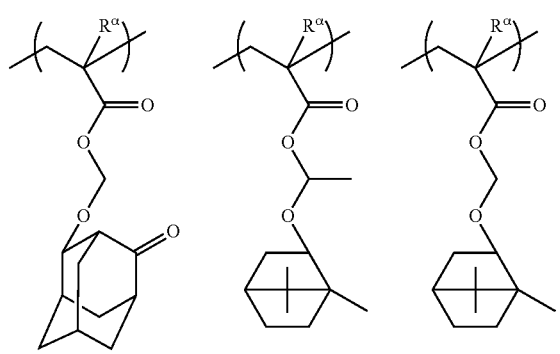
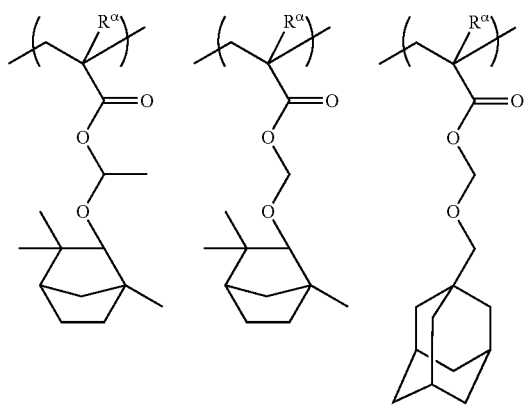
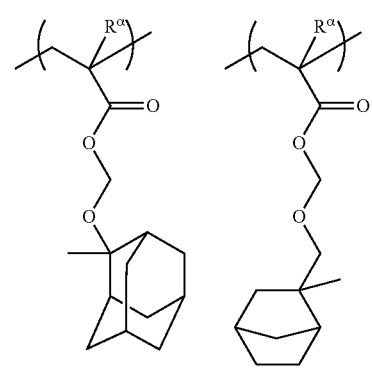
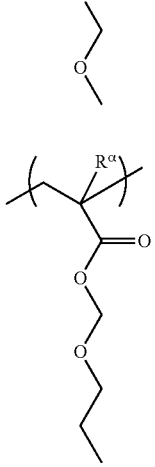
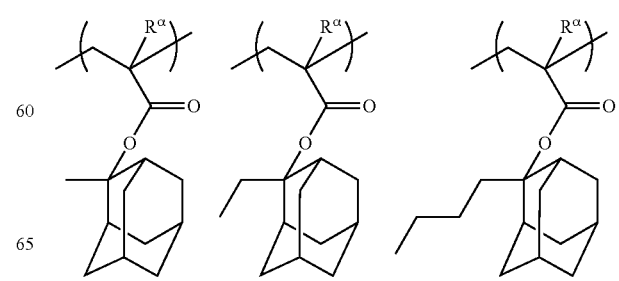
[Chemical Formula 22]

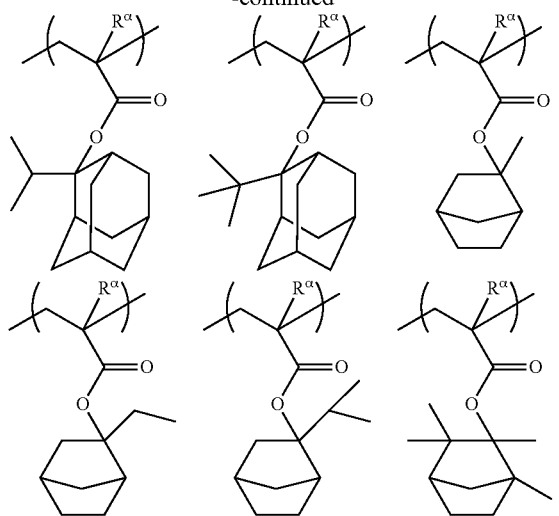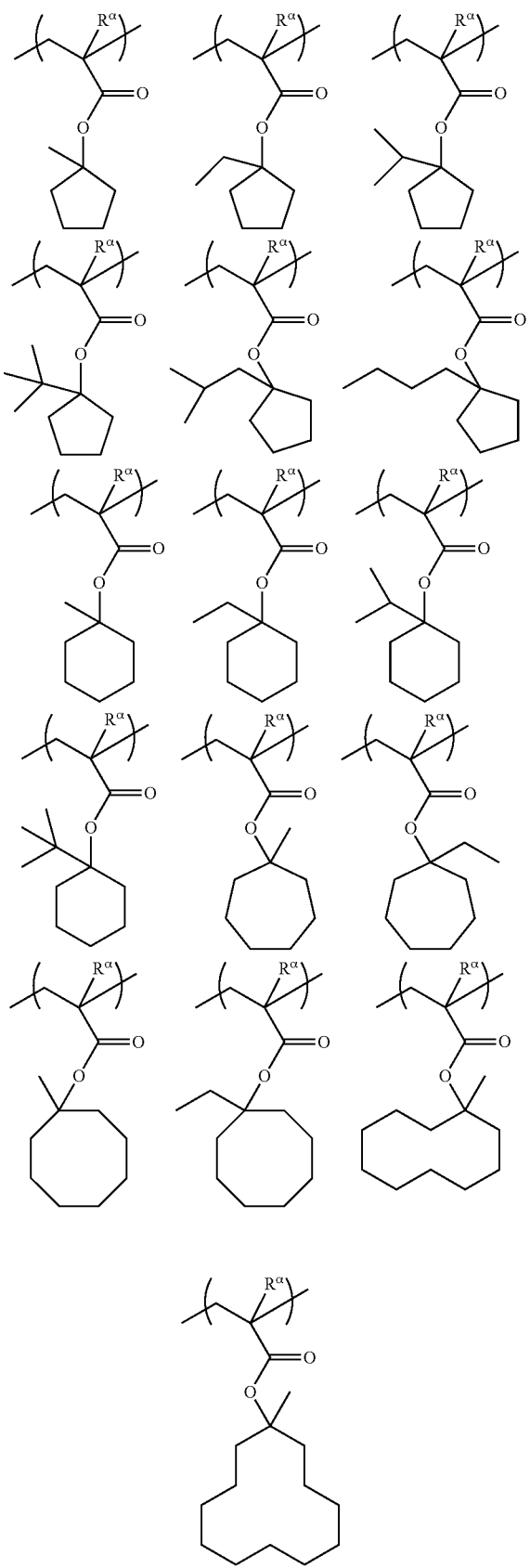

[Chemical Formula 24]

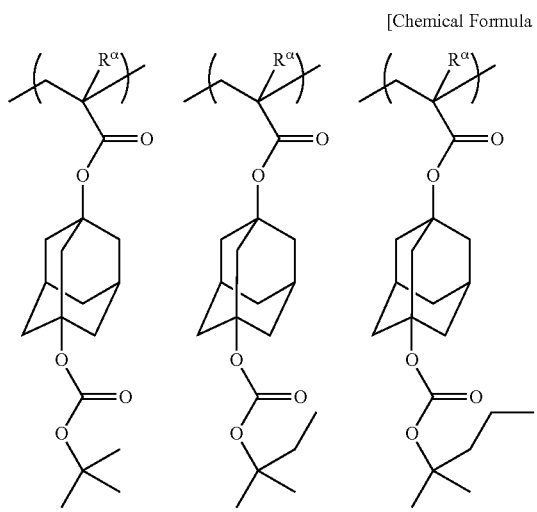

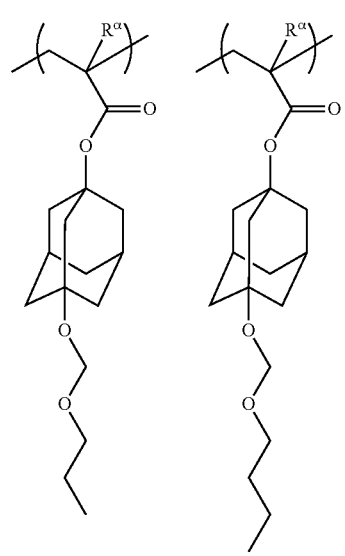

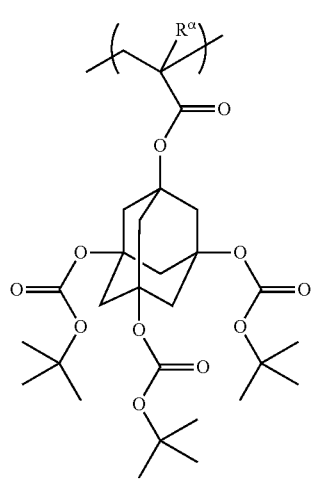

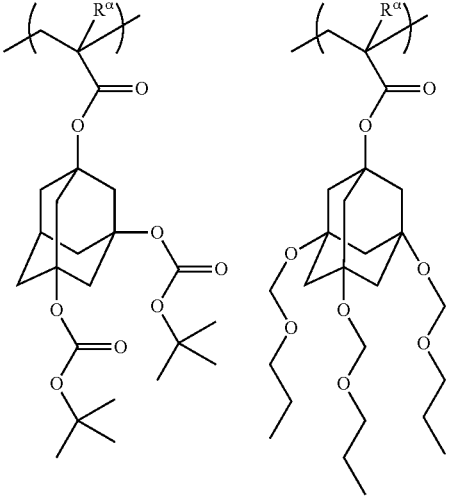

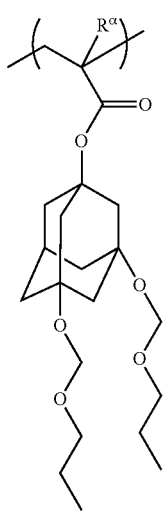

In the component (A), the amount of the structural unit (a1) based on the combined total of all structural units constituting the component (A) is preferably 5 to 80 mol %, more preferably 10 to 75 mol %, and still more preferably 20 to 70 mol %. When the amount of the structural unit (a1) is at least as large as the lower limit of the above-mentioned range, various lithography properties such as sensitivity, resolution and roughness are improved. On the other hand, when the amount of the structural unit (a1) is no more than the upper limit of the above-mentioned range, a good balance can be achieved with the other structural units.

(Other Structural Units)

In the present invention, the resin compound (A1) may also include the structural units (a2) to (a4) described later.

(Structural Unit (a2))

The structural unit (a2) is a structural unit which contains a lactone-containing cyclic group, an —$SO_2$— containing cyclic group or a carbonate-containing cyclic group, and which does not fall under the definition of the structural unit (a0).

When the component (A1) is used for forming a resist film, the lactone-containing cyclic group or the carbonate-containing cyclic group within the structural unit (a2) is effective in improving the adhesion between the resist film and the substrate.

The aforementioned structural unit (a1) which contains a lactone-containing cyclic group or a carbonate-containing cyclic group falls under the definition of the structural unit (a2); however, such a structural unit is regarded as a structural unit (a1), and does not fall under the definition of the structural unit (a2).

When the component (A1) is used for forming a resist film, the —SO$_2$— containing cyclic group within the structural unit (a2) is effective in improving the adhesion between the resist film and the substrate.

The aforementioned structural unit (a1) which contains a —SO$_2$— containing cyclic group falls under the definition of the structural unit (a2); however, such a structural unit is regarded as a structural unit (a1), and does not fall under the definition of the structural unit (a2).

The structural unit (a2) is preferably a structural unit represented by general formula (a2-1) shown below.

[Chemical Formula 25]

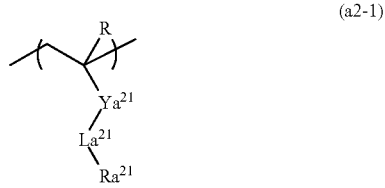

(a2-1)

In the formula, R represents a hydrogen atom, an alkyl group of 1 to 5 carbon atoms or a halogenated alkyl group of 1 to 5 carbon atoms; Ya$^{21}$ represents a single bond or a divalent linking group; La$^{21}$ represents —O—, —COO—, —CON(R')—, —OCO—, —CONHCO— or —CONHCS; and R' represents a hydrogen atom or a methyl group, provided that when La$^{21}$ represents —O—, Ya$^{21}$ does not represents —CO—; and Ra$^{21}$ represents a lactone-containing cyclic group, a carbonate-containing cyclic group or an —SO$_2$— containing cyclic group.

The divalent linking group for Ya$^{21}$ is not particularly limited, and preferable examples thereof include a divalent hydrocarbon group which may have a substituent and a divalent linking group containing a hetero atom.

(Divalent Hydrocarbon Group which May have a Substituent)

The hydrocarbon group as a divalent linking group may be either an aliphatic hydrocarbon group or an aromatic hydrocarbon group.

An "aliphatic hydrocarbon group" refers to a hydrocarbon group that has no aromaticity. The aliphatic hydrocarbon group may be saturated or unsaturated. In general, the aliphatic hydrocarbon group is preferably saturated.

Examples of the aliphatic hydrocarbon group include a linear or branched aliphatic hydrocarbon group, and an aliphatic hydrocarbon group containing a ring in the structure thereof can be given. Specific examples thereof include the same group as exemplified above for Va$^1$ in the aforementioned formula (a1-1).

The linear or branched aliphatic hydrocarbon group may or may not have a substituent. Examples of the substituent include a fluorine atom, a fluorinated alkyl group of 1 to 5 carbon atoms, and a carbonyl group.

As examples of the aliphatic hydrocarbon group containing a ring in the structure thereof, a cyclic aliphatic hydrocarbon group which may have a substituent containing a hetero atom in the ring structure thereof (a group in which two hydrogen atoms have been removed from an aliphatic hydrocarbon ring), a group in which the cyclic aliphatic hydrocarbon group is bonded to the terminal of a linear or branched aliphatic hydrocarbon group, and a group in which the cyclic aliphatic hydrocarbon group is interposed within a linear or branched aliphatic hydrocarbon group, can be given. As the linear or branched aliphatic hydrocarbon group, the same groups as those described above can be used.

The cyclic aliphatic hydrocarbon group preferably has 3 to 20 carbon atoms, and more preferably 3 to 12 carbon atoms.

Specific examples of the cyclic aliphatic hydrocarbon group include the same group as exemplified above for Va$^1$ in the aforementioned formula (a1-1).

The cyclic aliphatic hydrocarbon group may or may not have a substituent. Examples of the substituent include an alkyl group, an alkoxy group, a halogen atom, a halogenated alkyl group, a hydroxyl group and a carbonyl group.

The alkyl group as the substituent is preferably an alkyl group of 1 to 5 carbon atoms, and a methyl group, an ethyl group, a propyl group, an n-butyl group or a tert-butyl group is most desirable.

The alkoxy group as the substituent is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the halogen atom for the substituent include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups has been substituted with the aforementioned halogen atoms.

In the cyclic aliphatic hydrocarbon group, part of the carbon atoms constituting the ring structure thereof may be substituted with a substituent containing a hetero atom. The substituent containing a hetero atom is preferably —O—, —C(=O)—O—, —S—, —S(=O)$_2$—, or —S(=O)$_2$—O—

Specific examples of the aromatic hydrocarbon group as a divalent hydrocarbon group include the same group as exemplified above for Va$^1$ in the aforementioned formula (a1-1).

With respect to the aromatic hydrocarbon group, the hydrogen atom within the aromatic hydrocarbon group may be substituted with a substituent. For example, the hydrogen atom bonded to the aromatic ring within the aromatic hydrocarbon group may be substituted with a substituent. Examples of substituents include an alkyl group, an alkoxy group, a halogen atom, a halogenated alkyl group, and a hydroxyl group.

The alkyl group as the substituent is preferably an alkyl group of 1 to 5 carbon atoms, and a methyl group, an ethyl group, a propyl group, an n-butyl group or a tert-butyl group is most desirable.

As the alkoxy group, the halogen atom and the halogenated alkyl group for the substituent, the same groups as the aforementioned substituent groups for substituting a hydrogen atom within the cyclic aliphatic hydrocarbon group can be used.

(Divalent Linking Group Containing a Hetero Atom)

With respect to a divalent linking group containing a hetero atom, a hetero atom is an atom other than carbon and hydrogen, and examples thereof include an oxygen atom, a nitrogen atom, a sulfur atom and a halogen atom.

In the case where Ya$^{21}$ represents a divalent linking group containing a hetero atom, preferable examples of the linking group include —O—, —C(=O)—O—, —C(=O)—, —O—C(=O)—O—, —C(=O)—NH—, —NH— and —NH—C(=NH)— (wherein H may be substituted with a substituent such as an alkyl group or an acyl group), —S—, —S(=O)$_2$—, —S(=O)$_2$—O—, and a group represented by general formula —$Y^{21}$—O—$Y^{22}$—, —$Y^{21}$—O—, —$Y^{21}$—C(=O)—O—$Y^{21}$, —[$Y^{21}$—C(=O)—O]$_{m'}$—$Y^{22}$— or —$Y^{21}$—O—C(=O)—$Y^{22}$— [in the formulas, each of $Y^{21}$ and $Y^{22}$ independently represents a divalent hydrocarbon group which may have a substituent, O represents an oxygen atom, and m' represents an integer of 0 to 3].

When the divalent linking group containing a hetero atom represents —C(=O)—NH—, —NH—, or —NH—C(=NH)—, H may be substituted with a substituent such as an alkyl group, an acyl group or the like. The substituent (an alkyl group, an acyl group or the like) preferably has 1 to 10 carbon atoms, more preferably 1 to 8, and most preferably 1 to 5.

In formula $Y^{21}$—O—$Y^{22}$—, $Y^{21}$—O—, —$Y^{21}$—C(=O)—O—, —C(=O)—O—$Y^{21}$, —[$Y^{21}$—C(=O)—O]$_{m'}$—$Y^{22}$— or —$Y^{21}$—O—C(=O)—$Y^{22}$—, $Y^{21}$ and $Y^{22}$ each independently represents a divalent hydrocarbon group which may have a substituent. Examples of the divalent hydrocarbon group include the same groups as those described above as the "divalent hydrocarbon group which may have a substituent" in the explanation of the aforementioned divalent linking group.

As $Y^{21}$, a linear aliphatic hydrocarbon group is preferable, more preferably a linear alkylene group, still more preferably a linear alkylene group of 1 to 5 carbon atoms, and a methylene group or an ethylene group is particularly desirable.

As $Y^{22}$, a linear or branched aliphatic hydrocarbon group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

In the group represented by the formula —[$Y^{21}$—C(=O)—O]$_{m'}$—$Y^{22}$—, m' represents an integer of 0 to 3, preferably an integer of 0 to 2, more preferably 0 or 1, and particularly preferably 1. Namely, it is particularly desirable that the group represented by the formula —[$Y^{21}$—C(=O)—O]$_{m'}$—$Y^{22}$— is a group represented by the formula —$Y^{21}$—C(=O)—O—$Y^{22}$—. Among these, a group represented by the formula —(CH$_2$)$_{a'}$—C(=O)—O—(CH$_2$)$_{b'}$— is preferable. In the formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

In the present invention, Ya$^{21}$ preferably represents an ester bond [—C(=O)—O—], an ether bond (—O—), a linear or branched alkylene group, a combination of these, or a single bond.

In the formula (a2-1), Ra$^{21}$ represents a lactone-containing cyclic group, a carbonate-containing cyclic group or an —SO$_2$— containing cyclic group.

The term "lactone-containing cyclic group" refers to a cyclic group including a ring containing a —O—C(=O)— structure (lactone ring) in the ring skeleton thereof. The term "lactone ring" refers to a single ring containing a —O—C(=O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings. The lactone-containing cyclic group may be either a monocyclic group or a polycyclic group.

The lactone-containing cyclic group for Ra$^{21}$ is not particularly limited, and an arbitrary structural unit may be used.

Specific examples include groups represented by general formulas (a2-r-1) to (a2-r-7) shown below. Hereafter, "*" represents a valence bond.

[Chemical Formula 26]

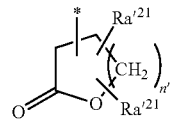
(a2-r-1)

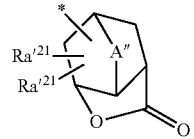
(a2-r-2)

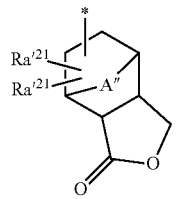
(a2-r-3)

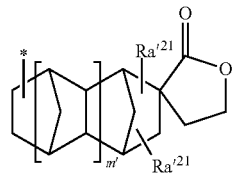
(a2-r-4)

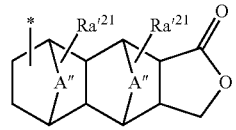
(a2-r-5)

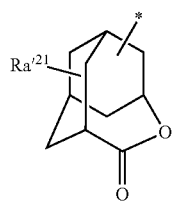
(a2-r-6)

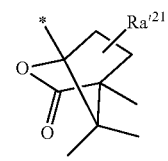
(a2-r-7)

In the formulas, each Ra'$^{21}$ independently represents a hydrogen atom, an alkyl group, an alkoxy group, a halogen atom, a halogenated alkyl group, a hydroxy group, —COOR", —OC(=O)R", a hydroxyalkyl group or a cyano group; R" represents a hydrogen atom or an alkyl group; A" represents an oxygen atom, a sulfur atom or an alkylene group of 1 to 5 carbon atoms which may contain an oxygen atom or a sulfur atom; n' represents an integer of 0 to 2; and m' represents 0 or 1.

In general formulas (a2-r-1) to (a2-r-7), A" represents an oxygen atom, a sulfonyl group or an alkylene group of 1 to 5 carbon atoms which may contain an oxygen atom (—O—) or a sulfur atom (—S—). As the alkylene group of 1 to 5 carbon atoms for A″, a linear or branched alkylene group is preferable, and examples thereof include a methylene group, an ethylene group, an n-propylene group and an isopropylene group. Examples of alkylene groups that contain an oxygen atom or a sulfur atom include the aforementioned alkylene groups in which —O— or —S— is bonded to the terminal of the alkylene group or present between the carbon atoms of the alkylene group. Specific examples of such alkylene groups include —O—CH$_2$—, —CH$_2$—O—CH$_2$—, —S—CH$_2$— and —CH$_2$—S—CH$_2$—. As A″, an alkylene group of 1 to 5 carbon atoms or —O— is preferable, more preferably an alkylene group of 1 to 5 carbon atoms, and most preferably a methylene group. Each Ra′$^{21}$ independently represents an alkyl group, an alkoxy group, a halogen atom, a halogenated alkyl group, —COOR″, —OC(=O)R″, a hydroxyalkyl group or a cyano group.

The alkyl group for Ra′$^{21}$ is preferably an alkyl group of 1 to 5 carbon atoms.

The alkoxy group for Ra′$^{21}$ is preferably an alkoxy group of 1 to 6 carbon atoms.

Further, the alkoxy group is preferably a linear or branched alkoxy group. Specific examples of the alkoxy groups include the aforementioned alkyl groups for Ra′$^{21}$ having an oxygen atom (—O—) bonded thereto.

As examples of the halogen atom for Ra′$^{21}$, a fluorine atom, chlorine atom, bromine atom and iodine atom can be given. Among these, a fluorine atom is preferable.

Examples of the halogenated alkyl group for Ra′$^{21}$ include groups in which part or all of the hydrogen atoms within the aforementioned alkyl groups for Ra′$^{21}$ has been substituted with the aforementioned halogen atoms. As the halogenated alkyl group, a fluorinated alkyl group is preferable, and a perfluoroalkyl group is particularly desirable.

With respect to —COOR″ and —OC(=O)R″ for Ra′$^{21}$, R″ represents a hydrogen atom or an alkyl group.

Specific examples of the groups represented by the aforementioned general formulas (a2-r-1) to (a2-r-7) are shown below.

[Chemical Formula 27]

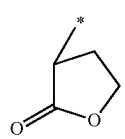
(r-lc-1-1)

(r-lc-1-2)

(r-lc-1-3)

(r-lc-1-4)

(r-lc-1-5)

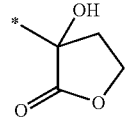
(r-lc-1-6)

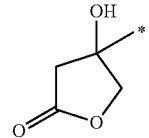
(r-lc-1-7)

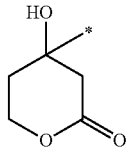
(r-lc-2-1)

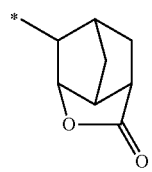
(r-lc-2-2)

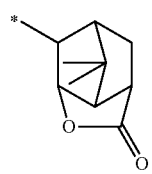
(r-lc-2-3)

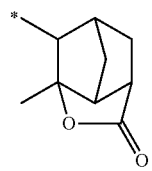
(r-lc-2-4)

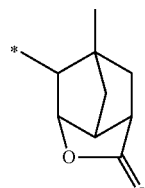
(r-lc-2-5)

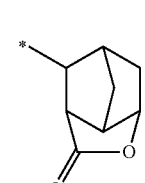
(r-lc-2-6)

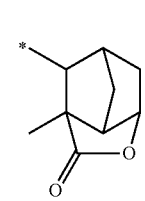

-continued
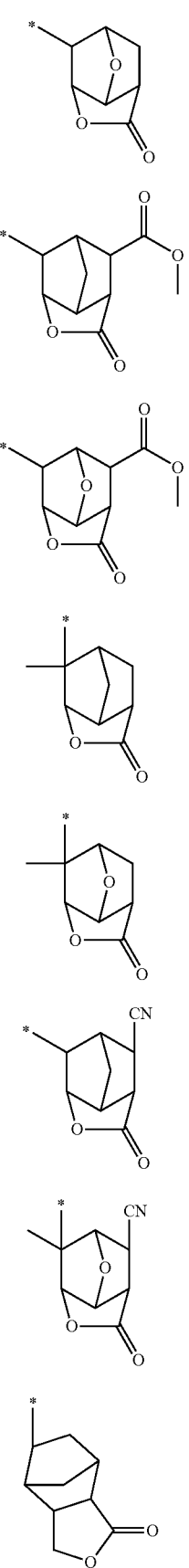
(r-lc-2-7)
(r-lc-2-8)
(r-lc-2-9)
(r-lc-2-10)
(r-lc-2-11)
(r-lc-2-12)
(r-lc-2-13)
(r-lc-3-1)
-continued
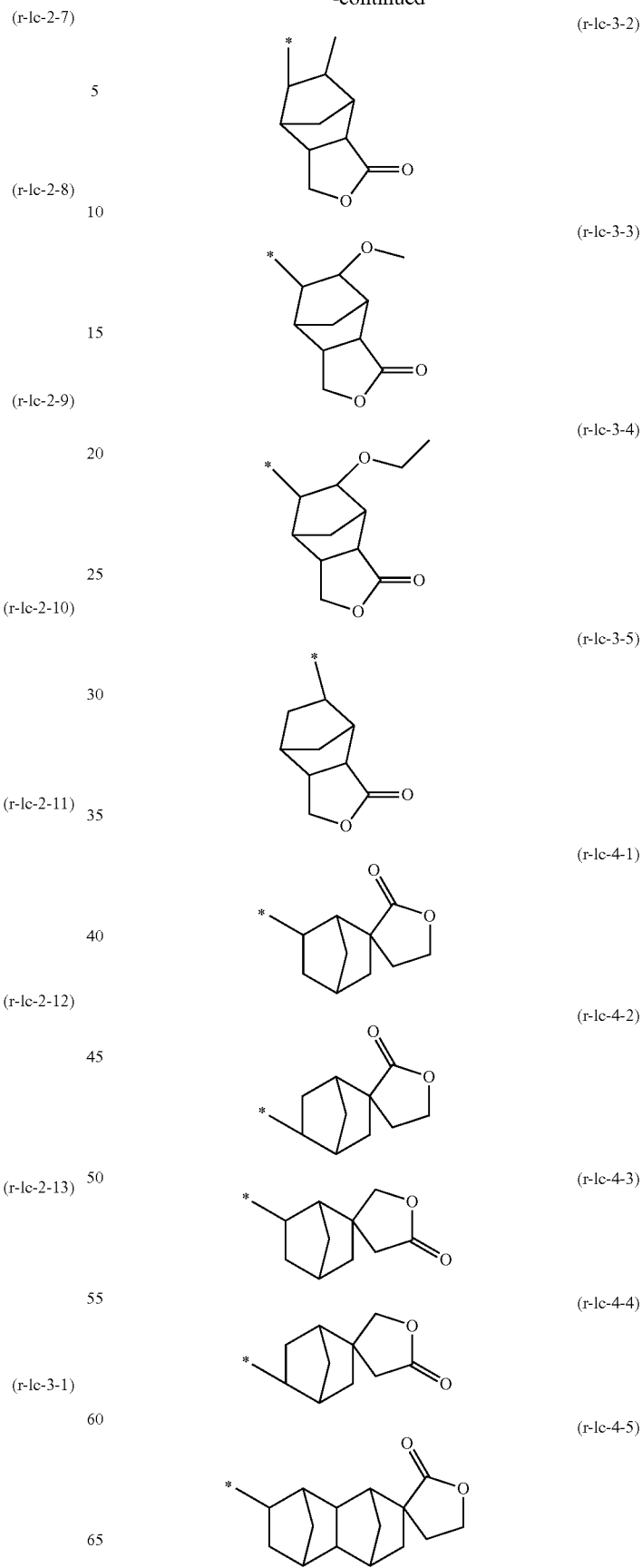
(r-lc-3-2)
(r-lc-3-3)
(r-lc-3-4)
(r-lc-3-5)
(r-lc-4-1)
(r-lc-4-2)
(r-lc-4-3)
(r-lc-4-4)
(r-lc-4-5)

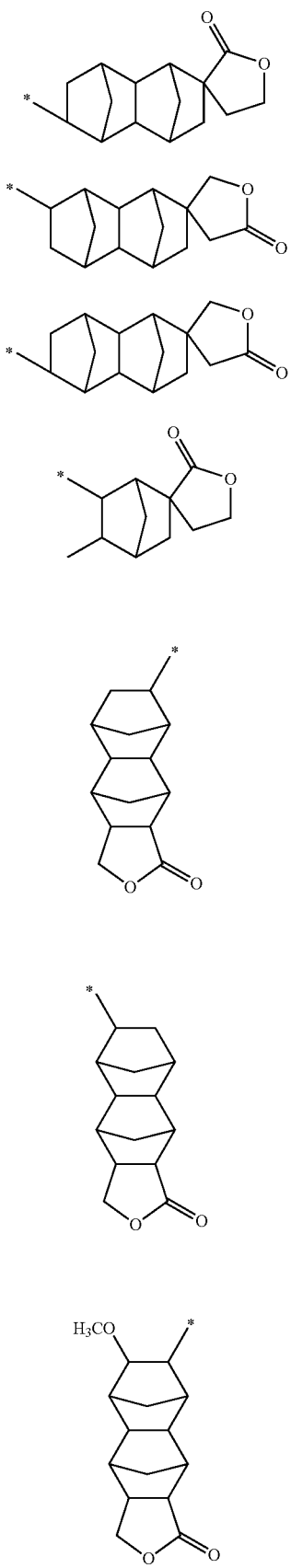
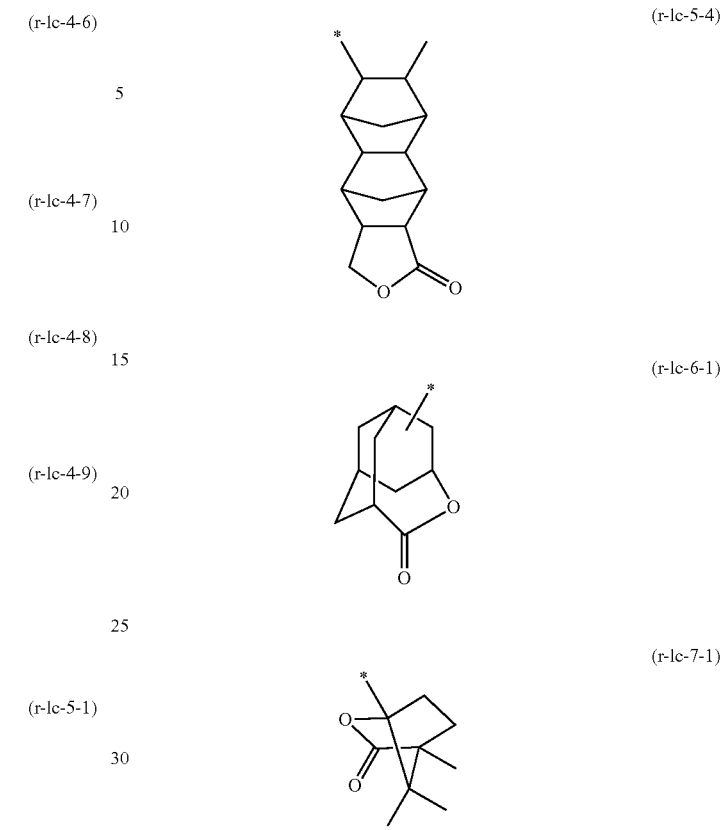

An "—SO$_2$— containing cyclic group" refers to a cyclic group having a ring containing —SO$_2$— within the ring structure thereof, i.e., a cyclic group in which the sulfur atom (S) within —SO$_2$— forms part of the ring skeleton of the cyclic group. The ring containing —SO$_2$— within the ring skeleton thereof is counted as the first ring. A cyclic group in which the only ring structure is the ring that contains —SO$_2$— in the ring skeleton thereof is referred to as a monocyclic group, and a group containing other ring structures is described as a polycyclic group regardless of the structure of the other rings. The —SO$_2$— containing cyclic group may be either a monocyclic group or a polycyclic group.

As the —SO$_2$— containing cyclic group as a cyclic hydrocarbon group for Ra$^{21}$, a cyclic group containing —O—SO$_2$— within the ring skeleton thereof, i.e., a cyclic group containing a sultone ring in which —O—S— within the —O—SO$_2$— group forms part of the ring skeleton thereof is particularly desirable. More specific examples of the —SO$_2$— containing cyclic group include groups represented by general formulas (a5-r-1) to (a5-r-4) shown below.

[Chemical Formula 28]

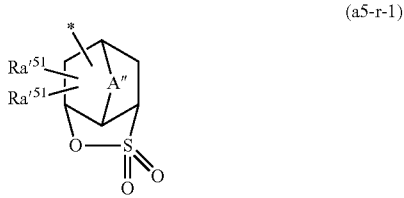

-continued (a5-r-2)
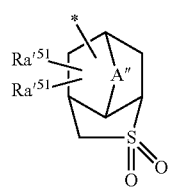

(a5-r-3)
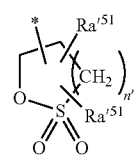

(a5-r-4)
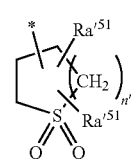

In the formulas, each $Ra'^{51}$ independently represents a hydrogen atom, an alkyl group, an alkoxy group, a halogen atom, a halogenated alkyl group, a hydroxy group, —COOR", —OC(=O)R", a hydroxyalkyl group or a cyano group; R" represents a hydrogen atom or an alkyl group; A" represents an oxygen atom, a sulfur atom or an alkylene group of 1 to 5 carbon atoms which may contain an oxygen atom or a sulfur atom; and n' represents an integer of 0 to 2.

In general formulas (a5-r-1) to (a5-r-4), A" is the same as defined for A" in general formulas (a2-r-1) to (a2-r-7). Examples of the alkyl group, alkoxy group, halogen atom, halogenated alkyl group, —COOR", —OC(=O)R" and hydroxyalkyl group for $Ra'^{51}$ include the same groups as those described above in the explanation of $Ra'^{21}$ in the general formulas (a2-r-1) to (a2-r-7).

Specific examples of the groups represented by the aforementioned general formulas (a5-r-1) to (a5-r-4) are shown below. In the formulas shown below, "Ac" represents an acetyl group.

[Chemical Formula 29]

(r-sl-1-1)
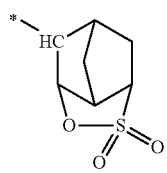

(r-sl-1-2)
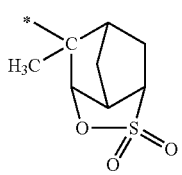

-continued (r-sl-1-3)
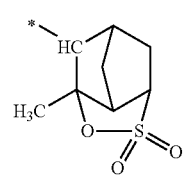

(r-sl-1-4)
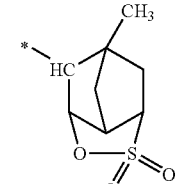

(r-sl-1-5)
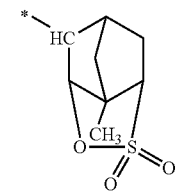

(r-sl-1-6)
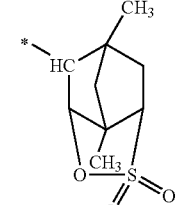

(r-sl-1-7)
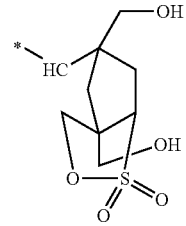

(r-sl-1-8)
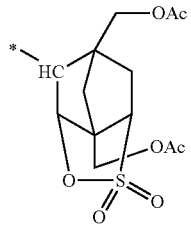

(r-sl-1-9)
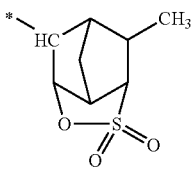

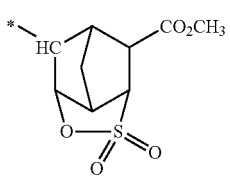 (r-sl-1-10)
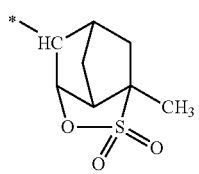 (r-sl-1-11)
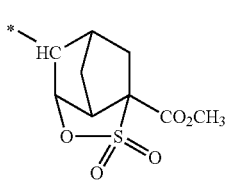 (r-sl-1-12)
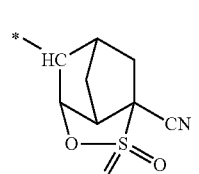 (r-sl-1-13)
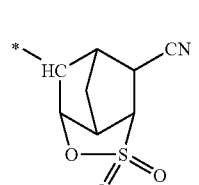 (r-sl-1-14)
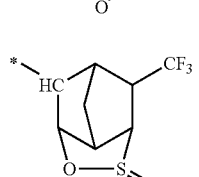 (r-sl-1-15)
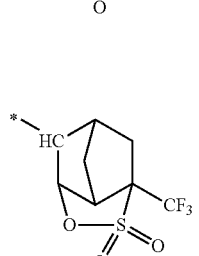 (r-sl-1-16)
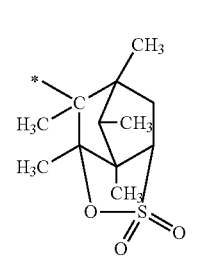 (r-sl-1-17)
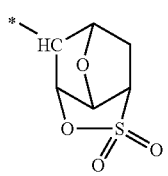 (r-sl-1-18)
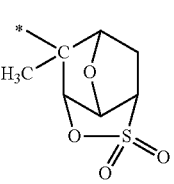 (r-sl-1-19)
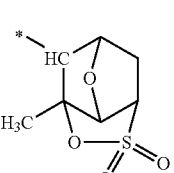 (r-sl-1-20)
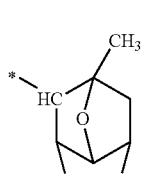 (r-sl-1-21)
[Chemical Formula 30]
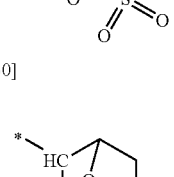 (r-sl-1-22)
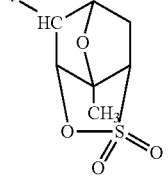 (r-sl-1-23)
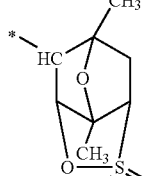 (r-sl-1-23)
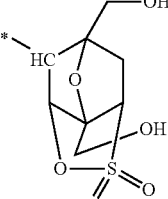 (r-sl-1-24)

-continued (r-sl-1-25) 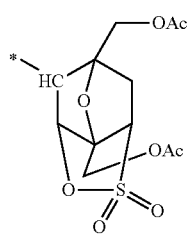

(r-sl-1-26) 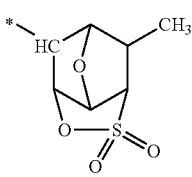

(r-sl-1-27) 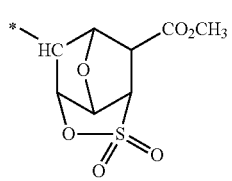

(r-sl-1-28) 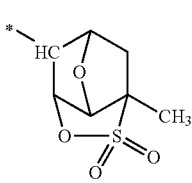

(r-sl-1-29) 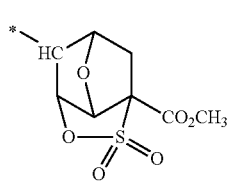

(r-sl-1-30) 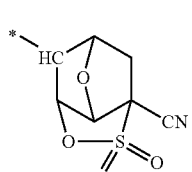

(r-sl-1-31) 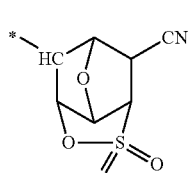

(r-sl-1-32) 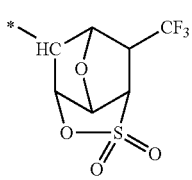

-continued (r-sl-1-33) 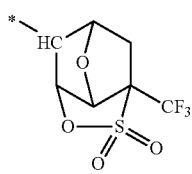

[Chemical Formula 31]

(r-sl-2-1) 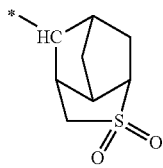

(r-sl-2-2) 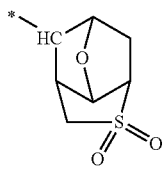

(r-sl-3-1) 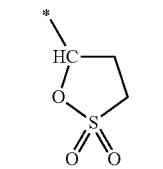

(r-sl-4-1) 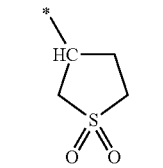

As the —$SO_2$— containing cyclic group, a group represented by the aforementioned general formula (a5-r-1) is preferable, at least one member selected from the group consisting of groups represented by the aforementioned chemical formulas (r-sl-1-1), (r-sl-1-18), (r-sl-3-1) and (r-sl-4-1) is more preferable, and a group represented by chemical formula (r-sl-1-1) is most preferable.

The term "carbonate-containing cyclic group" refers to a cyclic group including a ring containing a —O—C(=O)—O— structure (carbonate ring) in the ring skeleton thereof. The term "carbonate ring" refers to a single ring containing a —O—C(=O)—O— structure, and this ring is counted as the first ring. A carbonate-containing cyclic group in which the only ring structure is the carbonate ring is referred to as a monocyclic group, and groups containing other ring structures are described as polycyclic groups regardless of the structure of the other rings. The carbonate-containing cyclic group may be either a monocyclic group or a polycyclic group.

The carbonate-containing cyclic group for $Ra^{21}$ as a cyclic hydrocarbon group is not particularly limited, and an arbitrary structural unit may be used. Specific examples include groups represented by general formulas (ax3-r-1) to (ax3-r-3) shown below.

[Chemical Formula 32]

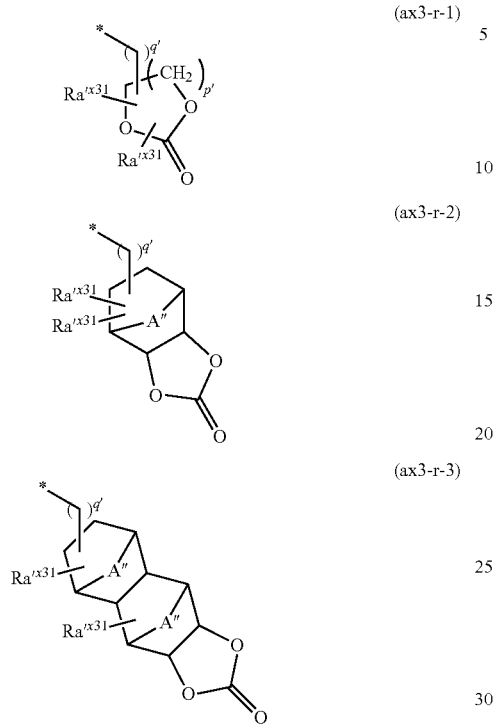

(ax3-r-1)

(ax3-r-2)

(ax3-r-3)

In the formulas, each $Ra'^{x31}$ independently represents a hydrogen atom, an alkyl group, an alkoxy group, a halogen atom, a halogenated alkyl group, a hydroxy group, —COOR", —OC(=O)R", a hydroxyalkyl group or a cyano group; R" represents a hydrogen atom or an alkyl group; A" represents an oxygen atom, a sulfur atom or an alkylene group of 1 to 5 carbon atoms which may contain an oxygen atom or a sulfur atom; p' represents an integer of 0 to 3; and q' represents 0 or 1.

In general formulas (ax3-r-1) to (ax3-r-3), A" is the same as defined for A" in general formula (a2-r-1).

Examples of the alkyl group, alkoxy group, halogen atom, halogenated alkyl group, —COOR", —OC(=O)R" and hydroxy alkyl group for $Ra'^{31}$ include the same groups as those exemplified for $Ra'^{21}$ in the formulas (a2-r-1) to (a2-r-7).

Specific examples of the groups represented by the aforementioned general formulas (ax3-r-1) to (ax3-r-3) are shown below.

[Chemical Formula 33]

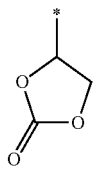

(r-cr-1-1)

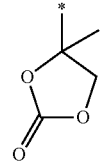

(r-cr-1-2)

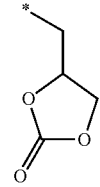

(r-cr-1-3)

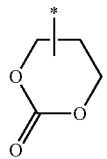

(r-cr-1-4)

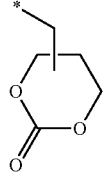

(r-cr-1-5)

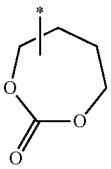

(r-dr-1-6)

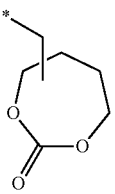

(r-cr-1-6)

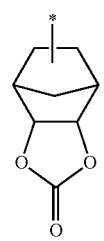

(r-cr-2-1)

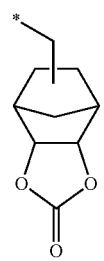

(r-cr-2-2)

(r-cr-2-3)
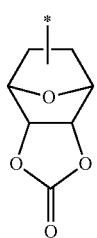

(r-cr-2-4)
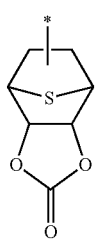

(r-cr-3-1)
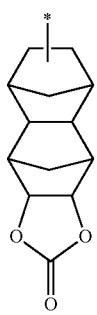

(r-cr-3-2)
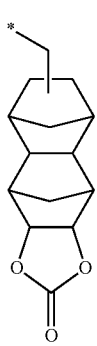

(r-cr-3-3)
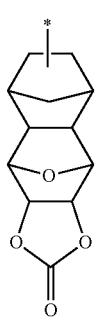

(r-cr-3-4)
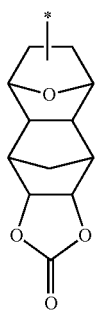

(r-cr-3-5)
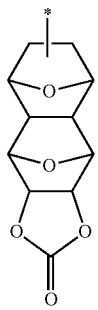

Among the examples shown above, a lactone-containing cyclic group or an —SO$_2$— containing cyclic group is preferable, a group represented by the general formula (a2-r-1), (a2-r-2) or (a5-r-1) is more preferable, and a group represented by any one of the chemical formulas (r-lc-1-1) to (r-lc-1-7), (r-lc-2-1) to (r-lc-2-13), (r-sl-1-1) and (r-sl-1-18) is still more preferable.

As the structural unit (a2) contained in the component (A1), 1 type of structural unit may be used, or 2 or more types may be used.

When the component (A1) contains the structural unit (a2), the amount of the structural unit (a2) based on the combined total of all structural units constituting the component (A1) is preferably 1 to 80 mol %, more preferably 5 to 70 mol %, still more preferably 10 to 65 mol %, and particularly preferably 10 to 60 mol %. When the amount of the structural unit (a2) is at least as large as the lower limit of the above-mentioned range, the effect of using the structural unit (a2) can be satisfactorily achieved. On the other hand, when the amount of the structural unit (a2) is no more than the upper limit of the above-mentioned range, a good balance can be achieved with the other structural units, and various lithography properties such as DOF and CDU and pattern shape can be improved.

(Structural Unit (a3))

The structural unit (a3) is a structural unit containing a polar group-containing aliphatic hydrocarbon group (provided that the structural units that fall under the definition of structural units (a1), (a0) and (a2) are excluded).

As the structural unit (a3), there is no particular limitation as long as it is a structural unit containing a polar group-containing aliphatic hydrocarbon group, and an arbitrary structural unit may be used.

The structural unit (a3) is preferably a structural unit derived from an acrylate ester which may have the hydrogen atom bonded to the carbon atom on the α-position substituted with a substituent and contains a polar group-containing aliphatic hydrocarbon group.

When the hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulae (a3-1), (a3-2) and (a3-3) shown below are preferable.

[Chemical Formula 34]

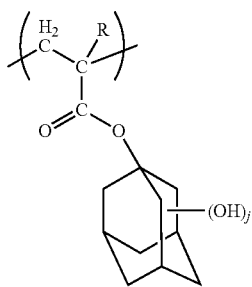

(a3-1)

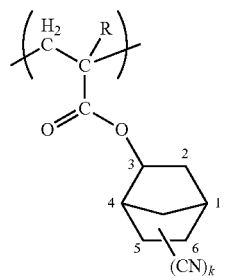

(a3-2)

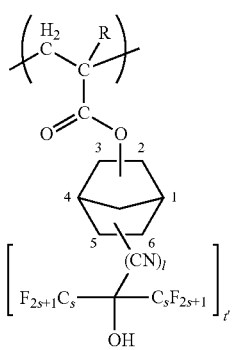

(a3-3)

In the formulae, R is as defined above; j is an integer of 1 to 3; k is an integer of 1 to 3; t' is an integer of 1 to 3; l is an integer of 1 to 5; and s is an integer of 1 to 3.

In formula (a3-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group.

j is preferably 1, and it is particularly desirable that the hydroxyl group be bonded to the 3rd position of the adamantyl group.

In formula (a3-2), k is preferably 1. The cyano group is preferably bonded to the 5th or 6th position of the norbornyl group.

In formula (a3-3), t' is preferably 1. l is preferably 1. s is preferably 1. Further, it is preferable that a 2-norbonyl group or 3-norbonyl group be bonded to the terminal of the carboxy group of the acrylic acid. The fluorinated alkyl alcohol is preferably bonded to the 5th or 6th position of the norbornyl group.

As the structural unit (a3) contained in the component (A1), 1 type of structural unit may be used, or 2 or more types may be used.

The amount of the structural unit (a3) within the component (A1) based on the combined total of all structural units constituting the component (A1) is preferably 5 to 50 mol %, more preferably 5 to 40 mol %, and still more preferably 5 to 25 mol %.

When the amount of the structural unit (a3) is at least as large as the lower limit of the above-mentioned range, the effect of using the structural unit (a3) can be satisfactorily achieved. On the other hand, when the amount of the structural unit (a3) is no more than the upper limit of the above-mentioned range, a good balance can be achieved with the other structural units.

(Structural Unit (a4))

The structural unit (a4) is a structural unit containing an acid non-dissociable cyclic group. When the component (A1)) includes the structural unit (a4), dry etching resistance of the resist pattern to be formed are improved. Further, the hydrophobicity of the component (A1) is further improved. Increase in the hydrophobicity contributes to improvement in terms of resolution, shape of the resist pattern and the like, particularly in an organic solvent developing process.

In the structural unit (a4), an "acid non-dissociable, aliphatic cyclic group" refers to a cyclic group which is not dissociated by the action of the acid generated from the component (A1) or component (B) upon exposure, and remains in the structural unit.

As the structural unit (a4), a structural unit which contains a non-acid-dissociable aliphatic cyclic group, and is also derived from an acrylate ester is preferable. Examples of this cyclic group include the same groups as those described above in relation to the aforementioned structural unit (a1), and any of the multitude of conventional groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecyl group, adamantyl group, tetracyclododecyl group, isobornyl group, and norbornyl group is particularly desirable. These polycyclic groups may be substituted with a linear or branched alkyl group of 1 to 5 carbon atoms.

Specific examples of the structural unit (a4) include units with structures represented by general formulas (a4-1) to (a4-7) shown below.

[Chemical Formula 35]

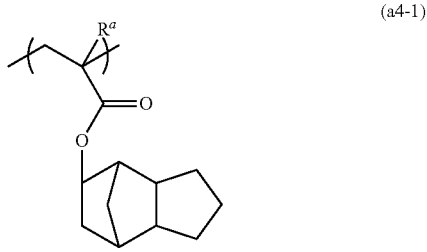

(a4-1)

-continued (a4-2)
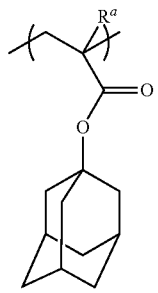

(a4-3)
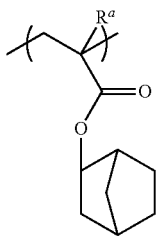

(a4-4)
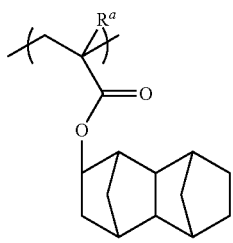

(a4-5)
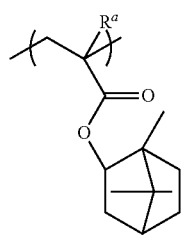

(a4-6)
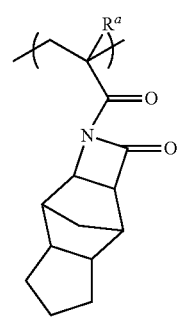

(a4-7)
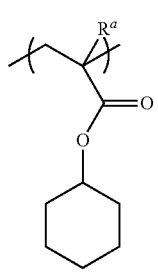

In the formulas shown above, $R^\alpha$ represents a hydrogen atom, a methyl group or a trifluoromethyl group.

As the structural unit (a4) contained in the component (A1), 1 type of structural unit may be used, or 2 or more types may be used.

When the structural unit (a4) is included in the component (A1), the amount of the structural unit (a4) based on the combined total of all the structural units that constitute the component (A1) is preferably within the range from 1 to 30 mol %, and more preferably from 10 to 20 mol %.

In the present invention, the component (A1) may also include a structural unit (a9). The structural unit (a9) is represented by general formula (a9-1) shown below.

[Chemical Formula 36]

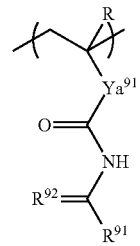

(a9-1)

In the formula, R is the same as defined above; $Ya^{91}$ represents a single bond or a divalent linking group; $R^{91}$ represents a hydrocarbon group which may have a substituent; and $R^{92}$ represents an oxygen atom or a sulfur atom.

In the formula (a9-1), the divalent linking group for $Ya^{91}$ is the same divalent linking group as those described above for $Ya^{21}$ in the formula (a2-1). $Ya^{91}$ is preferably a single bond.

In the formula (a9-1), as the hydrocarbon group for $R^{91}$, an alkyl group, a monovalent alicyclic hydrocarbon group, an aryl group and an aralkyl group can be mentioned.

The alkyl group for $R^{91}$ preferably has 1 to 8 carbon atoms, more preferably 1 to 6, and still more preferably 1 to 4, and may be either linear or branched. Specific examples include a methyl group, an ethyl group, a propyl group, a butyl group, a hexyl group and an octyl group.

The monovalent alicyclic hydrocarbon group for $R^{91}$ preferably has 3 to 20 carbon atoms and more preferably 3 to 12 carbon atoms, and may be either monocyclic or polycyclic. As the monocyclic alicyclic hydrocarbon group, a group in which one or more hydrogen atoms have been removed from a monocycloalkane is preferable. The monocycloalkane preferably has 3 to 6 carbon atoms, and specific examples thereof include cyclobutane, cyclopentane and cyclohexane. As the polycyclic alicyclic hydrocarbon group, a group in which one or more hydrogen atoms have been removed from a polycycloalkane is preferable, and the polycycloalkane preferably has 7 to 12 carbon atoms. Examples of the polycycloalkane include adamantane, norbornane, isobornane, tricyclodecane and tetracyclododecane.

The aryl group for $R^{91}$ preferably has 6 to 18 carbon atoms and more preferably 6 to 10 carbon atoms, and a phenyl group is particularly preferable.

Examples of the aralkyl group for $R^{91}$ include a group in which an alkylene group of 1 to 8 carbon atoms and the aforementioned "aryl group for $R^{91}$" are mutually bonded. An aralkyl group in which an alkylene group of 1 to 6 carbon atoms and the aforementioned "aryl group for $R^{91}$" are mutually bonded is preferable, and an aralkyl group in which an alkylene group of 1 to 4 carbon atoms and the aforementioned "aryl group for $R^{91}$" are mutually bonded is particularly preferable.

The hydrocarbon group for $R^{91}$ is preferably a group in which part or all of the hydrogen atoms within a hydrocarbon group has been substituted with a fluorine atom, and more preferably a group in which 30 to 100% of the hydrogen atoms within a hydrocarbon group have been substituted with fluorine atoms. Among these, a perfluoroalkyl group in which all of the hydrogen atoms within the alkyl group has been substituted with fluorine atoms is particularly preferable.

The hydrocarbon group for $R^{91}$ may have a substituent. Examples of the substituents include a halogen atom, an oxo group (=O), a hydroxy group (—OH), an amino group (—NH$_2$) and —SO$_2$—NH$_2$. In the hydrocarbon group, part of the carbon atoms constituting the hydrocarbon group may be substituted with a substituent containing a hetero atom. The substituent containing a hetero atom is preferably —O—, —NH—, —N=, —C(=O)—O—, —S—, —S(=O)$_2$—, or —S(=O)$_2$—O—

Examples of the hydrocarbon group for $R^{91}$ having a substituent include lactone-containing cyclic groups represented by the general formulas (a2-r-1) to (a2-r-7), —SO$_2$— containing cyclic groups represented by the formulas (a5-r-1) to (a5-r-4), a substituted aryl group and a monovalent heterocycles represented by chemical formulae shown below.

[Chemical Formula 37]

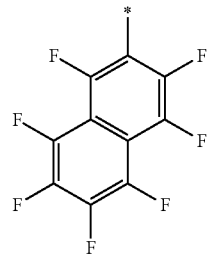 (r-ar-1)

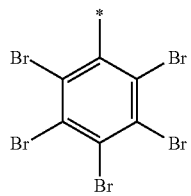 (r-ar-2)

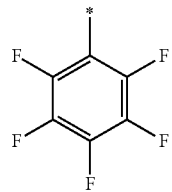 (r-ar-3)

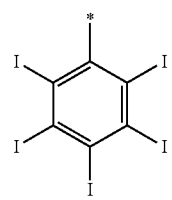 (r-ar-4)

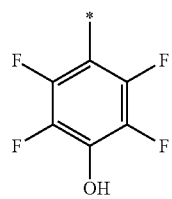 (r-ar-5)

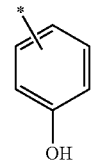 (r-ar-6)

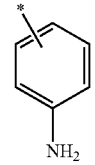 (r-ar-7)

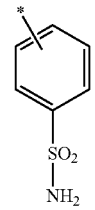 (r-ar-8)

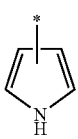 (r-hr-1)

 (r-hr-2)

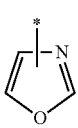 (r-hr-3)

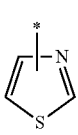 (r-hr-4)

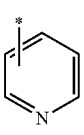 (r-hr-5)

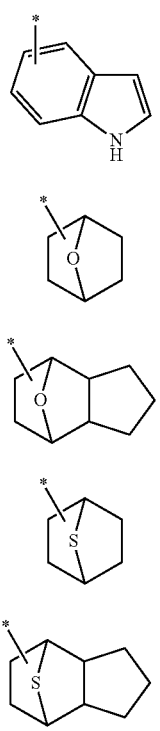

(r-hr-6)
(r-hr-7)
(r-hr-8)
(r-hr-9)
(r-hr-10)

Specific examples of structural units represented by the general formula (a9-1) are shown below. In the formulas shown below, $R^\alpha$ represents a hydrogen atom, a methyl group or a trifluoromethyl group.

[Chemical Formula 38]

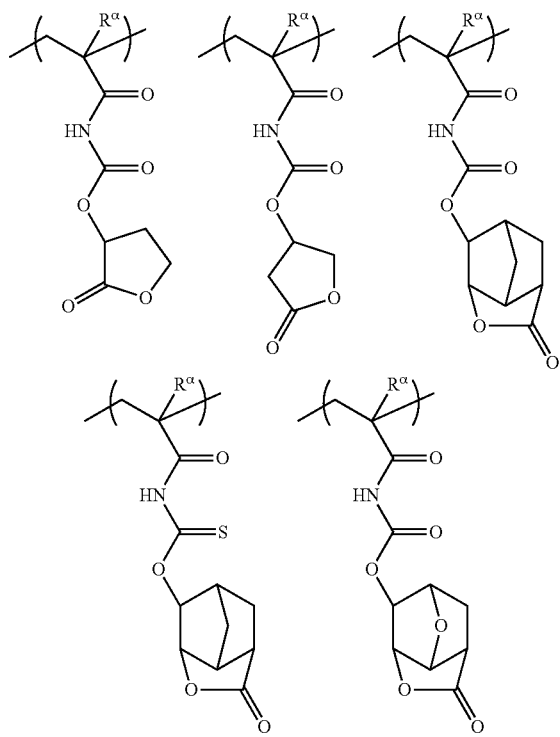

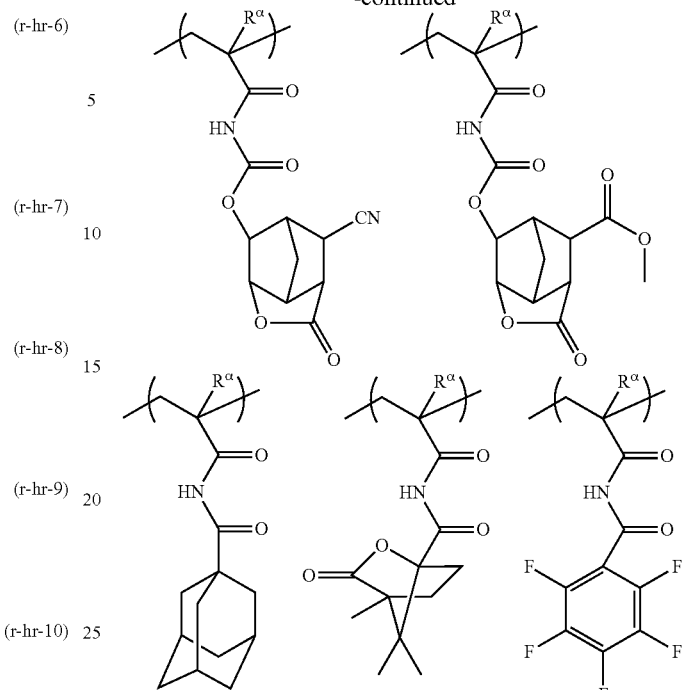

As the structural unit (a9) contained in the component (A1), 1 type of structural unit may be used, or 2 or more types may be used.

When the component (A1) includes the structural unit (a9), the amount of the structural unit (a9) based on the combined total of all structural units constituting the component (A1) is preferably 1 to 30 mol %, and more preferably 3 to 25 mol %. When the amount of the structural unit (a9) is at least as large as the lower limit of the above-mentioned range, various lithography properties such as development characteristics and EL margin are improved. On the other hand, when the amount of the structural unit (a9) is no more than the upper limit of the above-mentioned range, a good balance can be achieved with the other structural units.

In the present invention, the component (A1) may include a structural unit represented by general formula (a10-1) shown below (hereafter, referred to "structural unit (a10)").

By virtue of including the structural unit (a10), the solubility in an organic solvent becomes excellent, the solubility in an alkali developing solution is improved, and the etching resistance becomes excellent.

[Chemical Formula 39]

(a10-1)

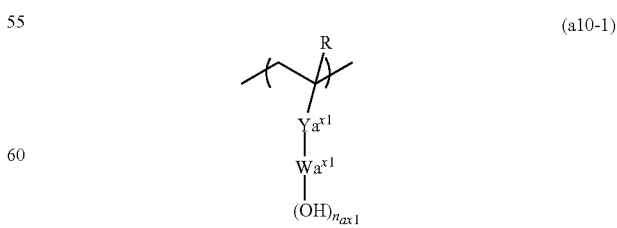

In the formula, R is the same as defined above; $Ya^{x1}$ represents a single bond or a divalent linking group; $Wa^{x1}$ represents an aromatic hydrocarbon group having a valency of ($n_{ax1}$+1); and $n_{ax1}$ represents an integer of 0 to 3, provided that, when $n_{ax1}$ is 0, $Ya^{x1}$ represents a divalent linking group containing a NH bond (—NH—).

In the formula (a10-1), the divalent linking group for $Ya^{x1}$ is the same divalent linking group as those described above for $Ya^{21}$ in the formula (a2-1).

The aromatic hydrocarbon group for $Wa^{x1}$ is a hydrocarbon group containing an aromatic ring, and the aromatic ring preferably has 5 to 30 carbon atoms, more preferably 5 to 20, still more preferably 6 to 15, and particularly preferably 6 to 12. Examples of the aromatic ring include aromatic hydrocarbon rings, such as benzene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom. Specific examples of the aromatic hetero ring include a pyridine ring and a thiophene ring.

Examples of aromatic hydrocarbon groups for $Wa^{x1}$ include a group in which ($n_{ax1}$) hydrogen atoms have been removed from the aromatic hydrocarbon ring or aromatic hetero ring exemplified as the aromatic ring.

$n_{ax1}$ represents an integer of 0 to 3, and preferably 0, 1 or 2.

Specific examples of structural units represented by general formulas (a10-1) are shown below. In the formulas shown below, $R^\alpha$ represents a hydrogen atom, a methyl group or a trifluoromethyl group.

[Chemical Formula 40]

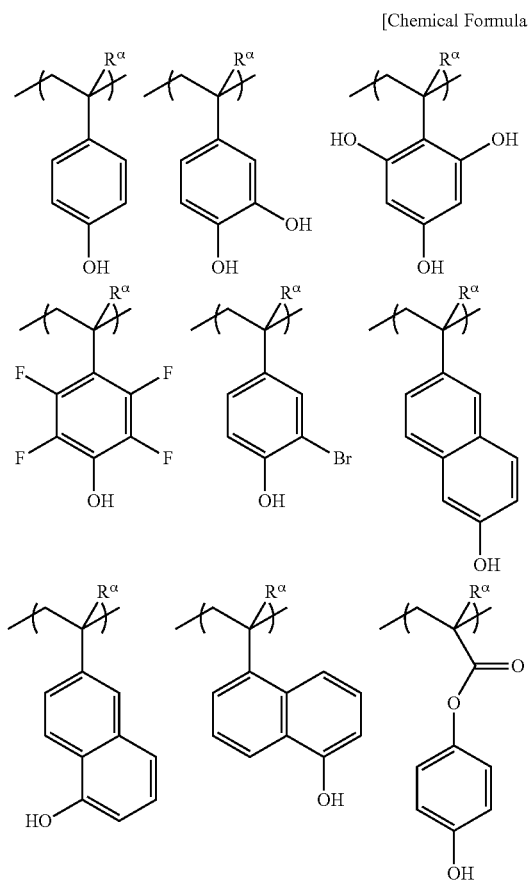

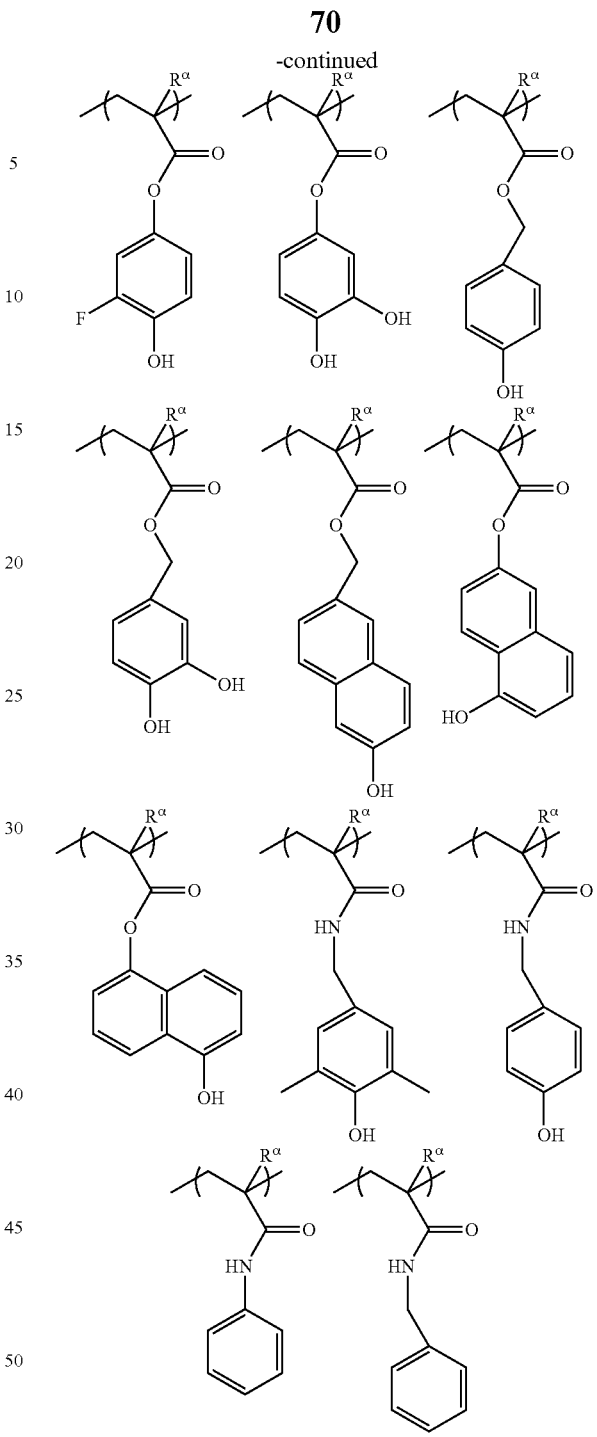

As the structural unit (a10) contained in the component (A1), 1 type of structural unit may be used, or 2 or more types may be used.

When the component (A1) includes the structural unit (a10), the amount of the structural unit (a10) based on the combined total of all structural units constituting the component (A1) is preferably 5 to 70 mol %, more preferably 10 to 65 mol %, and still more preferably 15 to 60 mol %.

When the amount of the structural unit (a10) is at least as large as the lower limit of the above-mentioned range, the effect of using the structural unit (a10) can be satisfactorily achieved. On the other hand, when the amount of the structural unit (a10) is no more than the upper limit of the above-mentioned range, a good balance can be achieved with the other structural units.

The component (A1) is preferably a copolymer containing the structural unit (a0). As the copolymer having the structural unit (a0), a copolymer further having any one of the structural units (a1), (a2), (a3), (a4), (a9) and (a10) is preferable; a copolymer having the structural unit (a1), a copolymer having the structural units (a1) and (a2), a copolymer having the structural units (a1) and (a3), a copolymer having the structural units (a1) and (a9), a copolymer having the structural units (a1) and (a10), and a copolymer having the structural units (a1), (a2) and (a3) are more preferable.

The weight average molecular weight (Mw) (the polystyrene equivalent value determined by gel permeation chromatography) of the component (A1) is not particularly limited, but is preferably 1,000 to 50,000, more preferably 1,500 to 30,000, and most preferably 2,000 to 20,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory.

Further, the dispersity (Mw/Mn) of the component (A1) is preferably 1.0 to 5.0, and more preferably 1.0 to 3.0.

As the component (A1), one type may be used alone, or two or more types may be used in combination.

In the base component (A), the amount of the component (A1) based on the total weight of the component (A) is preferably 25% by weight or more, more preferably 50% by weight or more, still more preferably 75% by weight or more, and may be even 100% by weight. When the amount of the component (A1) is 25% by weight or more, various lithography properties are improved, such as improvement in reduction of roughness.

In the resist composition of the present invention, as the component (A), one type may be used, or two or more types may be used in combination.

In the resist composition of the present invention, the amount of the component (A) can be appropriately adjusted depending on the thickness of the resist film to be formed, and the like.

[Optional Components]
<Acid Generator Component; Component (B)>

The resist composition of the present invention may further include an acid generator component (B) (hereafter, referred to as "component (B)") which generates acid upon exposure. As the component (B), there is no particular limitation, and any of the known acid generators used in conventional chemically amplified resist compositions can be used.

Examples of these acid generators are numerous, and include onium salt acid generators such as iodonium salts and sulfonium salts; oxime sulfonate acid generators; diazomethane acid generators such as bisalkyl or bisaryl sulfonyl diazomethanes and poly(bis-sulfonyl)diazomethanes; nitrobenzylsulfonate acid generators; iminosulfonate acid generators; and disulfone acid generators. Among these, onium salt acid generators are preferably used.

Examples of the onium salt acid generators include a compound represented by general formula (b-1) shown below (hereafter, sometimes referred to as "component (b-1)"), a compound represented by general formula (b-2) shown below (hereafter, sometimes referred to as "component (b-2)") and a compound represented by general formula (b-3) shown below (hereafter, sometimes referred to as "component (b-3)").

[Chemical Formula 41]

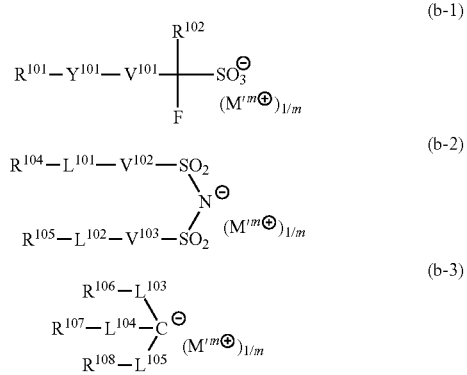

In the formulas, $R^{101}$ and $R^{104}$ to $R^{108}$ each independently represents a cyclic group which may have a substituent, a chain-like alkyl group which may have a substituent or a chain-like alkenyl group which may have a substituent, provided that, $R^{104}$ and $R^{105}$ may be mutually bonded to form a ring; provided that, two of $R^{106}$ to $R^{107}$ may be mutually bonded to form a ring; $R^{102}$ represents a fluorine atom or a fluorinated alkyl group of 1 to 5 carbon atoms; $Y^{101}$ represents a single bond or a divalent linking group containing an oxygen atom; $V^{101}$ to $V^{103}$ each independently represents a single bond, an alkylene group or a fluorinated alkylene group; $L^{101}$ to $L^{102}$ each independently represents a single bond or an oxygen atom; $L^{103}$ to $L^{105}$ each independently represents a single bond, —CO— or —SO$_2$—; and $M'^{m+}$ represents an organic cation having a valency of m.

{Anion Moiety}—Anion Moiety of Component (b-1)

In the formula (b-1), $R^{101}$ represents a cyclic group which may have a substituent, a chain-like alkyl group which may have a substituent or a chain-like alkenyl group which may have a substituent.

(Cyclic Group which May have a Substituent)

The cyclic group is preferably a cyclic hydrocarbon group, and the cyclic hydrocarbon group may be either an aromatic hydrocarbon group or an aliphatic hydrocarbon group.

As the aromatic hydrocarbon group for $R^{101}$, groups in which one hydrogen atom has been removed from an aromatic hydrocarbon ring described above in relation to the divalent aromatic hydrocarbon group for $Va^1$ in the formula (a1-1) or an aromatic compound containing two or more aromatic ring can be mentioned, and a phenyl group or a naphthyl group is preferable.

As the cyclic aliphatic hydrocarbon group for $R^{101}$, groups in which one hydrogen atom has been removed from a monocycloalkane or a polycycloalkane exemplified above in the explanation of the divalent aliphatic hydrocarbon group for $Va^1$ in the formula (a1-1) can be mentioned, and an adamantyl group or a norbornyl group is preferable.

Further, the cyclic hydrocarbon group for $R^{101}$ may contain a hetero atom like as a heterocycle, and specific examples thereof include lactone-containing cyclic groups represented by the aforementioned general formulas (a2-r-1) to (a2-r-7), —SO$_2$— containing cyclic groups represented by the aforementioned formulas (a5-r-1) to (a5-r-4) and heterocycles shown below.

[Chemical Formula 42]

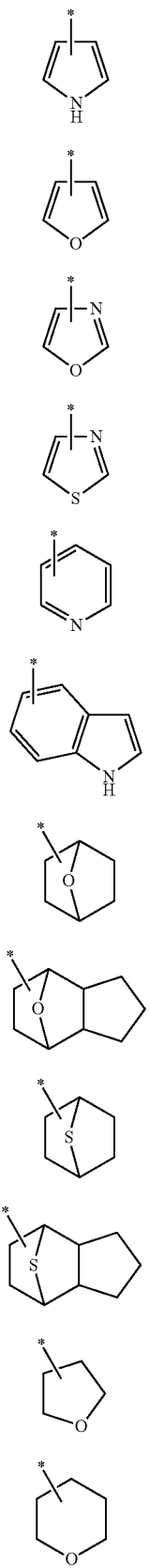

(r-hr-1)
(r-hr-2)
(r-hr-3)
(r-hr-4)
(r-hr-5)
(r-hr-6)
(r-hr-7)
(r-hr-8)
(r-hr-9)
(r-hr-10)
(r-hr-11)
(r-hr-12)

-continued

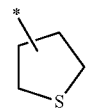
(r-hr-13)

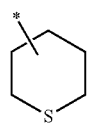
(r-hr-14)

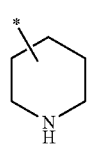
(r-hr-15)

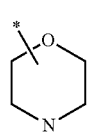
(r-hr-16)

As the substituent for substituting the cyclic hydrocarbon group for $R^{101}$, an alkyl group, an alkoxy group, a halogen atom, a halogenated alkyl group, a hydroxyl group, a carbonyl group, a nitro group or the like can be used.

The alkyl group as the substituent is preferably an alkyl group of 1 to 5 carbon atoms, and a methyl group, an ethyl group, a propyl group, an n-butyl group or a tert-butyl group is most desirable.

The alkoxy group as the substituent is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the halogen atom as the substituent include a fluorine atom, a chlorine atom, a bromine atom and an iodine atom, and a fluorine atom is preferable.

Example of the halogenated alkyl group as a substituent includes a group in which a part or all of the hydrogen atoms within an alkyl group of 1 to 5 carbon atoms such as a methyl group, an ethyl group, a propyl group, an n-butyl group or a tert-butyl group have been substituted with the aforementioned halogen atoms.

(Chain-Like Alkyl Group which May have a Substituent)

The chain-like alkyl group for $R^{101}$ may be either linear or branched.

The linear alkyl group preferably has 1 to 20 carbon atoms, more preferably 1 to 15, and most preferably 1 to 10. Specific examples include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched alkyl group preferably has 3 to 20 carbon atoms, more preferably 3 to 15, and most preferably 3 to 10. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

(Chain-Like Alkenyl Group which May have a Substituent)

The chain-like alkenyl group for $R^{101}$ may be linear or branched, and preferably has 2 to 10 carbon atoms, more preferably 2 to 5 carbon atoms, still more preferably 2 to 4 carbon atoms, and particularly preferably 3 carbon atoms. Examples of linear alkenyl groups include a vinyl group, a propenyl group (an allyl group) and a butynyl group. Examples of branched alkenyl groups include a 1-methylpropenyl group and a 2-methylpropenyl group.

Among the above-mentioned examples, as the chain-like alkenyl group, a propenyl group is particularly desirable.

As the substituent for substituting the chain-like alkyl group or alkenyl group for $R^{101}$, an alkoxy group, a halogen atom, a halogenated alkyl group, a hydroxyl group, a carbonyl group, a nitro group, an amino group, the same cyclic group as described above for $R^{101}$ or the like can be used.

Among these, as $R^{101}$, a cyclic group which may have a substituent is preferable, and a cyclic hydrocarbon group which may have a substituent is more preferable. Specific examples include a group in which one or more hydrogen atoms have been removed from a phenyl group, a naphthyl group or a polycycloalkane, lactone-containing cyclic groups represented by the aforementioned formulae (a2-r-1) to (a2-r-7) and —$SO_2$— containing cyclic groups represented by the aforementioned formulae (a5-r-1) to (a5-r-4) and the like.

In the formula (b-1), $Y^{101}$ represents a single bond or a divalent linking group containing an oxygen atom.

In the case where $Y^{101}$ is a divalent linking group containing an oxygen atom, $Y^{101}$ may contain an atom other than an oxygen atom. Examples of atoms other than an oxygen atom include a carbon atom, a hydrogen atom, a sulfur atom and a nitrogen atom.

Examples of divalent linkage groups containing an oxygen atom include non-hydrocarbon, oxygen atom-containing linking groups such as an oxygen atom (an ether bond; —O—), an ester bond (—C(=O)—O—), an oxycarbonyl group (—O—C(=O)—), an amide bond (—C(=O)—NH—), a carbonyl group (—C(=O)—) and a carbonate group (—O—C(=O)—O—); and a combination of any of the aforementioned non-hydrocarbon, oxygen atom-containing linking groups with an alkylene group. Furthermore, the combinations may have a sulfonyl group (—$SO_2$—) bonded thereto. As the combination, the linking groups represented by formulae (y-a1-1) to (y-a1-7) shown below can be mentioned.

[Chemical Formula 43]

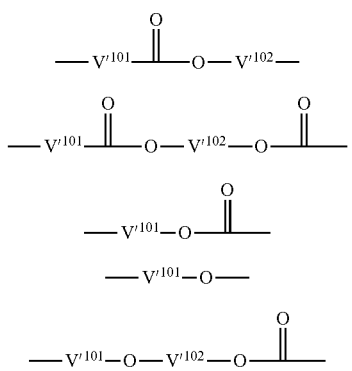

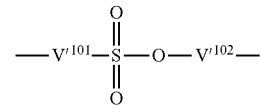

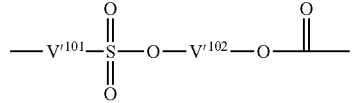

In the formulae, $V'^{101}$ represents a single bond or an alkylene group of 1 to 5 carbon atoms; and $V'^{102}$ represents a divalent saturated hydrocarbon group of 1 to 30 carbon atoms.

The divalent saturated hydrocarbon group for $V'^{102}$ is preferably an alkylene group of 1 to 30 carbon atoms.

As the alkylene group for $V'^{101}$ and $V'^{102}$, a linear alkylene group or a branched alkylene group can be used, and a linear alkylene group is preferable.

Specific examples of the alkylene group for $V'^{101}$ and $V'^{102}$ include a methylene group [—$CH_2$—]; alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)— and —C($CH_2CH_3$)$_2$—; an ethylene group [—$CH_2CH_2$—]; alkylethylene groups such as —CH($CH_3$)$CH_2$—, —CH($CH_3$)CH($CH_3$)—, —C($CH_3$)$_2CH_2$— and —CH($CH_2CH_3$)$CH_2$—; a trimethylene group (n-propylene group)[—$CH_2CH_2CH_2$—]; alkyltrimethylene groups such as —CH($CH_3$)$CH_2CH_2$— and —$CH_2$CH($CH_3$)$CH_2$—; a tetramethylene group [—$CH_2CH_2CH_2CH_2$—]; alkyltetramethylene groups such as —CH($CH_3$)$CH_2CH_2CH_2$— and —$CH_2$CH($CH_3$)$CH_2CH_2$—; and a pentamethylene group [—$CH_2CH_2CH_2CH_2CH_2$—].

Further, part of methylene group within the alkylene group for $V'^{101}$ and $V'^{102}$ may be substituted with a divalent aliphatic cyclic group of 5 to 10 carbon atoms. The aliphatic cyclic group is preferably a divalent group in which one hydrogen atom has been removed from the cyclic aliphatic hydrocarbon group described above for $Ra'^3$ in the aforementioned formula (a1-r-1), and a cyclohexylene group, 1,5-adamantylene group or 2,6-adamantylene group is more preferable.

$Y^{101}$ is preferably a divalent linking group containing an ether bond or an ester bond, and linking groups represented by the aforementioned formulas (y-a1-1) to (y-a1-5) are preferable.

In the formula (b-1), $V^{101}$ represents a single bond, an alkylene group or a fluorinated alkylene group. The alkylene group or fluorinated alkylene group for $V^{101}$ preferably has 1 to 4 carbon atoms. As the fluorinated alkylene group for $V^{101}$, a group in which part or all of the hydrogen atoms within the aforementioned alkylene group for $V^{101}$ has been substituted with fluorine atoms can be used. Among these, $V^{101}$ is preferably a single bond or a fluorinated alkylene group of 1 to 4 carbon atoms.

In the formula (b-1), $R^{102}$ represents a fluorine atom or a fluorinated alkyl group of 1 to 5 carbon atoms. $R^{102}$ is preferably a fluorine atom or a perfluoroalkyl group of 1 to 5 carbon atoms, and is more preferably a fluorine atom.

As specific examples of anion moieties of the formula (b-1),

When $Y^{101}$ is a single bond, fluorinated alkylsulfonate anions such as a trifluoromethanesulfonate anion or a perfluorobutanesulfonate anion can be mentioned; and when $Y^{101}$ is a divalent linking group containing an oxygen atom, anions represented by formulae (an-1) to (an-3) shown below can be mentioned.

[Chemical Formula 44]

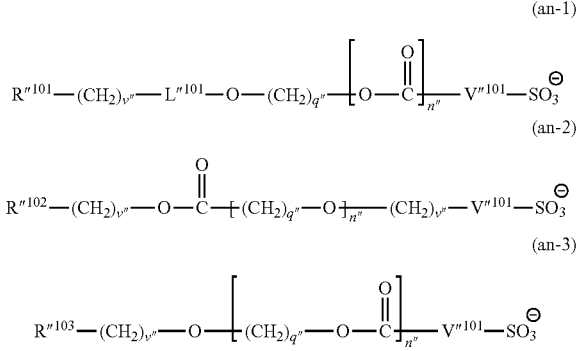

In the formulae, $R''^{101}$ represents an aliphatic cyclic group which may have a substituent, a group represented by any one of the aforementioned formulae (r-hr-1) to (r-hr-6) or a chain-like alkyl group which may have a substituent; $R''^{102}$ represents an aliphatic cyclic group which may have a substituent, a lactone-containing cyclic group represented by any one of the formulae (a2-r-1) to (a2-r-7) or an —$SO_2$— containing cyclic group represented by any one of the formulae (a5-r-1) to (a5-r-4); $R''^{103}$ represents an aromatic cyclic group which may have a substituent, an aliphatic cyclic group which may have a substituent or a chain-like alkenyl group which may have a substituent; $V''^{101}$ represents a fluorinated alkylene group; $L''^{101}$ represents —C(=O)— or —$SO_2$—; $v''$ each independently represents an integer of 0 to 3; $q''$ each independently represents an integer of 1 to 20; $n''$ represents 0 or 1.

As the aliphatic cyclic group for $R''^{101}$, $R''^{102}$ and $R''^{103}$ which may have a substituent, the same groups as the cyclic aliphatic hydrocarbon group for $R^{101}$ described above are preferable. As the substituent, the same groups as those described above for substituting the cyclic aliphatic hydrocarbon group for $R^{101}$ can be mentioned.

As the aromatic cyclic group for $R''^{103}$ which may have a substituent, the same groups as the aromatic hydrocarbon group exemplified as a cyclic hydrocarbon group for $R^{101}$ described above are preferable. As the substituent, the same groups as those described above for substituting the aromatic hydrocarbon group for $R^{101}$ can be mentioned.

As the chain-like alkyl group for $R''^{101}$ which may have a substituent, the same groups exemplified as the chain-like alkyl group for $R^{101}$ are preferable. As the chain-like alkenyl group for $R''^{103}$ which may have a substituent, the same groups exemplified as the chain-like alkenyl group for $R^{101}$ are preferable. $V''^{101}$ is preferably a fluorinated alkylene group of 1 to 3 carbon atoms, and particularly preferably —$CF_2$—, —$CF_2CF_2$—, —$CHFCF_2$—, —$CF(CF_3)CF_2$— or —$CH(CF_3)CF_2$—.

Anion Moiety of Component (b-2)

In formula (b-2), $R^{104}$ and $R^{105}$ each independently represents a cyclic group which may have a substituent, a chain-like alkyl group which may have a substituent or a chain-like alkenyl group which may have a substituent, and is the same groups as those defined above for $R^{101}$ in the aforementioned formula (b-1), provided that, $R^{104}$ and $R^{105}$ may be mutually bonded to form a ring.

As $R^{104}$ and $R^{105}$, a chain-like alkyl group which may have a substituent is preferable, and a linear or branched alkyl group or a linear or branched fluorinated alkyl group is more preferable.

The chain-like alkyl group preferably has 1 to 10 carbon atoms, preferably 1 to 7, and more preferably 1 to 3. The smaller the number of carbon atoms of the chain-like alkyl group for $R^{104}$ and $R^{105}$ within the above-mentioned range of the number of carbon atoms, the more the solubility in a resist solvent is improved. Further, in the chain-like alkyl group for $R^{104}$ and $R^{105}$, it is preferable that the number of hydrogen atoms substituted with fluorine atoms is as large as possible because the acid strength increases and the transparency to high energy radiation of 200 nm or less or electron beam is improved. The fluorination ratio of the chain-like alkyl group is preferably from 70 to 100%, more preferably from 90 to 100%, and it is particularly desirable that the chain-like alkyl group be a perfluoroalkyl group in which all hydrogen atoms are substituted with fluorine atoms.

In formula (b-2), $V^{102}$ and $V^{103}$ each independently represents a single bond, an alkylene group or a fluorinated alkylene group, and is the same groups as those defined above for $V^{101}$ in the aforementioned formula (b-1).

In the formula (b-2), $L^{101}$ and $L^{102}$ each independently represents a single bond or an oxygen atom.

Anion Moiety of Component (b-3)

In formula (b-3), $R^{106}$ to $R^{108}$ each independently represents a cyclic group which may have a substituent, a chain-like alkyl group which may have a substituent or a chain-like alkenyl group which may have a substituent, and is the same groups as those defined above for $R^{101}$ in the aforementioned formula (b-1).

$L^{103}$ to $L^{105}$ each independently represents a single bond, —CO— or —$SO_2$—.

{Cation Moiety}

In the formulas (b-1), (b-2) and (b-3), $M'^{m+}$ represents an organic cation having a valency of m. Among these, a sulfonium cation or an iodonium cation is preferable, and cation moieties represented by general formulae (ca-1) to (ca-4) shown below are particularly preferable.

[Chemical Formula 45]

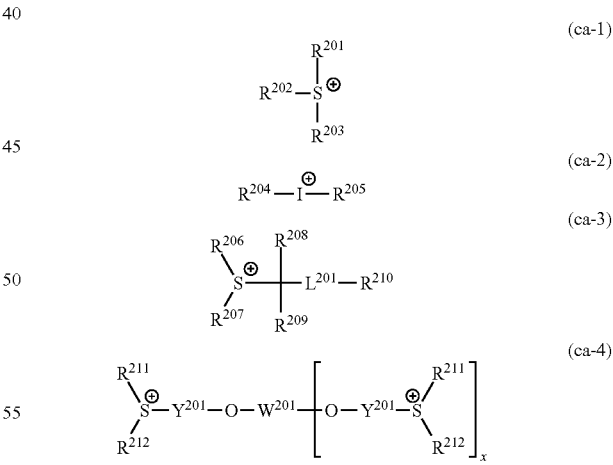

In the formulas, each of $R^{201}$ to $R^{207}$, $R^{211}$ and $R^{212}$ independently represents an aryl group which may have a substituent, an alkyl group which may have a substituent or an alkenyl group which may have a substituent; $R^{201}$ to $R^{203}$, $R^{206}$ to $R^{207}$, and $R^{211}$ to $R^{212}$ may be mutually bonded to form a ring with the sulfur atom; $R^{208}$ to $R^{209}$ each represents a hydrogen atom or an alkyl group of 1 to 5 carbon atoms; $R^{210}$ represents an aryl group which may have a substituent, an alkyl group which may have a substituent, an alkenyl group which may have a substituent or an —SO$_2$— containing cyclic group which may have a substituent; L$^{201}$ represents —C(=O)— or —C(=O)—O—; Y$^{201}$ each independently represents an arylene group, an alkylene group or an alkenylene group; x represents 1 or 2; and W$^{201}$ represents a linking group having a valency of (x+1).

As the aryl group for R$^{201}$ to R$^{207}$, R$^{211}$ and R$^{212}$, an unsubstituted aryl group of 6 to 20 carbon atoms can be mentioned, and a phenyl group or a naphthyl group is preferable.

As the alkyl group for R$^{201}$ to R$^{207}$, R$^{211}$ and R$^{212}$, a chain-like or cyclic alkyl group of 1 to 30 carbon atoms is preferable.

The alkenyl group for R$^{201}$ to R$^{207}$, R$^{211}$ and R$^{212}$ preferably has 2 to 10 carbon atoms.

Specific examples of the substituent which R$^{201}$ to R$^{207}$, R$^{210}$ and R$^{212}$ may have include an alkyl group, a halogen atom, a halogenated alkyl group, a carbonyl group, a cyano group, an amino group, an aryl group, an arylthio group and groups represented by formulas (ca-r-1) to (ca-r-7) shown below.

As the aryl group within the arylthio group as a substituent, the same aryl groups as those described above for R$^{101}$ can be mentioned, and specific examples thereof include a phenylthio group or a biphenylthio group.

[Chemical Formula 46]

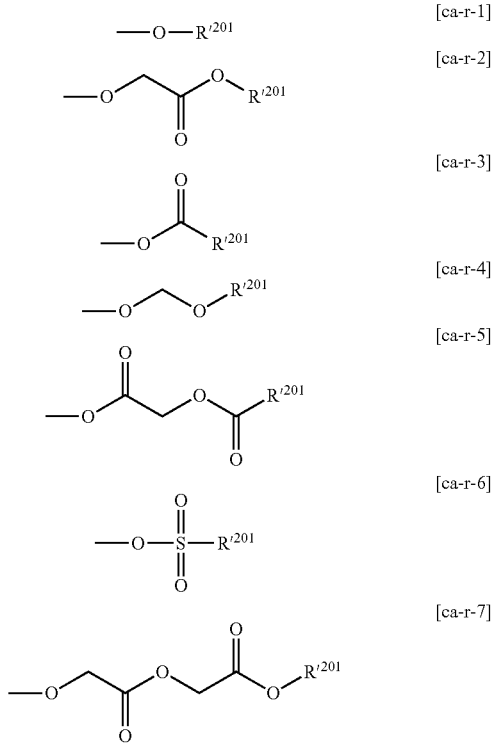

[ca-r-1]
[ca-r-2]
[ca-r-3]
[ca-r-4]
[ca-r-5]
[ca-r-6]
[ca-r-7]

In the formulae, R$'^{201}$ each independently represents a hydrogen atom, a cyclic group which may have a substituent, a chain-like alkyl group which may have a substituent or a chain-like alkenyl group which may have a substituent.

As the cyclic group which may have a substituent, the chain-like alkyl group which may have a substituent and the chain-like alkenyl group which may have a substituent for R$'^{201}$, the same groups as those described above for R$^{101}$ in the aforementioned formula (b-1) can be mentioned. As the cyclic group which may have a substituent and chain-like alkyl group which may have a substituent, the same groups as those described above for the acid dissociable group represented by the aforementioned formula (a1-r-2) can be also mentioned.

When R$^{201}$ to R$^{203}$, R$^{206}$ and R$^{207}$, and R$^{211}$ and R$^{212}$ are mutually bonded to form a ring with the sulfur atom, these groups may be mutually bonded via a hetero atom such as a sulfur atom, an oxygen atom or a nitrogen atom, or a functional group such as a carbonyl group, —SO—, —SO$_2$—, —SO$_3$—, —COO—, —CONH— or —N(R$_N$)— (wherein R$_N$ represents an alkyl group of 1 to 5 carbon atoms). As the ring to be formed, the ring containing the sulfur atom in the skeleton thereof is preferably a 3 to 10-membered ring, and particularly preferably a 5 to 7-membered ring. Examples of the formed ring include a thiophene ring, a thiazole ring, a benzothiophene ring, a thianthrene ring, a benzothiophene ring, a dibenzothiophene ring, a 9H-thioxanthene ring, a thioxanthone ring, a thianthrene ring, a phenoxathiin ring, a tetrahydrothiophenium ring and a tetrahydrothiopyranium ring.

R$^{208}$ and R$^{209}$ each independently represents a hydrogen atom or an alkyl group of 1 to 5 carbon atoms, is preferably a hydrogen atom or an alkyl group of 1 to 3 carbon atoms, and when R$^{208}$ and R$^{209}$ each represents an alkyl group, R$^{208}$ and R$^{209}$ may be mutually bonded to form a ring.

R$^{210}$ represents an aryl group which may have a substituent, an alkyl group which may have a substituent, an alkenyl group which may have a substituent or an —SO$_2$— containing cyclic group which may have a substituent.

As the aryl group for R$^{210}$, an unsubstituted aryl group of 6 to 20 carbon atoms can be mentioned, and a phenyl group or a naphthyl group is preferable.

As the alkyl group for R$^{210}$, a chain-like or cyclic alkyl group of 1 to 30 carbon atoms is preferable.

The alkenyl group for R$^{210}$ preferably has 2 to 10 carbon atoms.

As the —SO$_2$— containing cyclic group for R$^{210}$ which may have a substituent, the same groups as the "—SO$_2$— containing cyclic group" for Ra$^{21}$ in the general formula (a2-1) can be mentioned, and the group represented by the aforementioned general formula (a5-r-1) is preferable.

Y$^{201}$ each independently represents an arylene group, an alkylene group or an alkenylene group.

As the arylene group for Y$^{201}$, a group in which one hydrogen atom has been removed from an aryl group exemplified as an aromatic hydrocarbon group for R$^{101}$ in the aforementioned formula (b-1) can be mentioned.

As the alkylene group and the alkenylene group for Y$^{201}$, the same aliphatic hydrocarbon group as those described above for the divalent hydrocarbon group for Va$^1$ in the aforementioned general formula (a1-1) can be mentioned.

In the formula (ca-4), x represents 1 or 2.

W$^{201}$ represents a linking group having a valency of (x+1), that is, a divalent or trivalent linking group.

As the divalent linking group for W$^{201}$, a divalent hydrocarbon groups which may have a substituent is preferable, and as examples thereof, the same hydrocarbon group as those described above for Ya$^{21}$ in the general formula (a2-1) can be mentioned. The divalent linking group for W$^{201}$ may be linear, branched or cyclic, and cyclic is more preferable. Among these, an arylene group having two carbonyl groups, each bonded to the terminal thereof is preferable. As the arylene group, a phenylene group and a naphthylene group can be mentioned. Of these, a phenylene group is particularly desirable.

As the trivalent linking group for $W^{201}$, a group in which one hydrogen atom has been removed from the aforementioned divalent linking group for $W^{201}$, and a group in which the divalent linking group has been bonded to an another divalent linking group can be mentioned. The trivalent linking group for $W^{201}$ is preferably an arylene group having two carbonyl groups bonded thereto.

Specific examples of preferable cations represented by formula (ca-1) include cations represented by formulas (ca-1-1) to (ca-1-63) shown below.

[Chemical Formula 47]

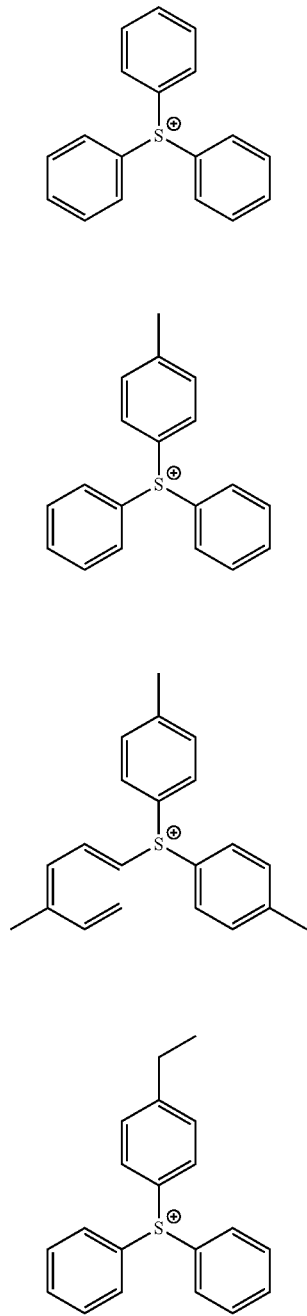

(ca-1-1)

(ca-1-2)

(ca-1-3)

(ca-1-4)

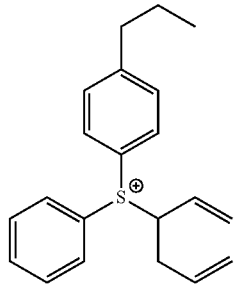

(ca-1-5)

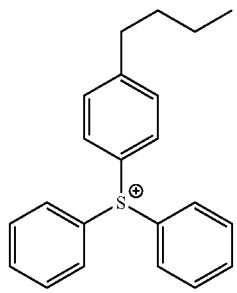

(ca-1-6)

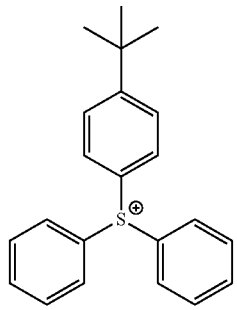

(ca-1-7)

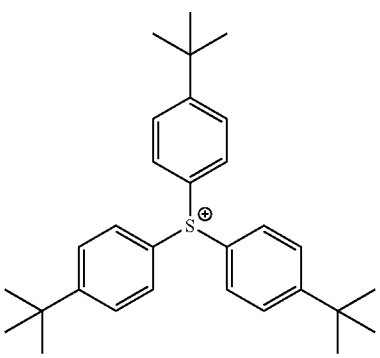

(ca-1-8)

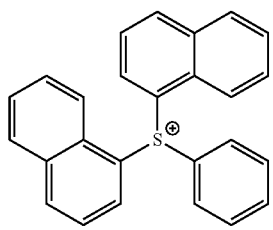

(ca-1-9)

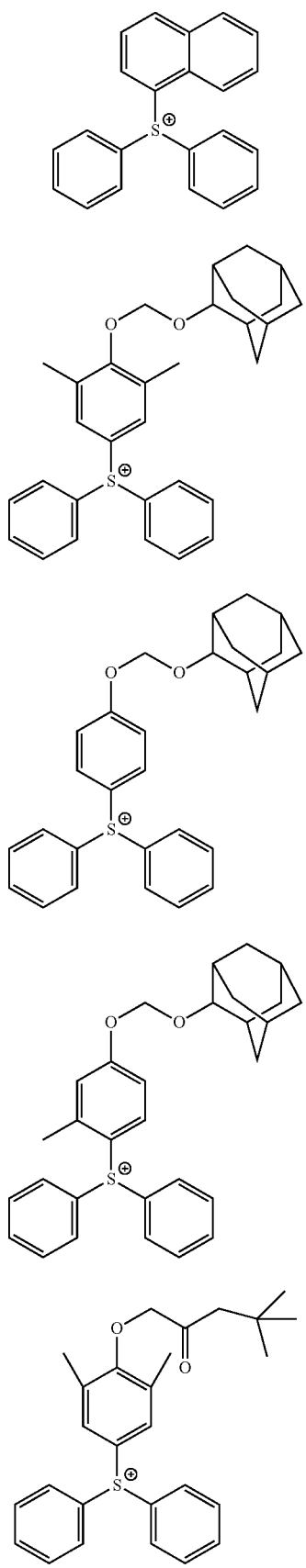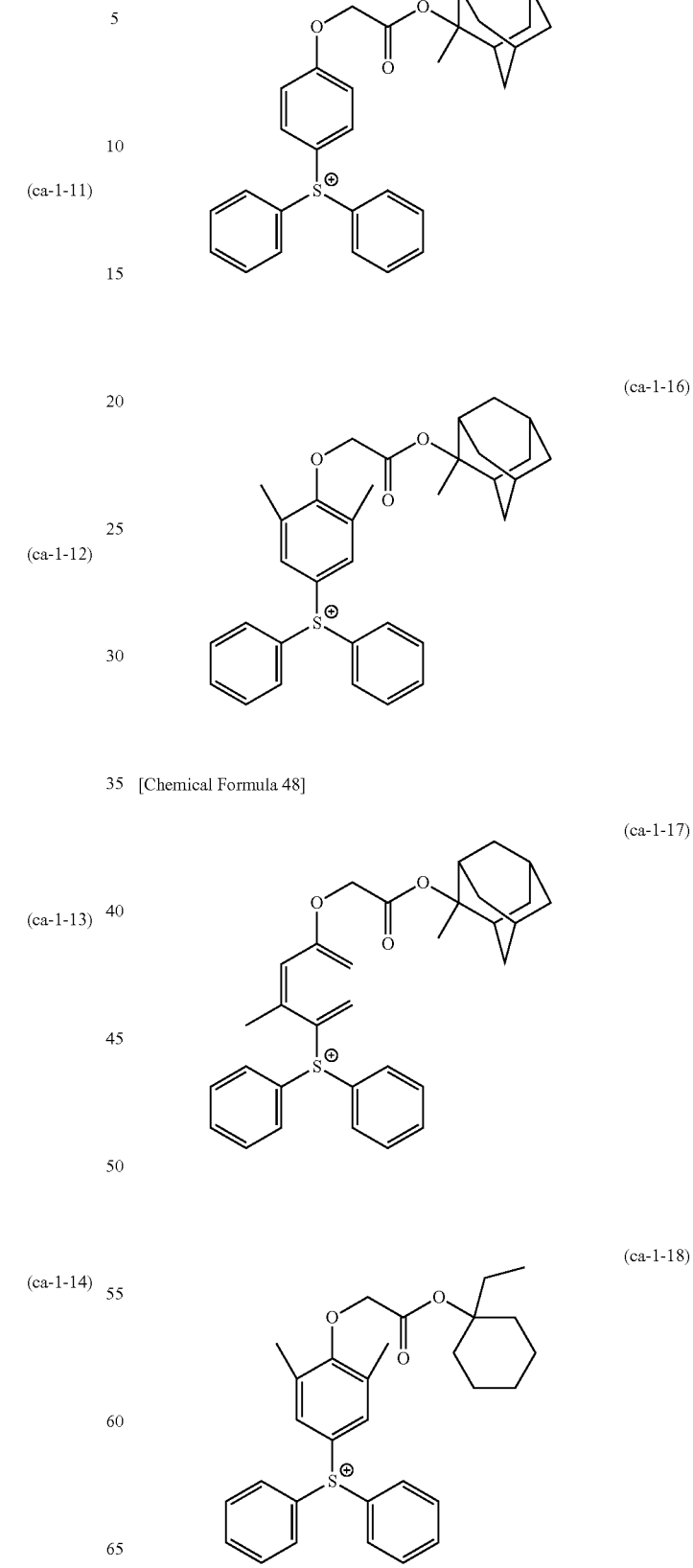

(ca-1-19)
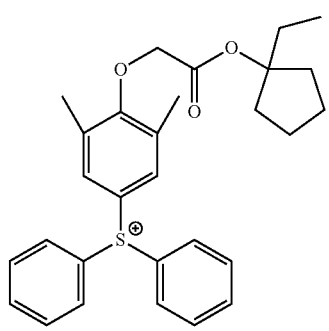
(ca-1-20)
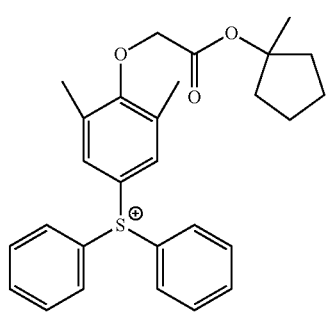
(ca-1-21)
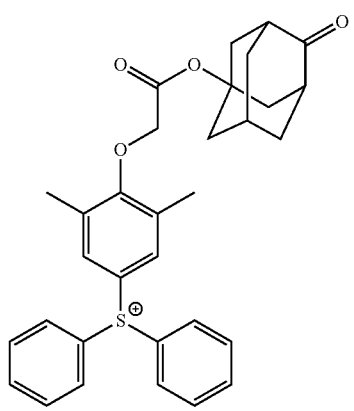
(ca-1-22)
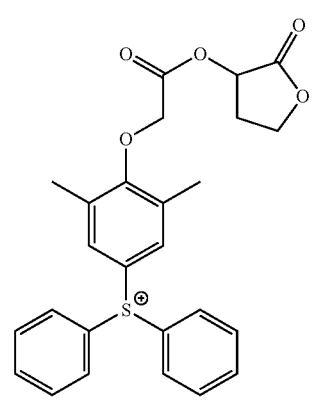
(ca-1-23)
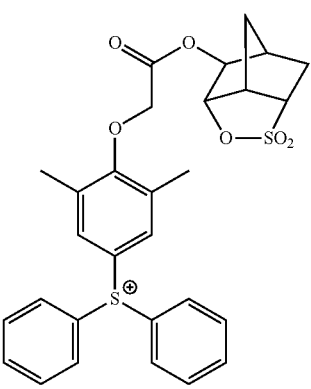
(ca-1-24)
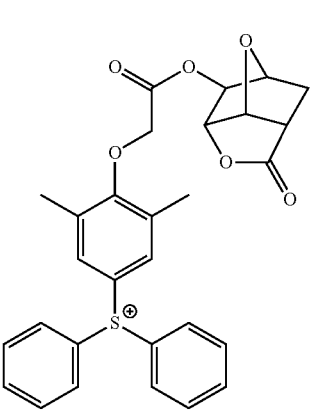
(ca-1-25)
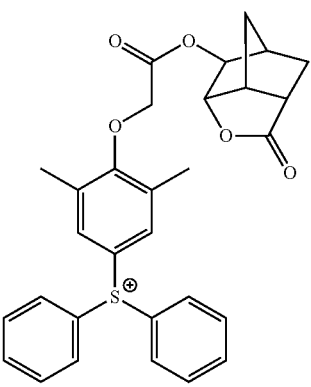
(ca-1-26)
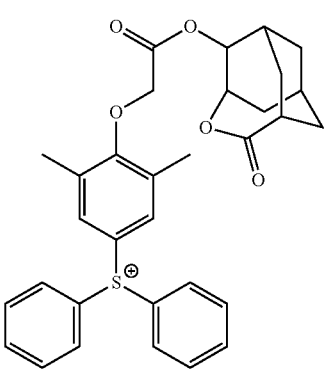

-continued
(ca-1-27)
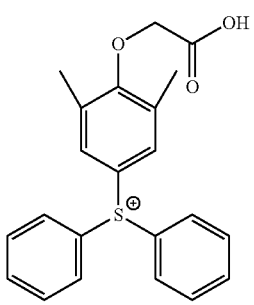
(ca-1-28)
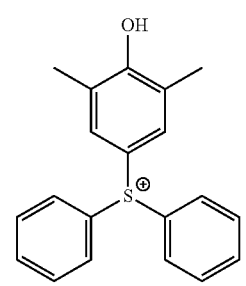
(ca-1-29)
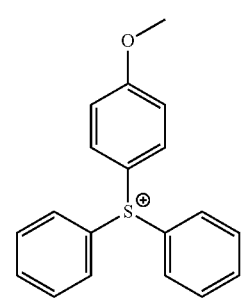
(ca-1-30)
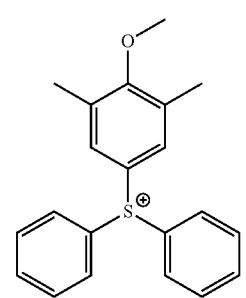
(ca-1-31)
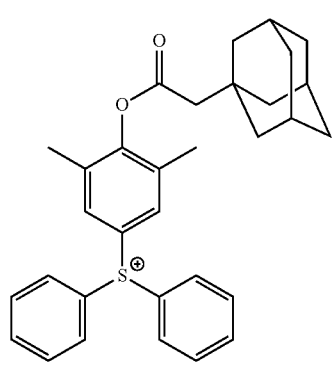
-continued
(ca-1-32)
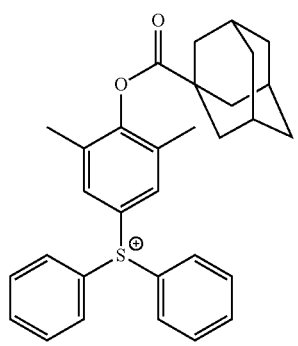
(ca-1-33)
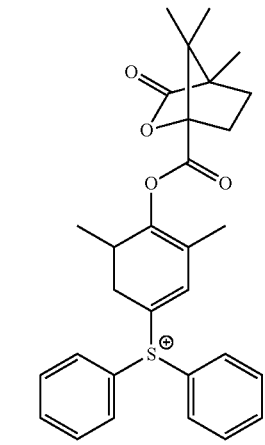
[Chemical Formula 49]
(ca-1-34)
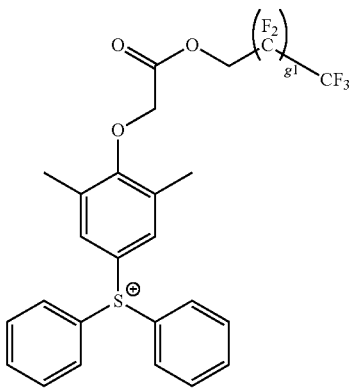
(ca-1-35)
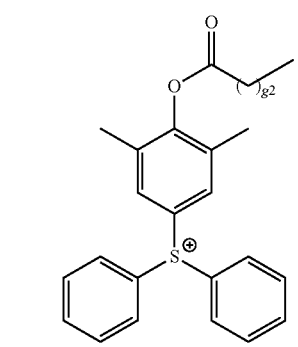

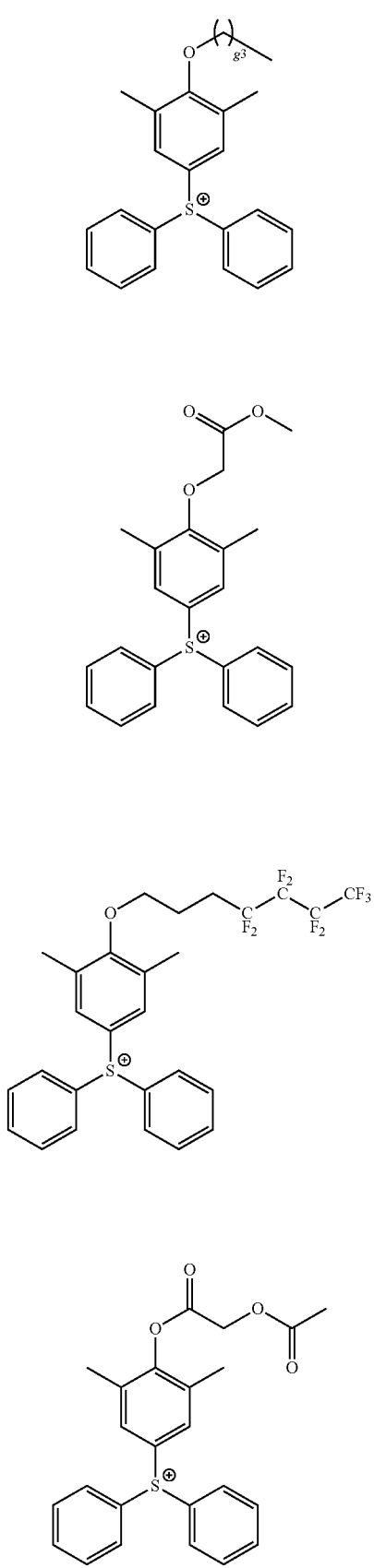
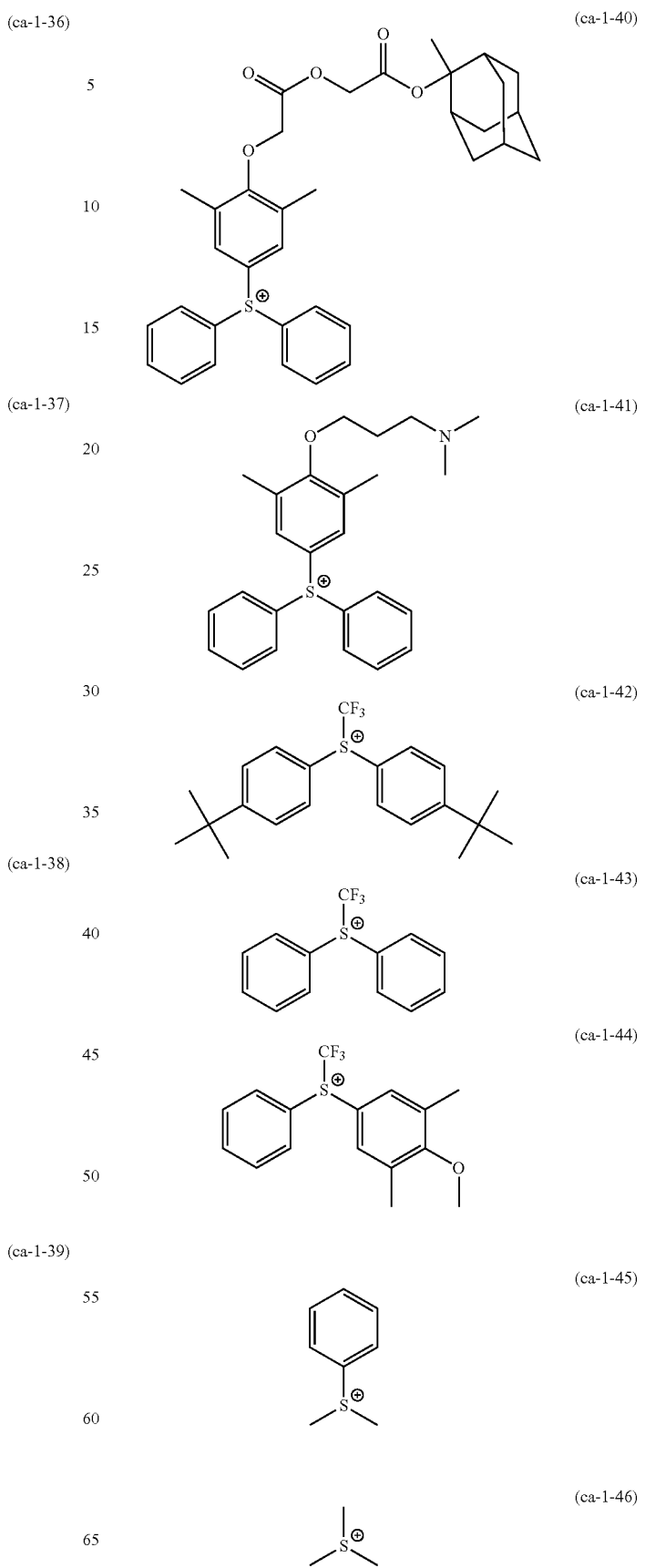

(ca-1-47)
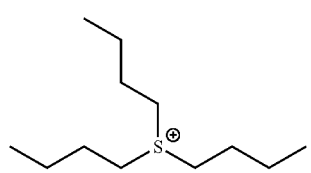
(ca-1-48)
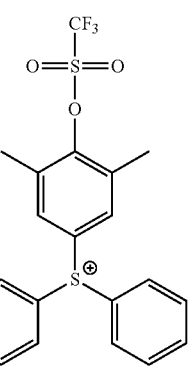
In the formulas, g1, g2 and g3 represent recurring numbers, wherein g1 is an integer of 1 to 5, g2 is an integer of 0 to 20, and g3 is an integer of 0 to 20.
[Chemical Formula 50]
(ca-1-49)
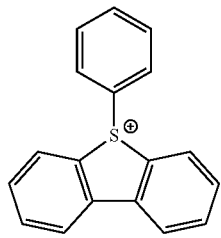
(ca-1-50)
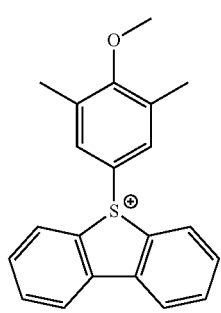
(ca-1-51)
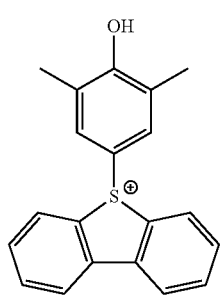
(ca-1-52)
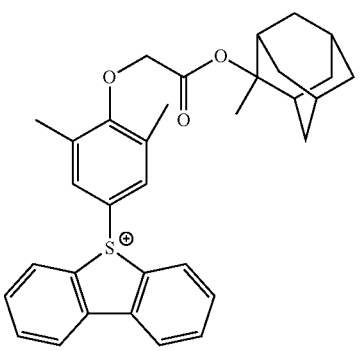
(ca-1-53)
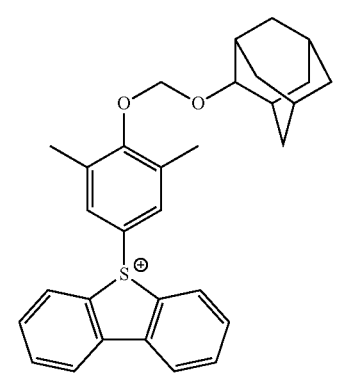
(ca-1-54)
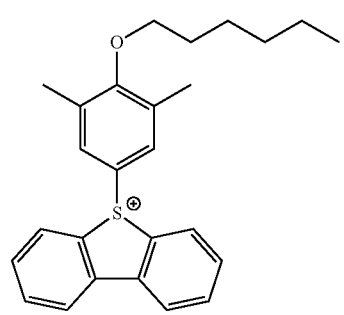
(ca-1-55)
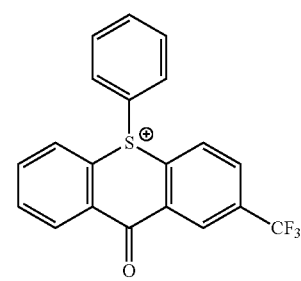
(ca-1-56)
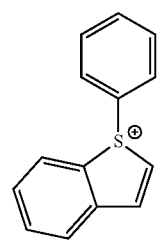

(ca-1-57)
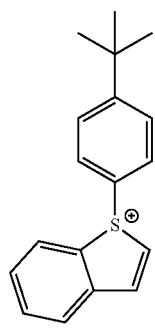

(ca-1-58)
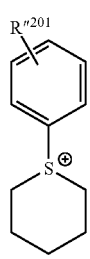

(ca-1-59)
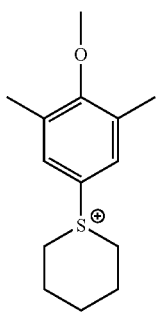

(ca-1-60)
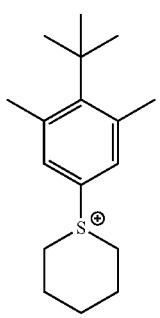

(ca-1-61)
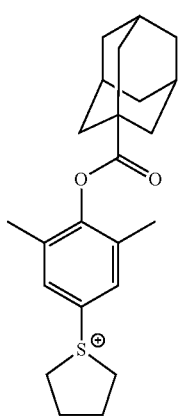

(ca-1-62)
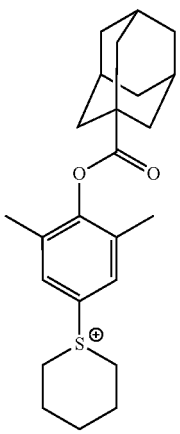

(ca-1-63)
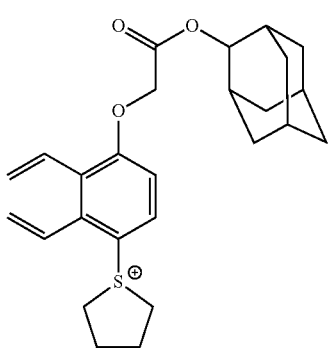

In the formulas, $R''^{201}$ represents a hydrogen atom or a substituent, and as the substituent, the same groups as those described above for substituting the $R^{201}$ to $R^{207}$ and $R^{210}$ to $R^{212}$ can be mentioned.

Specific examples of preferable cations represented by the formula (ca-3) include cations represented by formulae (ca-3-1) to (ca-3-6) shown below.

[Chemical Formula 51]

(ca-3-1)
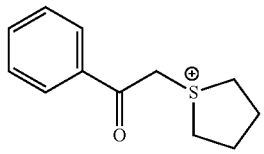

(ca-3-2)
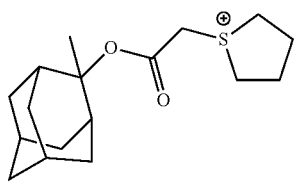

(ca-3-3)
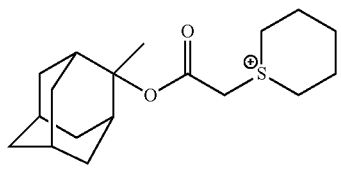

(ca-3-4)

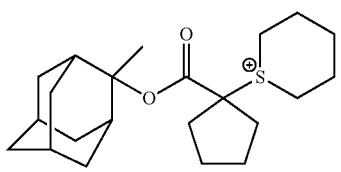

(ca-3-5)

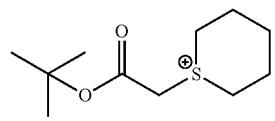

(ca-3-6)

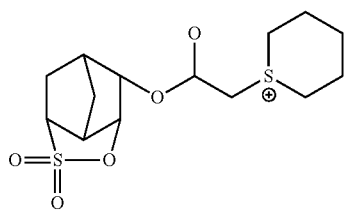

Specific examples of preferable cations represented by formula (ca-4) include cations represented by formulas (ca-4-1) to (ca-4-2) shown below.

[Chemical Formula 52]

(ca-4-1)

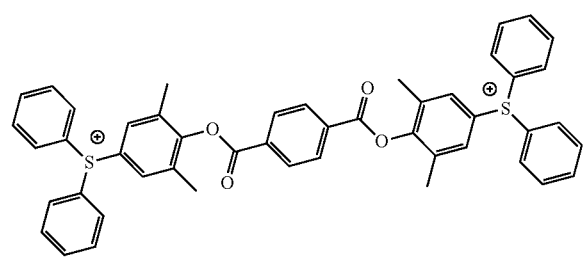

(ca-4-2)

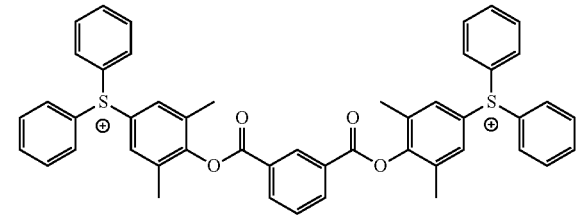

As the component (B), one type of these acid generators may be used alone, or two or more types may be used in combination.

When the resist composition of the present invention contains the component (B), the amount of the component (B) relative to 100 parts by weight of the component (A) is preferably within a range from 0.5 to 60 parts by weight, more preferably from 1 to 50 parts by weight, and still more preferably from 1 to 40 parts by weight. When the amount of the component (B) is within the above-mentioned range, formation of a resist pattern can be satisfactorily performed. Further, by virtue of the above-mentioned range, when each of the components are dissolved in an organic solvent, an uniform solution can be obtained and the storage stability becomes satisfactory.

<Acid Diffusion Control Agent Component; Component (D)>

Moreover, the resist composition of the present invention may include an acid diffusion control agent component (hereafter, frequently referred to as "component (D)"), in addition to the component (A), or in addition to the component (A) and the component (B).

The component (D) functions as an acid diffusion control agent, i.e., a quencher which traps the acid generated from the component (B) and the like upon exposure.

In the present invention, the component (D) may be a photodecomposable base (D1) (hereafter, referred to as "component (D1)") which is decomposed upon exposure and then loses the ability of controlling of acid diffusion, or a nitrogen-containing organic compound (D2) (hereafter, referred to as "component (D2)") which does not fall under the definition of component (D1).

[Component (D1)]

When a resist pattern is formed using a resist composition containing the component (D1), the contrast between exposed portions and unexposed portions is improved.

The component (D1) is not particularly limited, as long as it is decomposed upon exposure and then loses the ability of controlling of acid diffusion. As the component (D1), at least one compound selected from the group consisting of a compound represented by general formula (d1-1) shown below (hereafter, referred to as "component (d1-1)"), a compound represented by general formula (d1-2) shown below (hereafter, referred to as "component (d1-2)") and a compound represented by general formula (d1-3) shown below (hereafter, referred to as "component (d1-3)") is preferably used.

At exposed portions, the components (d1-1) to (d1-3) are decomposed and then lose the ability of controlling of acid diffusion (i.e., basicity), and therefore the components (d1-1) to (d1-3) cannot function as a quencher, whereas at unexposed portions, the components (d1-1) to (d1-3) function as a quencher.

[Chemical Formula 53]

(d1-1)

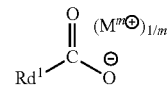

(d1-2)

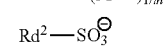
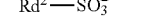

(d1-3)

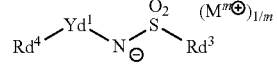

In the formulae, $Rd^1$ to $Rd^4$ represents a cyclic group which may have a substituent, a chain-like alkyl group which may have a substituent or a chain-like alkenyl group which may have a substituent; provided that, in the formula (d1-2), the carbon atom within the $Rd^2$ adjacent to the sulfur atom has no fluorine atom bonded thereto; $Yd^1$ represents a single bond or a divalent linking group; and $M^{m+}$ each independently represents an organic cation having a valency of m.

{Component (d1-1)}•Anion Moiety

In formula (d1-1), $Rd^1$ represents a cyclic group which may have a substituent, a chain-like alkyl group which may have a substituent or a chain-like alkenyl group which may have a substituent, and is the same groups as those defined above for $R^{101}$.

Among these, as the group for Rd¹, an aromatic hydrocarbon group which may have a substituent, an aliphatic cyclic group which may have a substituent and a chain-like hydrocarbon group which may have a substituent are preferable. As the substituents which these groups may have, a hydroxy group, a fluorine atom or a fluorinated alkyl group is preferable.

The aromatic hydrocarbon group is preferably a phenyl group or a naphthyl group.

Examples of the aliphatic cyclic group include groups in which one or more hydrogen atoms have been removed from a polycycloalkane such as adamantane, norbornane, isobornane, tricyclodecane or tetracyclododecane.

As the chain-like hydrocarbon group, a chain-like alkyl group is preferable. The chain-like alkyl group preferably has 1 to 10 carbon atoms, and specific examples thereof include a linear alkyl group such as a methyl group, an ethyl group, a propyl group, a butyl group, a pentyl group, a hexyl group, a heptyl group, an octyl group, a nonyl or a decyl group, and a branched alkyl group such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group or a 4-methylpentyl group.

When the chain-like alkyl group is a fluorinated alkyl group containing a fluorine atom or a fluorinated alkyl group as a substituent, the fluorinated alkyl group preferably has 1 to 11 carbon atoms, more preferably 1 to 8, and still more preferably 1 to 4. The fluorinated alkyl group may contain an atom other than fluorine. Examples of the atom other than fluorine include an oxygen atom, a carbon atom, a hydrogen atom, a sulfur atom and a nitrogen atom.

As for Rd¹, a fluorinated alkyl group in which part or all of the hydrogen atoms constituting a linear alkyl group have been substituted with fluorine atom(s) is preferable, and a fluorinated alkyl group in which all of the hydrogen atoms constituting a linear alkyl group have been substituted with fluorine atoms (i.e., a linear perfluoroalkyl group) is more preferable.

Specific examples of preferable anion moieties for the component (d1-1) are shown below.

[Chemical Formula 54]

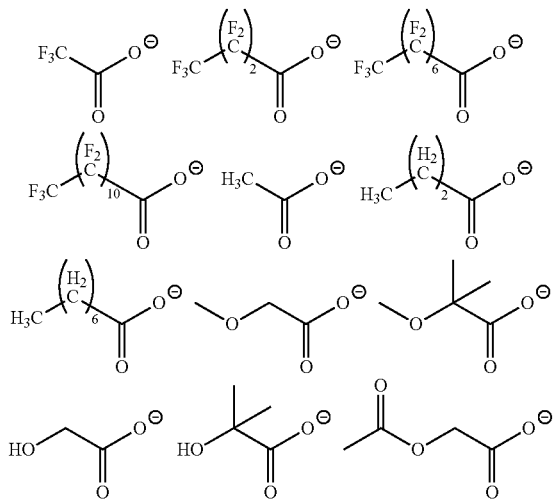

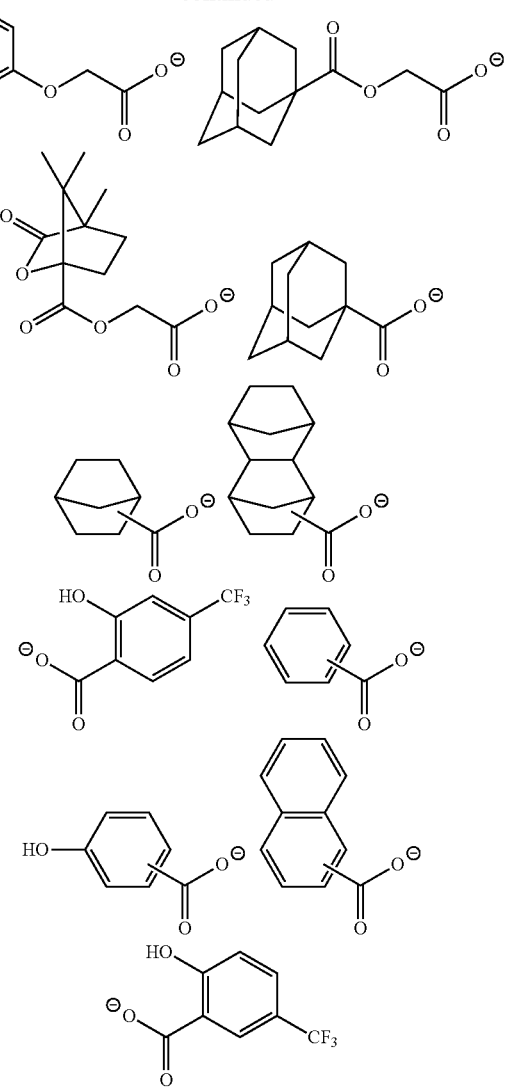

Cation Moiety

In formula (d1-1), $M^{m+}$ represents an organic cation having a valency of m.

The organic cation for $M^{m+}$ is not particularly limited, and examples thereof include the same cation moieties as those represented by the aforementioned formulas (ca-1) to (ca-4), and cation moieties represented by the aforementioned formulas (ca-1-1) to (ca-1-63) are preferable.

As the component (d1-1), one type of compound may be used, or two or more types of compounds may be used in combination.

{Component (d1-2)}•Anion Moiety

In formula (d1-2), Rd² represents a cyclic group which may have a substituent, a chain-like alkyl group which may have a substituent or a chain-like alkenyl group which may have a substituent, and is the same groups as those defined above for $R^{101}$.

provided that, the carbon atom within Rd² group adjacent to the sulfur atom has no fluorine atom bonded thereto (i.e., the carbon atom within Rd² group adjacent to the sulfur atom does not substituted with a fluorine atom). As a result, the anion of the component (d1-2) becomes an appropriately weak acid anion, thereby improving the quenching ability of the component (D).

As Rd², an aliphatic cyclic group which may have a substituent is preferable, and a group in which one or more hydrogen atoms have been removed from adamantane, norbornane, isobornane, tricyclodecane or tetracyclododecane (which may have a substituent); or a group in which one or more hydrogen atoms have been removed from camphor is more preferable.

The hydrocarbon group for Rd² may have a substituent. As the substituent, the same groups as those described above for substituting the hydrocarbon group (e.g., aromatic hydrocarbon group, aliphatic hydrocarbon group) for Rd¹ in the formula (d1-1) can be mentioned.

Specific examples of preferable anion moieties for the component (d1-2) are shown below.

[Chemical Formula 55]

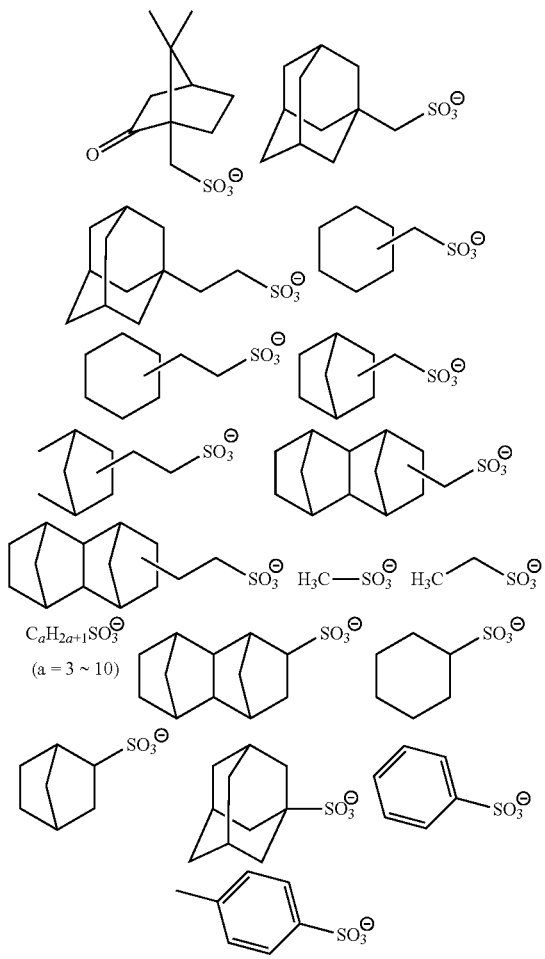

Cation Moiety

In formula (d1-2), $M^{m+}$ is an organic cation having a valency of m, and is the same as defined for $M^{m+}$ in the aforementioned formula (d1-1).

As the component (d1-2), one type of compound may be used, or two or more types of compounds may be used in combination.

{Component (d1-3)}•Anion moiety

In formula (d1-3), Rd³ represents a cyclic group which may have a substituent, a chain-like alkyl group which may have a substituent or a chain-like alkenyl group which may have a substituent, and is the same groups as those defined above for $R^{101}$, and a cyclic group containing a fluorine atom, a chain-like alkyl group or a chain-like alkenyl group is preferable. Among these, a fluorinated alkyl group is preferable, and more preferably the same fluorinated alkyl groups as those described above for Rd¹.

In formula (d1-3), Rd⁴ represents a cyclic group which may have a substituent, a chain-like alkyl group which may have a substituent or a chain-like alkenyl group which may have a substituent, and is the same groups as those defined above for $R^{101}$.

Among these, an alkyl group which may have substituent, an alkoxy group which may have substituent, an alkylene group which may have substituent or a cyclic group which may have substituent is preferable.

The alkyl group for Rd⁴ is preferably a linear or branched alkyl group of 1 to 5 carbon atoms, and specific examples include a methyl group, an ethyl group, a propyl group, an isopropyl group, an n-butyl group, an isobutyl group, a tert-butyl group, a pentyl group, an isopentyl group, and a neo-pentyl group. Part of the hydrogen atoms within the alkyl group for Rd⁴ may be substituted with a hydroxy group, a cyano group or the like.

The alkoxy group for Rd⁴ is preferably an alkoxy group of 1 to 5 carbon atoms, and specific examples thereof include a methoxy group, an ethoxy group, an n-propoxy group, an iso-propoxy group, an n-butoxy group and a tert-butoxy group. Among these, a methoxy group and an ethoxy group are desirable.

As the alkenyl group for Rd⁴, the same groups as those described above for $R^{101}$ can be mentioned, and a vinyl group, a propenyl group (an allyl group), a 1-methylpropenyl group and a 2-methylpropenyl group are preferable. These groups may have an alkyl group of 1 to 5 carbon atoms or a halogenated alkyl group of 1 to 5 carbon atoms as a substituent.

As the cyclic group for Rd⁴, the same groups as those described above for $R^{101}$ can be mentioned. Among these, as the cyclic group, an alicyclic group (e.g., a group in which one or more hydrogen atoms have been removed from a cycloalkane such as cyclopentane, cyclohexane, adamantane, norbornane, isobornane, tricyclodecane or tetracyclododecane) or an aromatic group (e.g., a phenyl group or a naphthyl group) is preferable. When Rd⁴ is an alicyclic group, the resist composition can be satisfactorily dissolved in an organic solvent, thereby improving the lithography properties. Alternatively, when Rd⁴ is an aromatic group, the resist composition exhibits an excellent photoabsorption efficiency in a lithography process using EUV or the like as the exposure source, thereby resulting in the improvement of the sensitivity and the lithography properties.

In formula (d1-3), Yd¹ represents a single bond or a divalent linking group.

The divalent linking group for Yd¹ is not particularly limited, and examples thereof include a divalent hydrocarbon group (aliphatic hydrocarbon group, or aromatic hydrocarbon group) which may have a substituent and a divalent linking group containing a hetero atom. As such groups, the same divalent linking groups as those described above for Ya²¹ in the formula (a2-1) can be mentioned.

As Yd¹, a carbonyl group, an ester bond, an amide bond, an alkylene group or a combination of these groups is preferable. As the alkylene group, a linear or branched alkylene group is more preferable, and a methylene group or an ethylene group is still more preferable.

Specific examples of preferable anion moieties for the component (d1-3) are shown below.
[Chemical Formula 56]
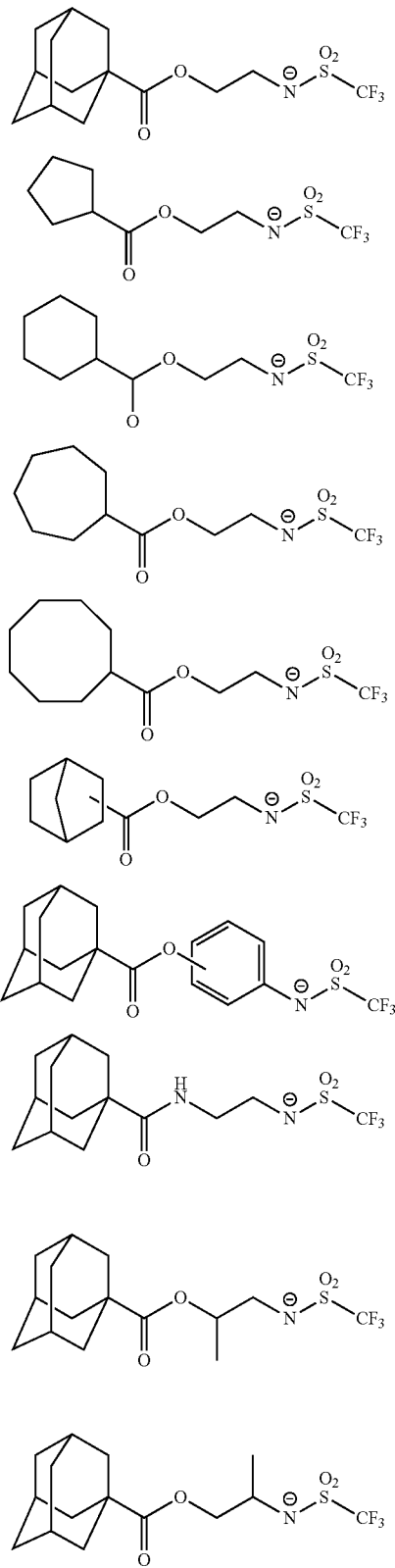
-continued
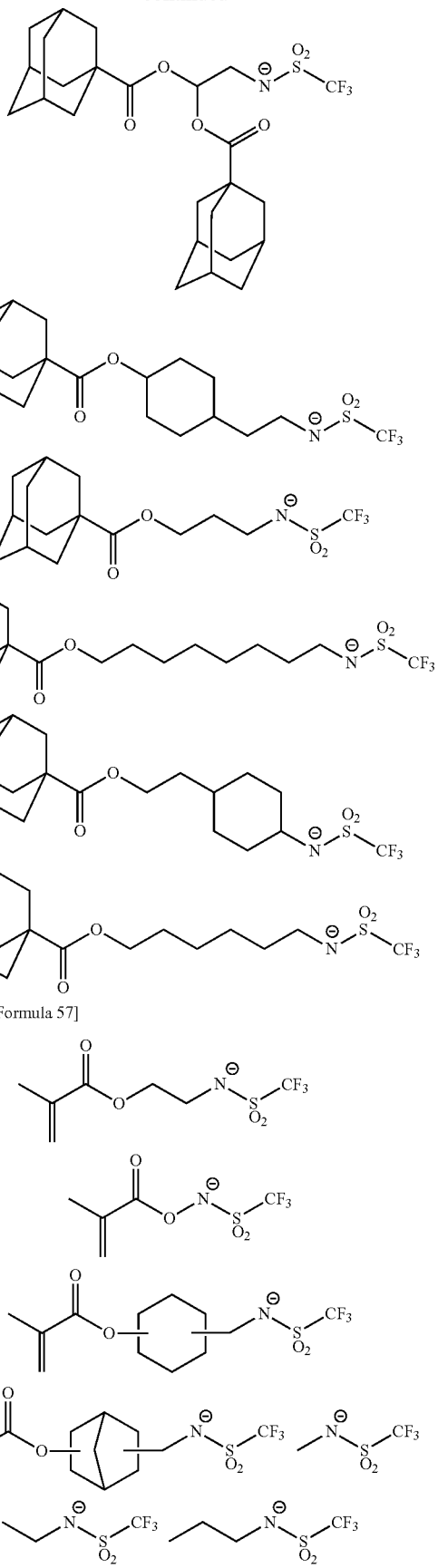
[Chemical Formula 57]

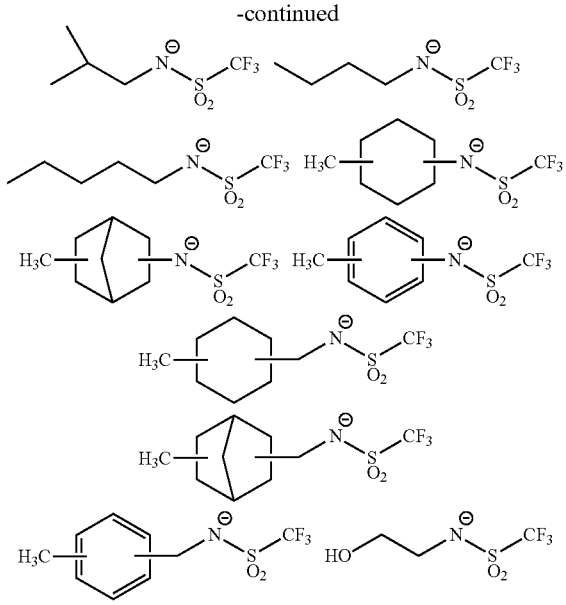

Cation Moiety

In formula (d1-3), $M^{m+}$ is an organic cation having a valency of m, and is the same as defined for $M^{m+}$ in the aforementioned formula (d1-1).

As the component (d1-3), one type of compound may be used, or two or more types of compounds may be used in combination.

As the component (D1), one type of the aforementioned components (d1-1) to (d1-3) can be used, or at least two types of the aforementioned components (d1-1) to (d1-3) can be used in combination.

The amount of the component (D1) relative to 100 parts by weight of the component (A) is preferably within a range from 0.5 to 10 parts by weight, more preferably from 0.5 to 8 parts by weight, and still more preferably from 1 to 8 parts by weight.

When the amount of the component (D1) is at least as large as the lower limit of the above-mentioned range, excellent lithography properties and excellent resist pattern shape can be obtained. On the other hand, when the amount of the component (D1) is no more than the upper limit of the above-mentioned range, sensitivity can be maintained at a satisfactory level, and through-put becomes excellent.

The production methods of the components (d1-1) and (d1-2) are not particularly limited, and the components (d1-1) and (d1-2) can be produced by conventional methods.

The amount of the component (D1) relative to 100 parts by weight of the component (A) is preferably within a range from 0.5 to 10.0 parts by weight, more preferably from 0.5 to 8.0 parts by weight, and still more preferably from 1.0 to 8.0 parts by weight. When the amount is at least as large as the lower limit of the above-mentioned range, excellent lithography properties and excellent resist pattern shape can be obtained. On the other hand, when the amount is no more than the upper limit of the above-mentioned range, sensitivity can be maintained at a satisfactory level, and through-put becomes excellent.

(Component (D2))

The component (D) may contain a nitrogen-containing organic compound (D2) (hereafter, referred to as component (D2)) which does not fall under the definition of component (D1).

The component (D2) is not particularly limited, as long as it functions as an acid diffusion control agent, and does not fall under the definition of the component (D1). As the component (D2), any of the conventionally known compounds may be selected for use. Among these, an aliphatic amine, particularly a secondary aliphatic amine or tertiary aliphatic amine is preferable.

An aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of no more than 12 carbon atoms (i.e., alkylamines or alkylalcoholamines), and cyclic amines.

Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decylamine, and tri-n-dodecylamine; and alkyl alcohol amines such as diethanolamine, triethanolamine, diisopropanolamine, triisopropanolamine, di-n-octanolamine, and tri-n-octanolamine. Among these, trialkylamines of 5 to 10 carbon atoms are preferable, and tri-n-pentylamine and tri-n-octylamine are particularly desirable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris {2-(2-methoxyethoxy)ethyl}amine, tris {2-(2-methoxyethoxymethoxy)ethyl}amine, tris {2-(1-methoxyethoxy)ethyl}amine, tris {2-(1-ethoxyethoxy)ethyl}amine, tris {2-(1-ethoxypropoxy)ethyl}amine, tris[2-{2-(2-hydroxyethoxy)ethoxy}ethyl]amine and triethanolamine triacetate, and triethanolamine triacetate is preferable.

Further, as the component (D2), an aromatic amine may be used.

Examples of aromatic amines include aniline, pyridine, 4-dimethylaminopyridine, pyrrole, indole, pyrazole, imidazole and derivatives thereof, as well as diphenylamine, triphenylamine, tribenzylamine, 2,6-diisopropylaniline and N-tert-butoxycarbonylpyrrolidine.

As the component (D2), one type of compound may be used alone, or two or more types may be used in combination.

The component (D2) is typically used in an amount within a range from 0.01 to 5.0 parts by weight, relative to 100 parts by weight of the component (A). When the amount of the component (D2) is within the above-mentioned range, the shape of the resist pattern and the post exposure stability of the latent image formed by the pattern-wise exposure of the resist layer are improved.

As the component (D), one type of compound may be used, or two or more types of compounds may be used in combination.

When the resist composition of the present invention contains the component (D), the amount of the component (D) relative to 100 parts by weight of the component (A) is preferably within a range from 0.1 to 15 parts by weight, more preferably from 0.3 to 12 parts by weight, and still more preferably from 0.5 to 12 parts by weight. When the amount of the component (D) is at least as large as the lower limit of the above-mentioned range, various lithography properties (such as LWR) of the resist composition are improved. Further, a resist pattern having an excellent shape can be obtained. On the other hand, when the amount is no more than the upper limit of the above-mentioned range, sensitivity can be maintained at a satisfactory level, and through-put becomes excellent.

<Optional Components>

[Component (E)]

Furthermore, in the resist composition of the present invention, for preventing any deterioration in sensitivity, and improving the resist pattern shape and the post exposure stability of the latent image formed by the pattern-wise exposure of the resist layer, at least one compound (E) (hereafter referred to as the component (E)) selected from the group consisting of an organic carboxylic acid, or a phosphorus oxo acid or derivative thereof can be added.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid and phosphinic acid. Among these, phosphonic acid is particularly desirable.

Examples of phosphorous oxo acid derivatives include esters in which a hydrogen atom within the above-mentioned phosphorous oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phenylphosphinic acid and phosphinic acid esters.

As the component (E), one type may be used alone, or two or more types may be used in combination.

The component (E) is typically used in an amount within a range from 0.01 to 5.0 parts by weight, relative to 100 parts by weight of the component (A).

[Component (F)]

In the present invention, the resist composition may further include a fluorine additive (hereafter, referred to as "component (F)") for imparting water repellency to the resist film.

As the component (F), for example, a fluorine-containing polymeric compound described in Japanese Unexamined Patent Application, First Publication No. 2010-002870, Japanese Unexamined Patent Application, First Publication No. 2010-032994, Japanese Unexamined Patent Application, First Publication No. 2010-277043, Japanese Unexamined Patent Application, First Publication No. 2011-13569, and Japanese Unexamined Patent Application, First Publication No. 2011-128226 can be used.

Specific examples of the component (F) include polymers having a structural unit (f1) represented by general formula (f1-1) shown below. As the polymer, a polymer (homopolymer) consisting of a structural unit (f1) represented by formula (f1-1) shown below; a copolymer of a structural unit (f1) represented by formula (1'1-1) shown below and the aforementioned structural unit (a1); and a copolymer of a structural unit (f1) represented by the formula (f1-1) shown below, a structural unit derived from acrylic acid or methacrylic acid and the aforementioned structural unit (a1) are preferable. As the structural unit (a1) to be copolymerized with a structural unit (f1) represented by formula (f1-1) shown below, a structural unit derived from 1-ethyl-1-cyclooctyl(meth)acrylate or a structural unit represented by the aforementioned formula (a1-2-01) is preferable.

[Chemical Formula 58]

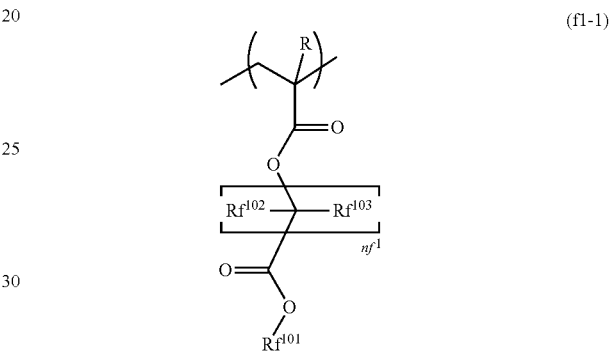

(f1-1)

In the formula, R is the same as defined above; $Rf^{102}$ and $Rf^{103}$ each independently represents a hydrogen atom, a halogen atom, an alkyl group of 1 to 5 carbon atoms, or a halogenated alkyl group of 1 to 5 carbon atoms, provided that $Rf^{102}$ and $Rf^{103}$ may be the same or different; $nf^1$ represents an integer of 1 to 5; and $Rf^{101}$ represents an organic group containing a fluorine atom.

In formula (f1-1), R is the same as defined above. As R, a hydrogen atom or a methyl group is preferable.

In formula (f1-1), examples of the halogen atom for $Rf^{102}$ and $Rf^{103}$ include a fluorine atom, a chlorine atom, a bromine atom and an iodine atom, and a fluorine atom is particularly desirable. Examples of the alkyl group of 1 to 5 carbon atoms for $Rf^{102}$ and $Rf^{103}$ include the same alkyl group of 1 to 5 carbon atoms as those described above for R, and a methyl group or an ethyl group is preferable. Specific examples of the halogenated alkyl group of 1 to 5 carbon atoms represented by $Rf^{102}$ and $Rf^{103}$ include groups in which part or all of the hydrogen atoms of the aforementioned alkyl groups of 1 to 5 carbon atoms have been substituted with halogen atoms. Examples of the halogen atom include a fluorine atom, a chlorine atom, a bromine atom and an iodine atom, and a fluorine atom is particularly desirable. Among these, as $Rf^{102}$ and $Rf^{103}$, a hydrogen atom, a fluorine atom or an alkyl group of 1 to 5 carbon atoms is preferable, and a hydrogen atom, a fluorine atom, a methyl group or an ethyl group is more preferable.

In formula (f1-1), $nf^1$ represents an integer of 1 to 5, preferably an integer of 1 to 3, and more preferably 1 or 2.

In formula (f1-1), $Rf^{101}$ represents an organic group containing a fluorine atom, and is preferably a hydrocarbon group containing a fluorine atom.

The hydrocarbon group containing a fluorine atom may be linear, branched or cyclic, and preferably has 1 to 20 carbon atoms, more preferably 1 to 15 carbon atoms, and most preferably 1 to 10 carbon atoms.

It is preferable that the hydrocarbon group having a fluorine atom has 25% or more of the hydrogen atoms within the hydrocarbon group fluorinated, more preferably 50% or more, and most preferably 60% or more, as the hydrophobicity of the resist film during immersion exposure is enhanced.

Among these, as $Rf^{101}$, a fluorinated hydrocarbon group of 1 to 5 carbon atoms is preferable, and a trifluoromethyl group, —$CH_2$—$CF_3$, —$CH_2$—$CF_2$—$CF_3$, —$CH(CF_3)_2$, —$CH_2$—$CH_2$—$CF_3$ and —$CH_2$—$CH_2$—$CF_2$—$CF_2$—$CF_2$—$CF_3$ are most preferable.

The weight average molecular weight (Mw) (the polystyrene equivalent value determined by gel permeation chromatography) of the component (F) is preferably 1,000 to 50,000, more preferably 5,000 to 40,000, and most preferably 10,000 to 30,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory.

Further, the dispersity (Mw/Mn) of the component (F) is preferably 1.0 to 5.0, more preferably 1.0 to 3.0, and most preferably 1.2 to 2.5.

As the component (F), one type may be used alone, or two or more types may be used in combination.

The component (F) is typically used in an amount within a range from 0.5 to 10 parts by weight, relative to 100 parts by weight of the component (A).

If desired, other miscible additives can also be added to the resist composition of the present invention. Examples of such miscible additives include additive resins for improving the performance of the resist film, dissolution inhibitors, plasticizers, stabilizers, colorants, halation prevention agents, and dyes.

[Component (S)]

The resist composition of the present invention can be prepared by dissolving the materials for the resist composition in an organic solvent (hereafter, frequently referred to as "component (S)").

The component (S) may be any organic solvent which can dissolve the respective components to give a uniform solution, and one or more kinds of any organic solvent can be appropriately selected from those which have been conventionally known as solvents for a chemically amplified resist.

Examples thereof include lactones such as γ-butyrolactone; ketones such as acetone, methyl ethyl ketone (MEK), cyclohexanone, methyl-n-pentyl ketone (2-heptanone), and methyl isopentyl ketone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene; and dimethylsulfoxide (DMSO).

These solvents can be used individually, or in combination as a mixed solvent.

Among these, PGMEA, PGME, γ-butyrolactone and EL are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2.

Specifically, when EL or cyclohexanone is mixed as the polar solvent, the PGMEA:EL weight ratio or PGMEA:cyclohexanone weight ratio is preferably from 1:9 to 9:1, and more preferably from 2:8 to 8:2. Alternatively, when PGME is mixed as the polar solvent, the PGMEA:PGME is preferably from 1:9 to 9:1, more preferably from 2:8 to 8:2, and still more preferably 3:7 to 7:3.

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the component (S) is not particularly limited, and is appropriately adjusted to a concentration which enables coating of a resist solution to a substrate. In general, the organic solvent is used in an amount such that the solid content of the resist composition becomes within the range from 1 to 20% by weight, and preferably from 2 to 15% by weight.

<<Method of Forming a Resist Pattern>>

The method of forming a resist pattern of the second aspect of the present invention includes: forming a resist film on a substrate using a resist composition of the present invention; conducting exposure of the resist film; and developing the resist film to form a resist pattern.

The method for forming a resist pattern according to the present invention can be performed, for example, as follows.

Firstly, a resist composition of the present invention is applied to a substrate using a spinner or the like, and a bake treatment (post applied bake (PAB)) is conducted at a temperature of 80 to 150° C. for 40 to 120 seconds, preferably 60 to 90 seconds, to form a resist film.

Following selective exposure of the thus formed resist film, either by exposure through a mask having a predetermined pattern formed thereon (mask pattern) using an exposure apparatus such as an ArF exposure apparatus, an electron beam lithography apparatus or an EUV exposure apparatus, or by patterning via direct irradiation with an electron beam without using a mask pattern, baking treatment (post exposure baking (PEB)) is conducted under temperature conditions of 80 to 150° C. for 40 to 120 seconds, and preferably 60 to 90 seconds.

Next, the resist film is subjected to a developing treatment. The developing treatment is conducted using an alkali developing solution in the case of an alkali developing process, and a developing solution containing an organic solvent (organic developing solution) in the case of a solvent developing process.

After the developing treatment, it is preferable to conduct a rinse treatment. The rinse treatment is preferably conducted using pure water in the case of an alkali developing process, and a rinse solution containing an organic solvent in the case of a solvent developing process.

In the case of a solvent developing process, after the developing treatment or the rinsing, the developing solution or the rinse liquid remaining on the pattern can be removed by a treatment using a supercritical fluid.

After the developing treatment or the rinse treatment, drying is conducted. If desired, bake treatment (post bake) can be conducted following the developing. In this manner, a resist pattern can be obtained.

The substrate is not specifically limited and a conventionally known substrate can be used. For example, substrates for electronic components, and such substrates having wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the substrate, any one of the above-mentioned substrates provided with an inorganic and/or organic film on the surface thereof may be used. As the inorganic film, an inorganic anti-reflection film (inorganic BARC) can be used. As the organic film, an organic antireflection film (organic BARC) and an organic film such as a lower-layer organic film used in a multilayer resist method can be used.

Here, a "multilayer resist method" is method in which at least one layer of an organic film (lower-layer organic film) and at least one layer of a resist film (upper resist film) are provided on a substrate, and a resist pattern formed on the upper resist film is used as a mask to conduct patterning of the lower-layer organic film. This method is considered as being capable of forming a pattern with a high aspect ratio. More specifically, in the multilayer resist method, a desired thickness can be ensured by the lower-layer organic film, and as a result, the thickness of the resist film can be reduced, and an extremely fine pattern with a high aspect ratio can be formed.

The multilayer resist method is broadly classified into a method in which a double-layer structure consisting of an upper-layer resist film and a lower-layer organic film is formed (double-layer resist method), and a method in which a multilayer structure having at least three layers consisting of an upper-layer resist film, a lower-layer organic film and at least one intermediate layer (thin metal film or the like) provided between the upper-layer resist film and the lower-layer organic film is formed (triple-layer resist method).

The wavelength to be used for exposure is not particularly limited and the exposure can be conducted using radiations such as ArF excimer laser, KrF excimer laser, $F_2$ excimer laser, extreme ultraviolet rays (EUV), vacuum ultraviolet rays (VUV), electron beam (EB), X-rays, and soft X-rays. The resist composition of the present invention is effective to KrF excimer laser, ArF excimer laser, EB and EUV.

The exposure of the resist film can be either a general exposure (dry exposure) conducted in air or an inert gas such as nitrogen, or immersion exposure (immersion lithography).

In immersion lithography, the region between the resist film and the lens at the lowermost point of the exposure apparatus is pre-filled with a solvent (immersion medium) that has a larger refractive index than the refractive index of air, and the exposure (immersion exposure) is conducted in this state.

The immersion medium preferably exhibits a refractive index larger than the refractive index of air but smaller than the refractive index of the resist film to be exposed. The refractive index of the immersion medium is not particularly limited as long as it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which preferably have a boiling point within a range from 70 to 180° C. and more preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

As the immersion medium, water is preferable in terms of cost, safety, environment and versatility.

As an example of the alkali developing solution used in an alkali developing process, a 0.1 to 10% by weight aqueous solution of tetramethylammonium hydroxide (TMAH) can be given.

As the organic solvent contained in the organic developing solution used in a solvent developing process, any of the conventional organic solvents can be used, which are capable of dissolving the component (A) (prior to exposure). Specific examples of the organic solvent include polar solvents such as ketone solvents, ester solvents, alcohol solvents, amide solvents and ether solvents, and hydrocarbon solvents.

If desired, the organic developing solution may have a conventional additive blended. Examples of the additive include surfactants. The surfactant is not particularly limited, and for example, an ionic or non-ionic fluorine and/or silicon surfactant can be used.

When a surfactant is added, the amount thereof based on the total amount of the organic developing solution is generally 0.001 to 5% by weight, preferably 0.005 to 2% by weight, and more preferably 0.01 to 0.5% by weight.

The developing treatment can be performed by a conventional developing method. Examples thereof include a method in which the substrate is immersed in the developing solution for a predetermined time (a dip method), a method in which the developing solution is cast up on the surface of the substrate by surface tension and maintained for a predetermined period (a puddle method), a method in which the developing solution is sprayed onto the surface of the substrate (spray method), and a method in which the developing solution is continuously ejected from a developing solution ejecting nozzle while scanning at a constant rate to apply the developing solution to the substrate while rotating the substrate at a constant rate (dynamic dispense method).

The rinse treatment using a rinse liquid (washing treatment) can be conducted by a conventional rinse method. Examples of the rinse method include a method in which the rinse liquid is continuously applied to the substrate while rotating it at a constant rate (rotational coating method), a method in which the substrate is immersed in the rinse liquid for a predetermined time (dip method), and a method in which the rinse liquid is sprayed onto the surface of the substrate (spray method).

<<Polymeric Compound>>

A third aspect of the present invention is a polymeric compound having a structural unit (a0) represented by general formula (a0-1) shown below.

[Chemical Formula 59]

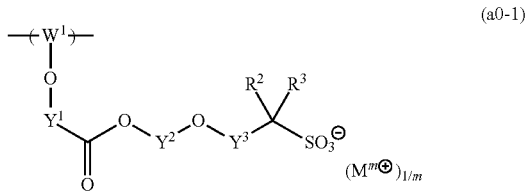

(a0-1)

In the formula, $W^1$ represents a group which is formed by polymerization reaction of a group containing a polymerizable group; $Y^1$ and $Y^2$ each independently represents a divalent linking group; $Y^3$ represents a carbonyl group or an alkylene group; $R^2$ and $R^3$ each independently represents a fluorine atom or a fluorinated alkyl group; $M^{m+}$ represents an organic cation having a valency of m; and m represents an integer of 1 or more.

In the formula (a0-1), $W^1$, $Y^1$, $Y^2$, $Y^3$, $R^2$, $R^3$, $M^{m+}$ and m are the same as defined above.

In the polymeric compound of the present invention, the structural unit (a0) is preferably a structural unit represented by general formula (a0-2) shown below.

[Chemical Formula 60]

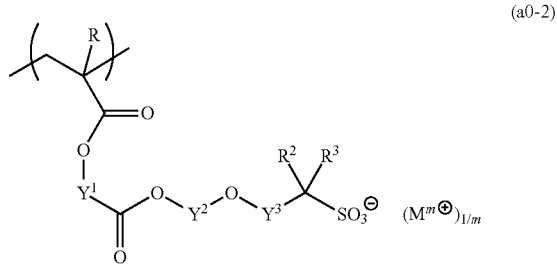

(a0-2)

In the formula, R represents a hydrogen atom, an alkyl group of 1 to 5 carbon atoms or a halogenated alkyl group of 1 to 5 carbon atoms; $Y^1$ and $Y^2$ each independently represents a divalent linking group; $Y^3$ represents a carbonyl group or an alkylene group; $R^2$ and $R^3$ each independently represents a fluorine atom or a fluorinated alkylene group; $M^{m+}$ represents an organic cation having a valency of m; and m represents an integer of 1 or more.

In the formula (a0-2), R, $Y^1$, $Y^2$, $Y^3$, $R^2$, $R^3$, $M^{m+}$ and m are the same as defined above.

<<Compound>>

A fourth aspect of the present invention is a compound represented by general formula (a0-m1) shown below.

[Chemical Formula 61]

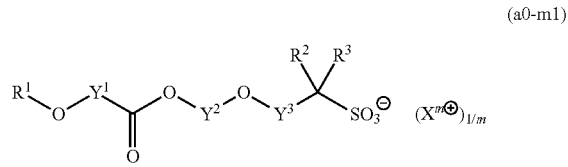

(a0-m1)

In the formula, $R^1$ represents a group containing a polymerizable group; $Y^1$ and $Y^2$ each independently represents a divalent linking group; $Y^3$ represents a carbonyl group or an alkylene group; $R^2$ and $R^3$ each independently represents a fluorine atom or a fluorinated alkyl group; $X^{m+}$ represents a metal cation or an organic cation having a valency of m; and m represents an integer of 1 or more.

In the formula (a0-m1), $Y^1$, $Y^2$, $Y^3$, $R^2$ and $R^3$ are the same as defined above.

In the formula (a0-m1), $R^1$ represents a group containing a polymerizable group and is the same groups as those described above for $R^{w2}$-$L^{w1}$- in relation to $W^1$.

In the formula (a0-m1), $X^{m+}$ represents a metal cation or an organic cation, and examples thereof include an alkali metal cation and an organic cation. Examples of alkali metal ions include a sodium ion, a lithium ion and a potassium ion, and a sodium ion or a lithium ion is preferable. As the organic cation, a cation containing a nitrogen atom such as an ammonium ion and a pyridinium ion, and the same organic cations as those described above for $M^{m+}$ in the formulae (b-1) to (b-3) can be mentioned.

In the fourth aspect of the present invention, $R^1$ in the general formula (a0-m1) is preferably a group represented by general formula (a0-m2) shown below.

[Chemical Formula 62]

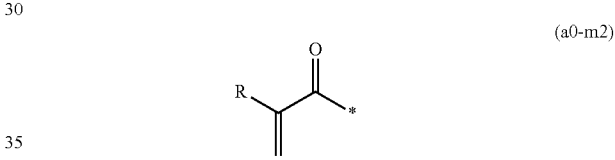

(a0-m2)

In the formula, R represents a hydrogen atom, an alkyl group of 1 to 5 carbon atoms or a halogenated alkyl group of 1 to 5 carbon atoms; and * represents a valence bond.

In general formula (a0-m2), R represents a hydrogen atom, an alkyl group of 1 to 5 carbon atoms or a halogenated alkyl group of 1 to 5 carbon atoms.

The alkyl group of 1 to 5 carbon atoms is preferably a linear or branched alkyl group of 1 to 5 carbon atoms, and specific examples include a methyl group, an ethyl group, a propyl group, an isopropyl group, an n-butyl group, an isobutyl group, a tert-butyl group, a pentyl group, an isopentyl group, and a neopentyl group. The halogenated alkyl group of 1 to 5 carbon atoms is a group in which part or all of the hydrogen atoms of the aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

EXAMPLES

As follows is a description of examples of the present invention, although the scope of the present invention is by no way limited by these examples.

Synthesis Example

Synthesis of Compound (1)

10.07 g of compound (I) and 10.00 g of compound (II) were added to 50.00 g of acetonitrile (hereafter, referred to as "AN") in a nitrogen atmosphere, and cooled to 5° C. Then, to the resultant was gradually added a trimethyl amine solution obtained by dissolving 8.36 g of triethylamine in 25.07 g of acetonitrile, and a reaction was effected at 5° C. for 1 hour. After the completion of the reaction, the reaction solution was filtered, and obtained filtrate was concentrated. Then, 240 g of pure water was added to the residue, and the aqueous phase was washed with diethyl ketone twice, thereby obtaining 15.71 g of an aqueous solution of containing compound (III).

240 g of dichloromethane and 12.05 g of triphenylsulfonium bromide were added to the aqueous solution, and a reaction was effected at room temperature for 5 minutes. After the completion of the reaction, the aqueous phase was removed, and the dichloromethane phase was washed with pure water, concentrated and dried, thereby obtaining 18.17 g of compound (1).

[Chemical Formula 63]

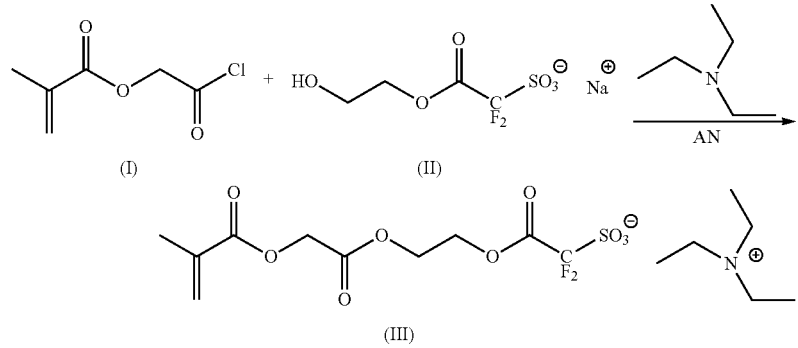

[Chemical Formula 64]

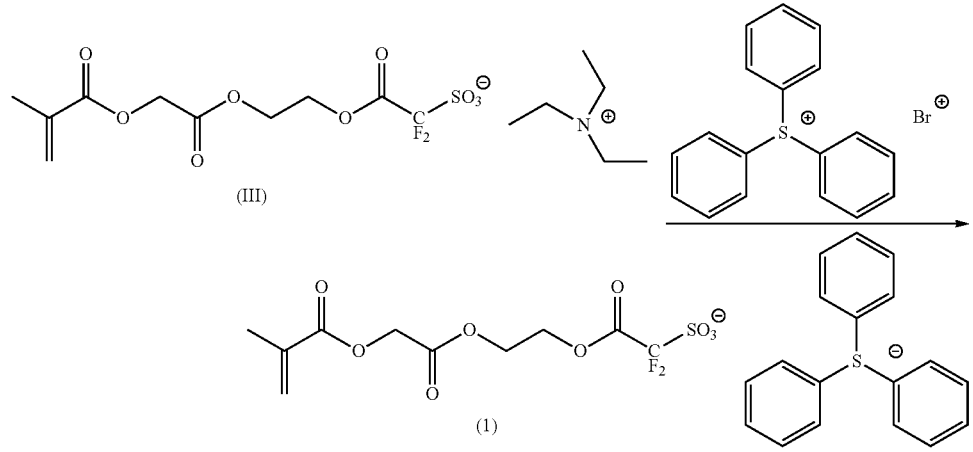

The obtained compound (1) was analyzed by NMR, and the structure thereof was identified by the following results.

$^1$H-NMR (DMSO-d6): δ(ppm)=7.9-7.7 (m, 15H), 6.08 (s, 1H), 5.66 (s, 1H), 4.87 (s, 2H), 4.35 (t, 2H), 4.06 (t, 2H), 1.89 (s, 3H)

The same procedure as in the synthesis of compound (1) was performed, thereby obtaining compounds (2) to (9). The results of the NMR analysis and structure of the compounds (2) to (9) are shown below.

[Chemical Formula 65]

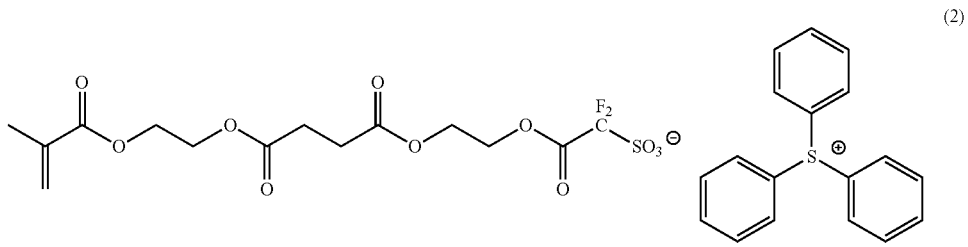

-continued
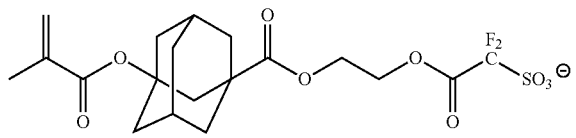 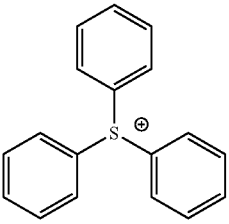
(3)
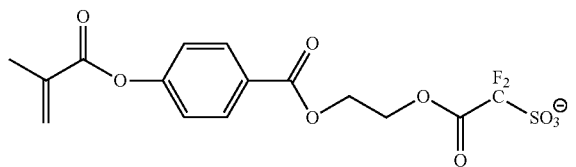 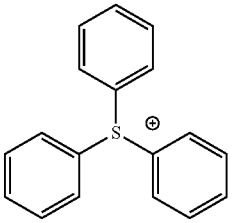
(4)
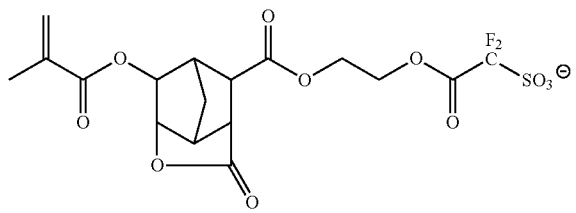 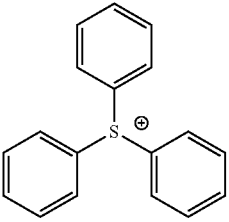
(5)
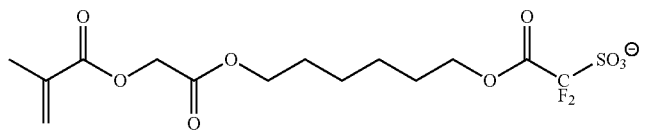 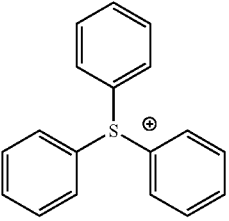
(6)
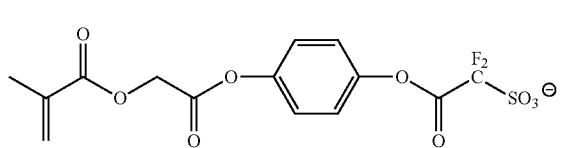 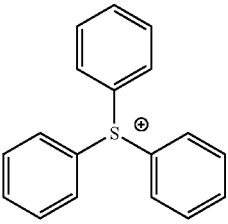
(7)
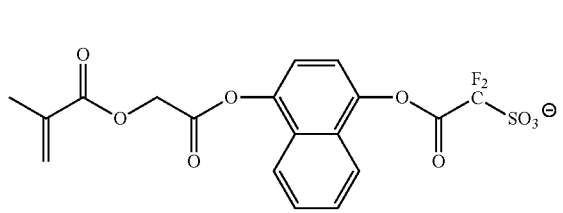 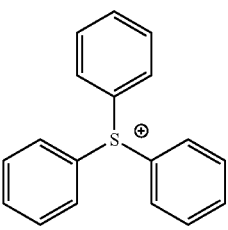
(8)

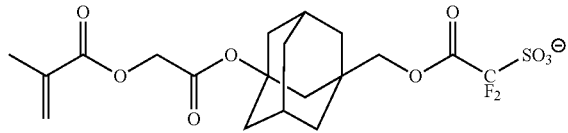

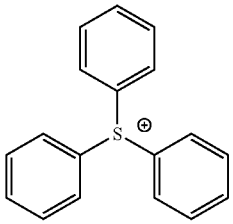

(9)

NMR analysis

Compound (2): $^1$H-NMR (DMSO-d6): δ(ppm)=7.9-7.7 (m, 15H), 6.08 (s, 1H), 5.69 (s, 1H), 4.60 (t, 2H), 4.2-3.8 (m, 6H) 2.5-2.3 (m, 4H), 1.89 (s, 3H)

Compound (3): $^1$H-NMR (DMSO-d6): δ(ppm)=7.9-7.7 (m, 15H), 6.09 (s, 1H), 5.64 (s, 1H), 4.2-4.0 (m, 4H), 2.8-1.4 (m, 17H)

Compound (4): $^1$H-NMR (DMSO-d6): δ(ppm)=8.03 (d, 2H), 7.9-7.7 (m, 17H), 6.17 (s, 1H), 5.98 (s, 1H), 4.56 (t, 2H), 4.39 (t, 2H), 2.01 (s, 3H)

Compound (5): $^1$H-NMR (DMSO-d6): δ(ppm)=7.9-7.7 (m, 15H), 6.08 (s, 1H), 5.69 (s, 1H), 5.0-4.8 (m, 2H), 4.2-4.0 (m, 4H), 3.26 (m, 1H), 2.85 (m, 1H), 2.49 (m, 1H), 2.1-1.7 (m, 6H)

Compound (6): $^1$H-NMR (DMSO-d6): δ(ppm)=7.9-7.7 (m, 15H), 6.08 (s, 1H) 5.67 (s, 1H), 4.84 (s, 2H) 4.00 (t, 2H), 3.92 (t, 2H) 1.89 (s, 3H), 1.7-1.1 (m, 8H)

Compound (7): $^1$H-NMR (DMSO-d6): δ(ppm)=7.9-7.7 (m, 19H), 6.08 (s, 1H), 5.58 (s, 1H), 5.15 (s, 2H), 1.92 (s, 3H)

Compound (8): $^1$H-NMR (DMSO-d6): δ(ppm)=8.3-7.7 (m, 21H), 6.08 (s, 1H), 5.59 (s, 1H), 5.22 (s, 2H), 1.92 (s, 3H)

Compound (9): $^1$H-NMR (DMSO-d6): δ(ppm)=7.9-7.7 (m, 15H), 6.08 (s, 1H), 5.66 (s, 1H), 4.85 (s, 2H), 3.71 (s, 2H), 2.4-0.8 (m, 17H)

Synthesis Example of Polymeric Compound

Synthesis of Polymeric Compound 1

12.36 g of methyl ethyl ketone (MEK) was added to a flask equipped with a thermometer, a reflux tube, a stirrer and a nitrogen inlet tube under a nitrogen atmosphere, and the internal temperature was raised to 80° C. while stirring.

Separately from above, 9.00 g (28.45 mmol) of compound (10), 7.46 g (29.81 mmol) of compound (11), 5.51 g (9.05 mmol) of compound (1), and 2.17 g (9.42 mmol) of dimethyl 2,2'-azobis(isobutyrate) (V-601) as a polymerization initiator were dissolved in 32.25 g of methyl ethyl ketone (MEK). The MEK solution was added to the flask in a dropwise manner over 4 hours.

Thereafter, the reaction solution was heated for 1 hour while stirring, and then cooled to room temperature. The resulting polymer solution was added to an excess amount of n-heptane in a dropwise manner to precipitate a polymer. Then, the precipitated white powder was collected by filtration, followed by drying, thereby obtaining 16.92 g of a polymeric compound 1.

With respect to the polymeric compound 1, the weight average molecular weight (Mw) and the dispersity (Mw/Mn) were determined by the polystyrene equivalent value as measured by gel permeation chromatography (GPC). As a result, it was found that the weight average molecular weight was 11,600, and the dispersity was 2.06. Further, as a result of an analysis by carbon 13 nuclear magnetic resonance spectroscopy (600 MHz, 13C-NMR), it was found that the molar ratio of the respective structural units was (10)/(11)/(1)=45/41/14.

[Chemical Formula 66]

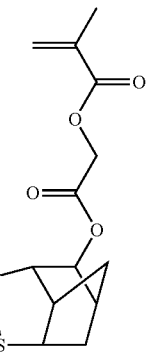

(10)

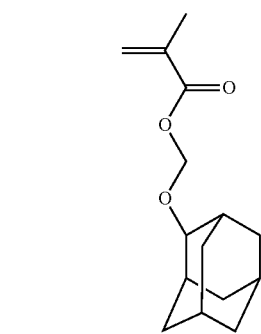

(11)

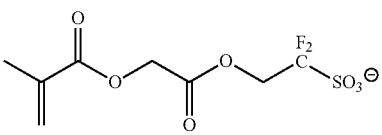

(12)

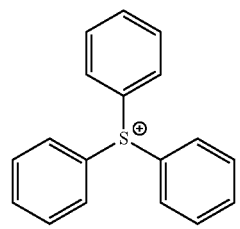

-continued (13)

[Chemical structure: methacrylate ester with C8 chain linker ending in -O-C(=O)-CF2-SO3⁻, paired with triphenylsulfonium cation]

Polymeric compounds 1 to 11, each of which have a structure indicated in following Tables 1 and 2, were synthesized in the same manner as in the aforementioned procedure, except that the monomers which derived the structural units constituting each polymeric compound were used in the molar ratio indicated in Tables 1 and 2.

TABLE 1

| | | Polymeric Compound | | | | |
|---|---|---|---|---|---|---|
| | | 1 | 2 | 3 | 4 | 5 |
| Compound | (1) | 14 | | | | |
| | (2) | | 14 | | | |
| | (3) | | | 14 | | |
| | (4) | | | | 14 | |
| | (5) | | | | | 14 |
| | (6) | | | | | |
| | (7) | | | | | |
| | (8) | | | | | |
| | (9) | | | | | |
| | (10) | 45 | 45 | 45 | 45 | 45 |
| | (11) | 41 | 41 | 41 | 41 | 41 |
| | (12) | | | | | |
| | (13) | | | | | |
| Mw | | 11600 | 12000 | 10900 | 10500 | 10400 |
| Mw/Mn | | 2.06 | 2.09 | 2.16 | 2.1 | 1.97 |

TABLE 2

| | | Polymeric Compound | | | | | |
|---|---|---|---|---|---|---|---|
| | | 6 | 7 | 8 | 9 | 10 | 11 |
| Compound | (1) | | | | | | |
| | (2) | | | | | | |
| | (3) | | | | | | |
| | (4) | | | | | | |
| | (5) | | | | | | |
| | (6) | 14 | | | | | |
| | (7) | | 14 | | | | |
| | (8) | | | 14 | | | |
| | (9) | | | | 14 | | |
| | (10) | 45 | 45 | 45 | 45 | 45 | 45 |
| | (11) | 41 | 41 | 41 | 41 | 41 | 41 |
| | (12) | | | | | 14 | |
| | (13) | | | | | | 14 |
| Mw | | 11700 | 12200 | 12000 | 12300 | 10500 | 11400 |
| Mw/Mn | | 2.05 | 1.96 | 2.12 | 2.15 | 2.16 | 2.08 |

The components were mixed with the obtained polymeric compound in the mixing ratio indicated in following Table 3 to obtain resist compositions (Examples 1 to 9, Comparative Examples 1 and 2).

TABLE 3

| | Component (A) | Component (D) | Component (E) | Component (S)-1 | Component (S)-2 |
|---|---|---|---|---|---|
| Example 1 | (A)-1 [100] | (D)-1 [1.6] | (E)-1 [0.64] | (S)-1 [100] | (S)-2 [2000] |
| Example 2 | (A)-2 [100] | (D)-1 [1.6] | (E)-1 [0.64] | (S)-1 [100] | (S)-2 [2000] |
| Example 3 | (A)-3 [100] | (D)-1 [1.6] | (E)-1 [0.64] | (S)-1 [100] | (S)-2 [2000] |
| Example 4 | (A)-4 [100] | (D)-1 [1.6] | (E)-1 [0.64] | (S)-1 [100] | (S)-2 [2000] |
| Example 5 | (A)-5 [100] | (D)-1 [1.6] | (E)-1 [0.64] | (S)-1 [100] | (S)-2 [2000] |
| Example 6 | (A)-6 [100] | (D)-1 [1.6] | (E)-1 [0.64] | (S)-1 [100] | (S)-2 [2000] |
| Example 7 | (A)-7 [100] | (D)-1 [1.6] | (E)-1 [0.64] | (S)-1 [100] | (S)-2 [2000] |
| Example 8 | (A)-8 [100] | (D)-1 [1.6] | (E)-1 [0.64] | (S)-1 [100] | (S)-2 [2000] |
| Example 9 | (A)-9 [100] | (D)-1 [1.6] | (E)-1 [0.64] | (S)-1 [100] | (S)-2 [2000] |
| Comparative Example 1 | (A)-10 [100] | (D)-1 [1.6] | (E)-1 [0.64] | (S)-1 [100] | (S)-2 [2000] |
| Comparative Example 2 | (A)-11 [100] | (D)-1 [1.6] | (E)-1 [0.64] | (S)-1 [100] | (S)-2 [2000] |

In Table 3, the reference characters indicate the following. Further, the values in brackets [ ] indicate the amount (in terms of parts by weight) of the component added.

(A)-1 to (A)-11: the aforementioned polymeric compounds 1 to 11

(D)-1: tri-n-octylamine (E)-1: salicylic acid (S)-1: γ-butyrolactone (S)-2: a mixed solvent of PGMEA/PGME/cyclohexanone=45/30/25 (weight ratio)

Formation of Resist Pattern

Examples 1 to 9, Comparative Examples 1 and 2

Using a spinner, each resist composition was uniformly applied to an 8-inch silicon wafer that had been treated with hexamethyldisilazane (HMDS) at 90° C. for 60 seconds, and subjected to a prebake treatment (PAB) at 130° C. for 60 seconds, thereby forming a resist film (film thickness: 60 nm).

Subsequently, the resist film was subjected to drawing (exposure) using an electron beam lithography apparatus JEOL-JBX-9300FS (manufactured by JEOL Ltd.) at an acceleration voltage of 100 kV, with a target size of a line width of 50 nm and a pitch of 100 nm.

Then, a post exposure bake (PEB) treatment was conducted at 130° C. for 60 seconds, followed by development for 60 seconds at 23° C. using a 2.38% by weight aqueous solution of tetramethylammonium hydroxide (TMAH) (trade name: NMD-3; manufactured by Tokyo Ohka Kogyo Co., Ltd.). Thereafter, water rinsing was conducted for 60 seconds using pure water, followed by drying by shaking. Further, a post bake was conducted at 90° C. for 60 seconds.

As a result, in each of the examples, a line and space pattern (LS pattern) having a line width of 50 nm and a pitch of 100 nm was formed.

[Evaluation of optimum exposure dose (Eop)]

In the above "formation of resist pattern", the optimum exposure dose Eop ($\mu C/cm^2$) with which the LS pattern having the target size could be formed was determined. The results are indicated under "sensitivity ($\mu C/cm^2$)" in Table 4.

Evaluation of Resolution

The critical resolution with the above Eop was determined using a scanning electron microscope (product name: S-9380, manufactured by Hitachi High-Technologies Corporation). Specifically, when an LS pattern was formed while gradually increasing the exposure dose from the optimum exposure dose (Eop), the minimum pattern size with which a pattern could be resolved without pattern collapse was determined.

The results are indicated under "resolution (nm)" in Table 4.

Evaluation of line edge roughness (LER)

With respect to the LS pattern formed in the above <Formation of resist pattern> having a line width of 50 nm and a pitch of 100 nm, $3\sigma$ was determined as a yardstick for indicating LER.

"$3\sigma$" indicates a value of 3 times the standard deviation ($\sigma$) (i.e., $3\sigma$) (unit: nm) determined by measuring the line width at 400 points in the lengthwise direction of the line using a scanning electron microscope (product name: S-9380, manufactured by Hitachi High-Technologies Corporation; acceleration voltage: 800V).

The smaller this $3\sigma$ value is, the lower the level of roughness of the line side walls, indicating that a LS pattern with a uniform width was obtained. The results are indicated under "LER (nm)" in Table 4.

TABLE 4

|  | Sensitivity ($\mu C/cm^2$) | Resolution (nm) | LER (nm) |
|---|---|---|---|
| Example 1 | 97 | 35 | 3.51 |
| Example 2 | 71 | 40 | 3.61 |
| Example 3 | 118 | 40 | 3.53 |
| Example 4 | 112 | 35 | 3.5 |
| Example 5 | 129 | 35 | 3.35 |
| Example 6 | 65 | 40 | 3.62 |
| Example 7 | 108 | 35 | 3.48 |
| Example 8 | 117 | 35 | 3.42 |
| Example 9 | 123 | 40 | 3.56 |
| Comparative Example 1 | 173 | 40 | 3.66 |
| Comparative Example 2 | 61 | 50 | 5.38 |

As seen from the results shown above, the resist composition of the present invention exhibited excellent sensitivity, resolution and LER as compared to Comparative Examples.

Synthesis Example of Polymeric Compound

Polymeric compounds 12 to 16, each of which have a structure indicated in following Table 5, were synthesized in the same manner as in the synthesis of polymeric compound 1, except that the monomers (1), (4) and (12) to (16) which derived the structural units constituting each polymeric compound were used in the molar ratio indicated in Table 5.

TABLE 5

|  |  | Polymeric Compound | | | | |
|---|---|---|---|---|---|---|
|  |  | 12 | 13 | 14 | 15 | 16 |
| Compound | (1) | 5 | 5 |  |  |  |
|  | (4) |  |  | 5 |  |  |
|  | (12) |  |  |  | 5 |  |
|  | (13) |  |  |  |  | 5 |
|  | (14) | 35 | 35 | 35 | 35 | 35 |
|  | (15) | 60 |  | 60 | 60 | 60 |
|  | (16) |  | 60 |  |  |  |
| Mw |  | 11700 | 11900 | 12000 | 11600 | 12100 |
| Mw/Mn |  | 2.06 | 2.01 | 1.98 | 2.20 | 2.10 |

The monomers (1), (4) and (12) to (16) are shown below.

[Chemical Formula 67]

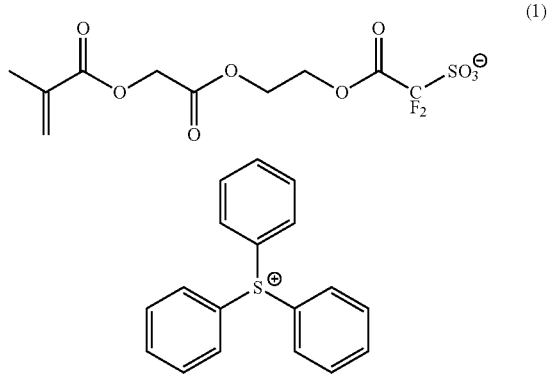

-continued (4)
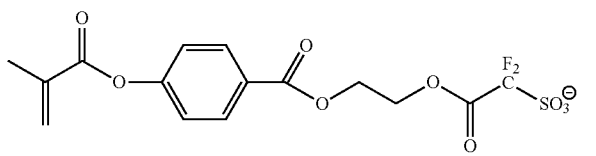

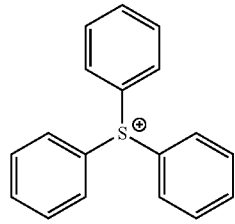

(12)
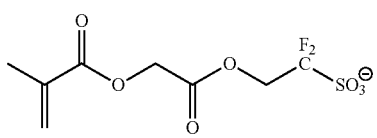

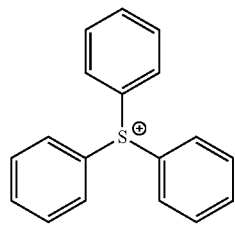

(13)
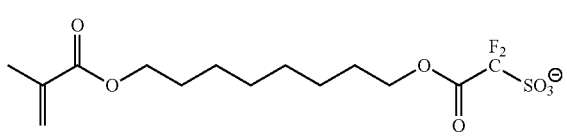

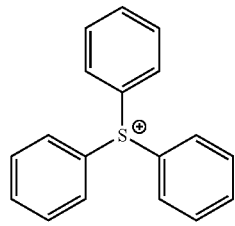

(14)
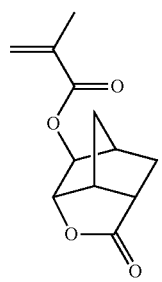

(15)
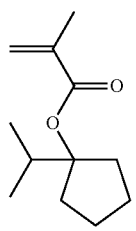

-continued

(16)
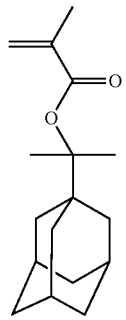

The components were mixed with the obtained polymeric compounds 12 to 16 in the mixing ratio indicated in following Table 6 to obtain resist compositions (Examples 10 to 12, Comparative Examples 3 and 4).

TABLE 6

| | Component (A) | Component (D) | Component (E) | Component (S)-1 | Component (S)-3 |
|---|---|---|---|---|---|
| Example 10 | (A)-12 [100] | (D)-1 [1.6] | (E)-1 [0.64] | (S)-1 [100] | (S)-3 [4000] |
| Example 11 | (A)-13 [100] | (D)-1 [1.6] | (E)-1 [0.64] | (S)-1 [100] | (S)-3 [4000] |
| Example 12 | (A)-14 [100] | (D)-1 [1.6] | (E)-1 [0.64] | (S)-1 [100] | (S)-3 [4000] |
| Comparative Example 3 | (A)-15 [100] | (D)-1 [1.6] | (E)-1 [0.64] | (S)-1 [100] | (S)-3 [4000] |
| Comparative Example 4 | (A)-16 [100] | (D)-1 [1.6] | (E)-1 [0.64] | (S)-1 [100] | (S)-3 [4000] |

In Table 6, the reference characters indicate the following. Further, the values in brackets [ ] indicate the amount (in terms of parts by weight) of the component added.

(A)-12 to (A)-16: the aforementioned polymeric compounds 12 to 16
(D)-1: tri-n-octylamine
(E)-1: salicylic acid
(S)-1: γ-butyrolactone
(S)-3: a mixed solvent of PGMEA/PGME/cyclohexanone=15/10/25 (weight ratio)

Formation of Resist Pattern

Examples 10 to 12, Comparative Examples 3 and 4

Using a spinner, each resist composition [Examples 10 to 12, Comparative Examples 3 and 4] was uniformly applied to an 12-inch silicon wafer that had been treated with hexamethyldisilazane (HMDS) at 90° C. for 36 seconds, and subjected to a prebake treatment (PAB) on a hotplate at 130° C. for 60 seconds, thereby forming a resist film (film thickness: 60 nm).

Subsequently, the resist film was subjected to drawing (exposure) using an electron beam lithography apparatus JEOL JBX-9300FS (manufactured by JEOL Ltd.) at an acceleration voltage of 100 kV, and then subjected to a post exposure bake (PEB) at 90° C. for 60 seconds.

Then, solvent development was conducted at 23° C. for 16 seconds using butyl acetate, followed by drying by shaking.

As a result, in each of the examples except for Comparative Example 3, a line and space pattern (LS pattern) having a line width of 50 nm and a pitch of 100 nm was formed.

With respect to the formed pattern, [sensitivity (μC/cm$^2$)], [resolution (nm)] and [LER (nm)] were evaluated in the same manner as described above. The results are shown in Table 7.

TABLE 7

|  | Sensitivity (μC/cm$^2$) | Resolution (nm) | LER (nm) |
| --- | --- | --- | --- |
| Example 10 | 82 | 30 | 4.3 |
| Example 11 | 91 | 35 | 4.4 |
| Example 12 | 75 | 30 | 4.1 |
| Comparative Example 3 |  | Could not be resolved (due to low solubility) |  |
| Comparative Example 4 | 69 | 50 | 6.2 |

As seen from the results shown above, when a solvent developing negative tone pattern was formed using the resist composition of Examples 10 to 12 by EB exposure, the formed pattern exhibits excellent [resolution (nm)] and [LER (nm)] as compared to Comparative Example 4.

Comparative Example 3 exhibited low solubility in developing solution, and therefore, a pattern could not be resolved.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A resist composition which generates acid upon exposure and exhibits changed solubility in a developing solution by the action of acid, comprising:
   a base component (A) which exhibits changed solubility in a developing solution by the action of acid,
   the base component (A) comprising a polymeric compound (A1) comprising a structural unit (a0) represented by general formula (a0-1) shown below:

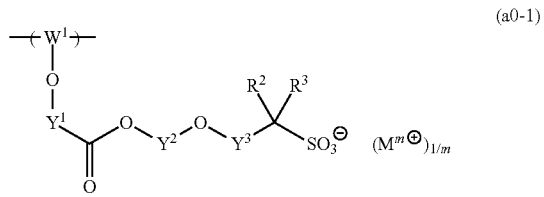

(a0-1)

wherein W$^1$ represents a group which is formed by polymerization reaction of a group containing a polymerizable group; Y$^1$ and Y$^2$ each independently represents a divalent linking group; Y$^3$ represents a carbonyl group or an alkylene group; R$^2$ and R$^3$ each independently represents a fluorine atom or a fluorinated alkyl group; M$^{m+}$ represents an organic cation having a valency of m; and m represents an integer of 1 or more.

2. The resist composition according to claim 1, wherein the structural unit (a0) is represented by general formula (a0-2) shown below:

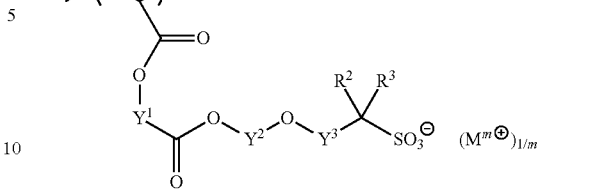

(a0-2)

wherein R represents a hydrogen atom, an alkyl group of 1 to 5 carbon atoms or a halogenated alkyl group of 1 to 5 carbon atoms; Y$^1$ and Y$^2$ each independently represents a divalent linking group; Y$^3$ represents a carbonyl group or an alkylene group; R$^2$ and R$^3$ each independently represents a fluorine atom or a fluorinated alkylene group; M$^{m+}$ represents an organic cation having a valency of m; and m represents an integer of 1 or more.

3. The resist composition according to claim 1, wherein Y$^1$ and/or Y$^2$ each independently represents a divalent hydrocarbon group which may have a substituent or a divalent linking group containing a hetero atom.

4. The resist composition according to claim 1, wherein Y$^1$ and/or Y$^2$ each independently represents a divalent linear or branched aliphatic hydrocarbon group, a divalent aliphatic hydrocarbon group containing a ring in the structure thereof, or a divalent aromatic hydrocarbon group.

5. The resist composition according to claim 1, wherein Y$^3$ represents a carbonyl group.

6. The resist composition according to claim 1, wherein the polymeric compound (A1) further comprises a structural unit (a1) containing an acid decomposable group that exhibits increased polarity by the action of acid.

7. A method of forming a resist pattern, comprising: forming a resist film on a substrate using a resist composition of claim 1; conducting exposure of the resist film; and developing the resist film to form a resist pattern.

8. A polymeric compound comprising a structural unit (a0) represented by general formula (a0-1) shown below:

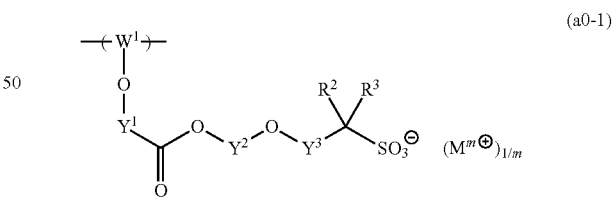

(a0-1)

wherein W$^1$ represents a group which is formed by polymerization reaction of a group containing a polymerizable group; Y$^1$ and Y$^2$ each independently represents a divalent linking group; Y$^3$ represents a carbonyl group or an alkylene group; R$^2$ and R$^3$ each independently represents a fluorine atom or a fluorinated alkyl group; M$^{m+}$ represents an organic cation having a valency of m; and m represents an integer of 1 or more.

9. The polymeric compound according to claim 8, wherein the structural unit (a0) is represented by general formula (a0-2) shown below:

(a0-2)

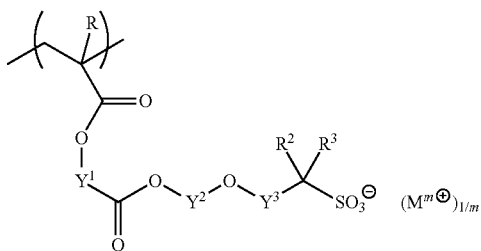

wherein R represents a hydrogen atom, an alkyl group of 1 to 5 carbon atoms or a halogenated alkyl group of 1 to 5 carbon atoms; $Y^1$ and $Y^2$ each independently represents a divalent linking group; $Y^3$ represents a carbonyl group or an alkylene group; $R^2$ and $R^3$ each independently represents a fluorine atom or a fluorinated alkylene group; $M^{m+}$ represents an organic cation having a valency of m; and m represents an integer of 1 or more.

10. The polymeric compound according to claim 8, wherein $Y^1$ and/or $Y^2$ each independently represents a divalent hydrocarbon group which may have a substituent or a divalent linking group containing a hetero atom.

11. The polymeric compound according to claim 8, wherein $Y^1$ and/or $Y^2$ each independently represents a divalent linear or branched aliphatic hydrocarbon group, a divalent aliphatic hydrocarbon group containing a ring in the structure thereof, or a divalent aromatic hydrocarbon group.

12. The polymeric compound according to claim 8, wherein $Y^3$ represents a carbonyl group.

13. A compound represented by general formula (a0-m1) shown below:

(a0-m1)

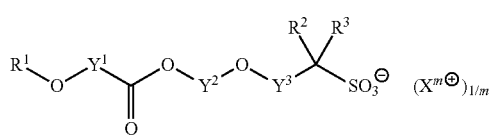

wherein $R^1$ represents a group containing a polymerizable group; $Y^1$ and $Y^2$ each independently represents a divalent linking group; $Y^3$ represents a carbonyl group or an alkylene group; $R^2$ and $R^3$ each independently represents a fluorine atom or a fluorinated alkyl group; $X^{m+}$ represents a metal cation or an organic cation having a valency of m; and m represents an integer of 1 or more.

14. The compound according to claim 13, wherein $R^1$ is represented by general formula (a0-m2) shown below:

(a0-m2)

wherein R represents a hydrogen atom, an alkyl group of 1 to 5 carbon atoms or a halogenated alkyl group of 1 to 5 carbon atoms; and * represents a valence bond.

15. The compound according to claim 13, wherein $Y^1$ and/or $Y^2$ each independently represents a divalent hydrocarbon group which may have a substituent or a divalent linking group containing a hetero atom.

16. The compound according to claim 13, wherein $Y^1$ and/or $Y^2$ each independently represents a divalent linear or branched aliphatic hydrocarbon group, a divalent aliphatic hydrocarbon group containing a ring in the structure thereof, or a divalent aromatic hydrocarbon group.

17. The compound according to claim 13, wherein $Y^3$ represents a carbonyl group.

18. The resist composition according to claim 1, wherein $Y^2$ represents a linear or branched divalent aliphatic hydrocarbon group with or without a substituent, a monocyclic alicyclic hydrocarbon group with or without a substituent, a divalent aromatic hydrocarbon group with or without a substituent, a divalent aromatic heterocycle with or without a substituent, or a divalent linking group containing a hetero atom.

19. The resist composition according to claim 1, wherein $Y^1$ represents a divalent aliphatic hydrocarbon group with or without a substituent, a divalent aromatic heterocycle with or without a substituent, or a divalent linking group having a hetero atom.

* * * * *

UNITED STATES PATENT AND TRADEMARK OFFICE
CERTIFICATE OF CORRECTION

PATENT NO. : 9,017,924 B2
APPLICATION NO. : 14/196680
DATED : April 28, 2015
INVENTOR(S) : Daichi Takaki and Yoshiyuki Utsumi It is certified that error appears in the above-identified patent and that said Letters Patent is hereby corrected as shown below:

In the Specification
Col. 1, line 6, "toeva" should be -- to --.
Col. 10, line 56, "—S(=O)$_2$—O—" should be -- —S(=O)$_2$—O—.- --.
Col. 11, line 22, "—Sα," should be -- —S—, --.
Col. 11, line 25, "O]$_m$—" should be -- O]$_m$.— --.
Col. 11, line 26, "Y$^{22}$—[in" should be --Y$^{22}$— [in --.
Col. 11, line 38, "Y$^{21}$," should be -- Y$^{21}$—, --.
Col. 11, line 39, "O]$_m$." should be -- O]$_m$. --.
Col. 12, line 46, "in" should be -- In --.
Col. 13, line 32, "L$^{w1}$-[in" should be -- L$^{w1}$- [in --.
Col. 13, line 64, "cycloolefine" should be -- cycloolefin --.
Col. 13, line 65, "cycloolefine" should be -- cycloolefin --.
Col. 13, line 67, "cycloolefine" should be -- cycloolefin --.
Col. 15, line 16, "R$^{w0}$"represents" should be -- R$^{w0}$" represents --.
Col. 15, line 47, "R$^{a'21}$;" should be -- Ra'$^{21}$; --.
Col. 17, line 27, "L$^{w1}$-[in" should be -- L$^{w1}$- [in --.
Col. 17, line 30, "hydroxyalkyl," should be -- hydroxyalkyl --.
Col. 23, lines 39-40, "dimethypropyl" should be -- dimethylpropyl --.
Col. 23, line 40, "dimethybutyl" should be -- dimethylbutyl --.
Col. 27, lines 17-21:

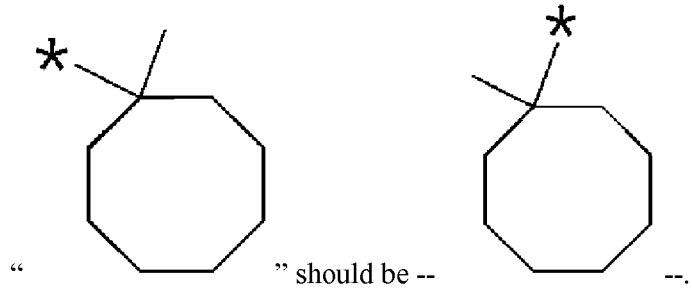

Col. 42, line 35, "—O—" should be -- —O—. --.
Col. 43, line 1, "—Y$^{21}$," should be -- —Y$^{21}$—C(=O)—O—, --.

Signed and Sealed this
First Day of March, 2016

Michelle K. Lee
*Director of the United States Patent and Trademark Office*

CERTIFICATE OF CORRECTION (continued)

Col. 43, line 14, "$Y^{21}$—O—," should be -- —$Y^{21}$—O—, --.
Col. 43, line 16, "O]$_m$—" should be -- O]$_m$.— --.
Col. 43, line 35, "O]$_m$—" should be -- O]$_m$.— --.
Col. 61, line 48, "1 is" should be -- l is --.
Col. 61, line 63, "2-norbonyl" should be -- 2-norbornyl --.
Col. 61, line 64, "3-norbonyl" should be -- 3-norbornyl --.
Col. 62, line 21, "(A1))" should be -- (A1) --.
Col. 65, line 18, "—O.—" should be -- —O—. --.
Col. 69, line 22, "($n_{ax1}$)" should be -- ($n_{ax1}$+1) --.
Col. 76, line 61, "(b-1)," should be -- (b-1). --.
Col. 81, lines 42-51:

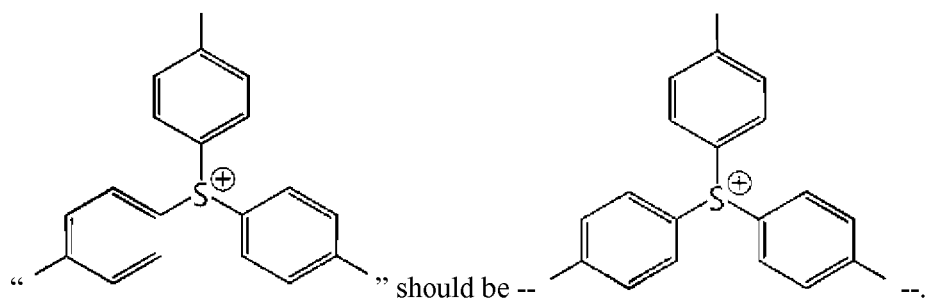

Col. 82, lines 3-13:

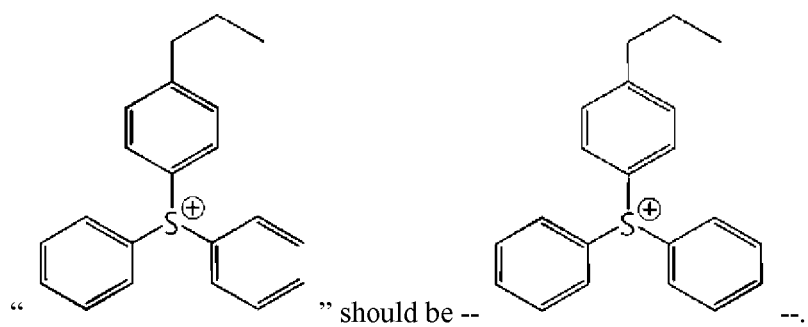

Col. 84, lines 37-49:

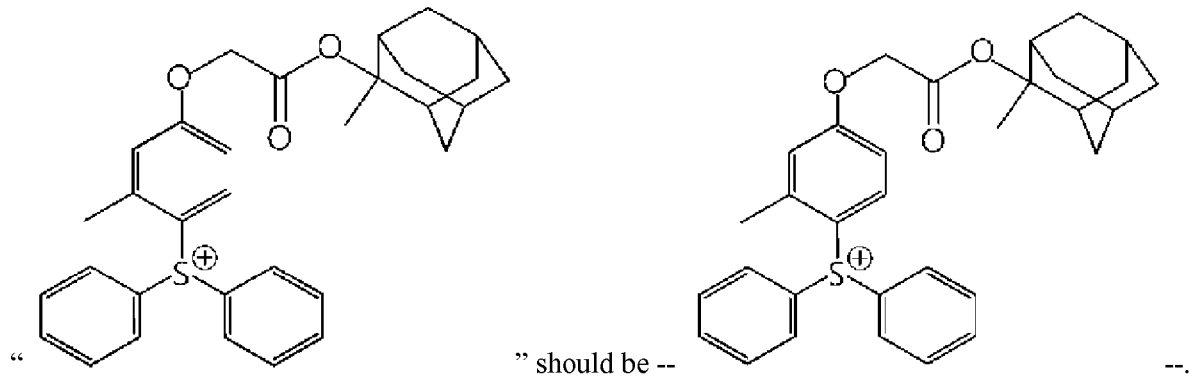

CERTIFICATE OF CORRECTION (continued)
U.S. Pat. No. 9,017,924 B2

Col. 84, lines 54-65:

" 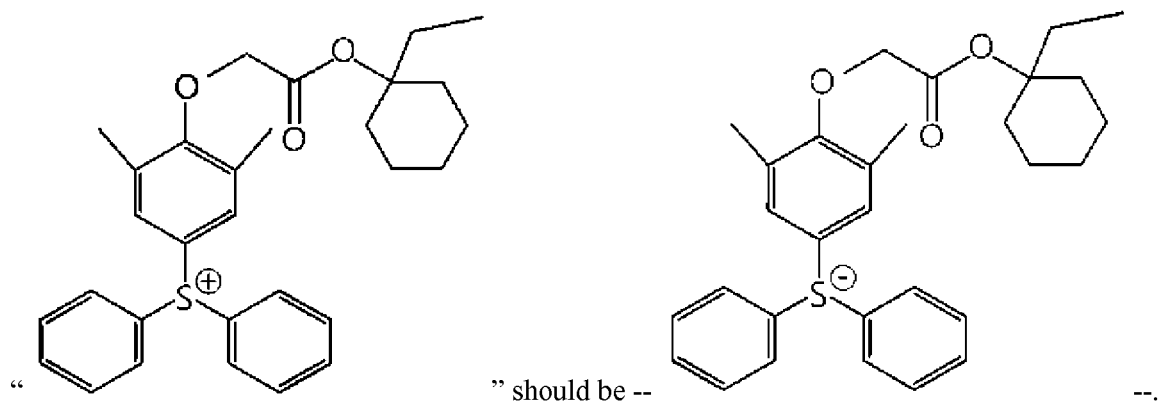 " should be -- --.

Col. 93, lines 39-49:

" 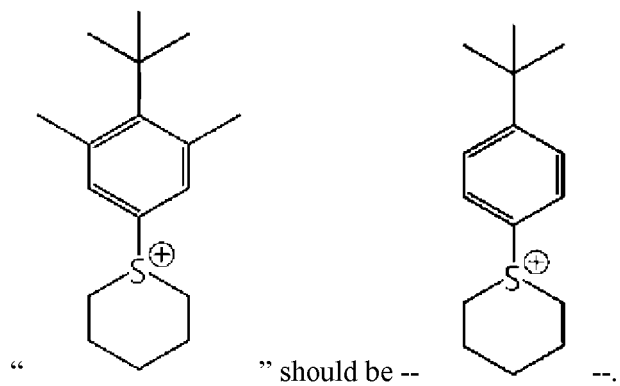 " should be -- --.

Col. 94, lines 20-33:

" 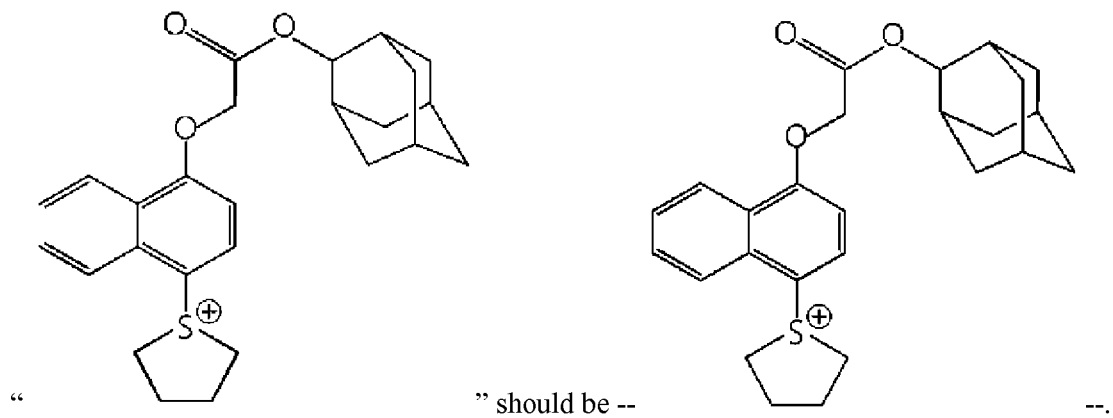 " should be -- --.

Col. 98, line 61, "provided" should be --Provided--.
Col. 99, line 4, "isobomane," should be --isobornane,--.

Col. 99, lines 33-37:
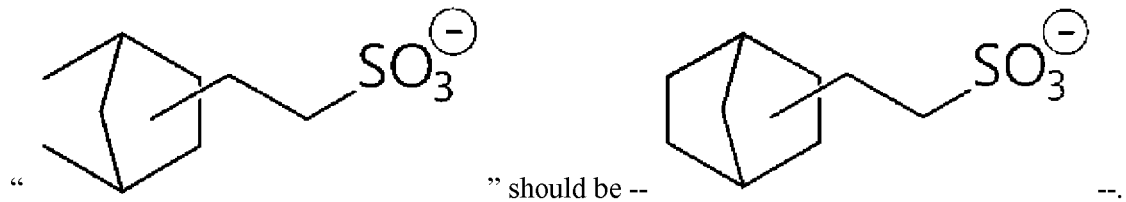
Col. 104, line 46, "tris {2-" should be -- tris{2- --.
Col. 104, line 47, "tris {2-" should be -- tris{2- --.
Col. 104, line 47 (both occurrences), "tris {2-" should be -- tris{2- --.
Col. 104, line 48, "tris {2-" should be -- tris{2- --.
Col. 117, line 17, "6H)" should be -- 6H), --.
Col. 117, line 29, "1H)" should be -- 1H), --.
Col. 117, line 29, "2H)" should be -- 2H), --.
Col. 117, line 30, "2H)" should be -- 2H), --.